United States Patent
Kim

(10) Patent No.: US 9,030,024 B2
(45) Date of Patent: May 12, 2015

(54) SEMICONDUCTOR DEVICE WITH THROUGH-SILICON VIAS

(75) Inventor: Jin-Ki Kim, Kanata (CA)

(73) Assignee: Conversant Intellectual Property Management Inc., Ottawa, Ontario (CA)

(*) Notice: Subject to any disclaimer, the term of this patent is extended or adjusted under 35 U.S.C. 154(b) by 1043 days.

(21) Appl. No.: 13/094,619

(22) Filed: Apr. 26, 2011

(65) Prior Publication Data

US 2011/0309519 A1    Dec. 22, 2011

Related U.S. Application Data

(60) Provisional application No. 61/355,861, filed on Jun. 17, 2010, provisional application No. 61/362,448, filed on Jul. 8, 2010.

(51) Int. Cl.
| | |
|---|---|
| H01L 23/48 | (2006.01) |
| H01L 25/065 | (2006.01) |
| G11C 5/02 | (2006.01) |
| G11C 8/12 | (2006.01) |
| G11C 29/00 | (2006.01) |

(52) U.S. Cl.
CPC ............ *H01L 25/0657* (2013.01); *H01L 23/481* (2013.01); *H01L 2225/06513* (2013.01); *H01L 2225/06544* (2013.01); *G11C 5/02* (2013.01); *G11C 8/12* (2013.01); *G11C 29/702* (2013.01); *H01L 2224/16145* (2013.01)

(58) Field of Classification Search
CPC .................. H01L 23/481; H01L 25/0657
USPC ............ 324/762.01; 438/14–15, 109; 257/48, 257/E21.521–E21.531, 774, E23.011, 257/E23.174
See application file for complete search history.

(56) References Cited

U.S. PATENT DOCUMENTS

| | | | |
|---|---|---|---|
| 6,667,895 | B2 | 12/2003 | Jang |
| 7,352,067 | B2 | 4/2008 | Fukaishi |
| 7,763,496 | B2 | 7/2010 | Ikeda |
| 8,508,639 | B2 | 8/2013 | Mabuchi |
| 2009/0091333 | A1 | 4/2009 | Chung et al. |
| 2009/0102021 | A1 | 4/2009 | Chen et al. |
| 2009/0102503 | A1 | 4/2009 | Saito |
| 2009/0140381 | A1 | 6/2009 | Lin et al. |
| 2010/0060310 | A1* | 3/2010 | Laisne et al. ............ 326/10 |

(Continued)

FOREIGN PATENT DOCUMENTS

| | | |
|---|---|---|
| JP | 2003264240 | 9/2003 |
| JP | 2006019328 | 1/2006 |

(Continued)

OTHER PUBLICATIONS

International Search Report mailed by the Canadian Intellectual Property Office on Aug. 16, 2011 in connection with International Patent Application No. PCT/CA2011/000486, 3 pages.

(Continued)

*Primary Examiner* — Shaun Campbell
(74) *Attorney, Agent, or Firm* — Conversant IP Management Inc.

(57) ABSTRACT

Disclosed is a semiconductor device with through-silicon vias (TSVs) that comprises a primary TSV group, a plurality of signal lines connected to the primary TSV group, a redundant TSV group and connection circuitry responsive to a control signal having a predetermined value to electrically connect the signal lines to the redundant TSV group.

30 Claims, 27 Drawing Sheets

(56) References Cited

U.S. PATENT DOCUMENTS

| | | | |
|---|---|---|---|
| 2010/0121994 | A1 | 5/2010 | Kim et al. |
| 2010/0140737 | A1 | 6/2010 | Lin et al. |
| 2010/0182040 | A1 | 7/2010 | Feng et al. |
| 2010/0259296 | A1 | 10/2010 | Or-Bach |
| 2010/0295600 | A1* | 11/2010 | Kim et al. ............ 327/365 |
| 2011/0050320 | A1 | 3/2011 | Gillingham |

FOREIGN PATENT DOCUMENTS

| | | |
|---|---|---|
| JP | 2006049361 | 2/2006 |
| JP | 2007226876 | 9/2007 |
| WO | 2007032184 | 3/2007 |

OTHER PUBLICATIONS

Written Opinion of the International Searching Authority mailed by the Canadian Intellectual Property Office on Aug. 16, 2011 in connection with International Patent Application No. PCT/CA2011/000486, 4 pages.

Dae-Seok Byeon et al., ISSCC 2005 / Session 2 / Non-Volatile Memory / 2.2, "An 8Gb Multi-Level NAND Flash Memory with 63nm STI CMOS Process Technology", 2005 IEEE International Solid-State Circuits Conference, Feb. 7, 2005 / Salon 1-6 / 2:00 PM, Digest of Technical Papers, pp. 46-47.

Ang-Chih Hsieh et al., "TSV Redundancy: Architecture and Design Issues in 3D IC", 978-3-9810801-6-2/DATE10 © 2010 EDAA, 6 pages.

Robert S. Patti, Member IEEE, "Three-Dimensional Integrated Circuits and the Future of System-on-Chip Designs", Proceedings of the IEEE, vol. 94, No. 6, Jun. 2006, © 2006 IEEE, pp. 1214-1224.

A. W. Topol et al., "Three-dimensional integrated circuits", IBM J. Res. & Dev., vol. 50, No. 4/5, Jul./Sep. 2006, © 2006 IBM, pp. 491-506.

Uksong Kang et al., "8 Gb 3-D DDR3 DRAM Using Through-Silicon-Via Technology", IEEE Journal of Solid-State Circuits, vol. 45, No. 1, Jan. 2010, © 2009 IEEE, pp. 111-119.

Tae-Sung Jung et al., "A 3.3V 128Mb Multi-Level NAND Flash Memory for Mass Storage Applications", 1996 IEEE International Solid-State Circuits Conference, ISSCC96 / Session 2 / Flash Memory / Paper TP 2.1, Feb. 8, 1996 / Presidio / 1:30 PM, Digest of Technical Papers, 3 pages.

J. Burns et al., "Three-Dimensional Integrated Circuits for Low-Power, High-Bandwidth Systems on a Chip", 2001 IEEE International Solid-State Circuits Conference, ISSCC 2001 / Session 17 / TD: 3D Technologies and Measurement Techniques / 17 .1 , Feb. 7, 2001 / Salon 1-6 / 8:30 AM, Digest of Technical Papers, 3 pages.

Ken Takeuchi et al., A Multipage Cell Architecture for High-Speed Programming Multilevel NAND Flash Memories, IEEE Journal of Solid-State Circuits, vol. 33, No. 8, Aug. 1998, pp. 1228-1238.

Elpida, News Release, "Elpida Completes Development of Cu-TSV (Through Silicon Via) Multi-Layer 8-Gigabit DRAM", The Industry's First TSV DRAM Based on an Eight-Layer 1-Gigabit DDR3 SDRAM, Tokyo, Japan, Aug. 27, 2009, 2 pages.

R. Kirisawa et al., "A Nand Structured Cell with a New Programming Technology for Highly Reliable 5V-Only Flash EEPROM", 1990 Symposium on VLSI Technology, © 1990 IEEE, pp. 129-130.

Seungjae Lee et al., "A 3.3V 4Gb Four-Level NAND Flash Memory with 90nm CMOS Technology", 2004 IEEE International Solid-State Circuits Conference, ISSCC 2004 / Session 2 / Non-Volatile Memory / 2.7, Feb. 16, 2004 / Salon 1-6 / 4:45 PM, © 2004 IEEE, 10 pages.

Uksong Kang et al., "8Gb 3D DDR3 DRAM Using Through-Silicon-Via Technology", 2009 IEEE International Solid-State Circuits Conference, ISSCC 2009 / Session 7 / DRAM / 7.2, Feb. 10, 2009 / 9:00 AM, Digest of Technical Papers, © 2009 IEEE, 3 pages.

Ken Takeuchi et al., A 56nm CMOS 99mm2 8Gb Multi-level NAND Flash Memory with 10MB/s Program Throughput, 2006 IEEE International Solid-State Circuits Conference, ISSCC 2006 / Session 7 / Non-Volatile Memory / 7.7, Feb. 6, 2006 / 4:45 PM, Digest of Technical Papers, © 2006 IEEE, 3 pages.

P. G. Emma et al., "Is 3D chip technology the next growth engine for performance improvement?", IBM J. Res. & Dev. vol. 52, No. 6, Nov. 2008, © 2008 IBM, pp. 541-552.

Gabriel H. Loh, "3D-Stacked Memory Architectures for Multi-Core Processors", In the proceedings of the 35th ACM/IEEE International Conference on Computer Architecture, Jun. 2008, 14 pages.

Samsung Electronics Co. Ltd., "2G×8 Bit NAND Flash Memory", K9XXG08UXM-K9GAG08U0M—Advanced Flash Memory, Apr. 12, 2006, Sep. 21, 2006, 48 pages.

* cited by examiner

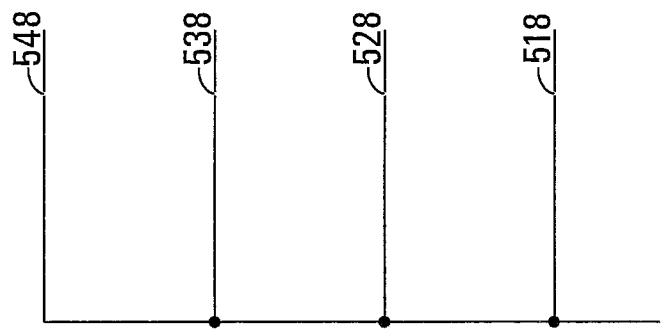
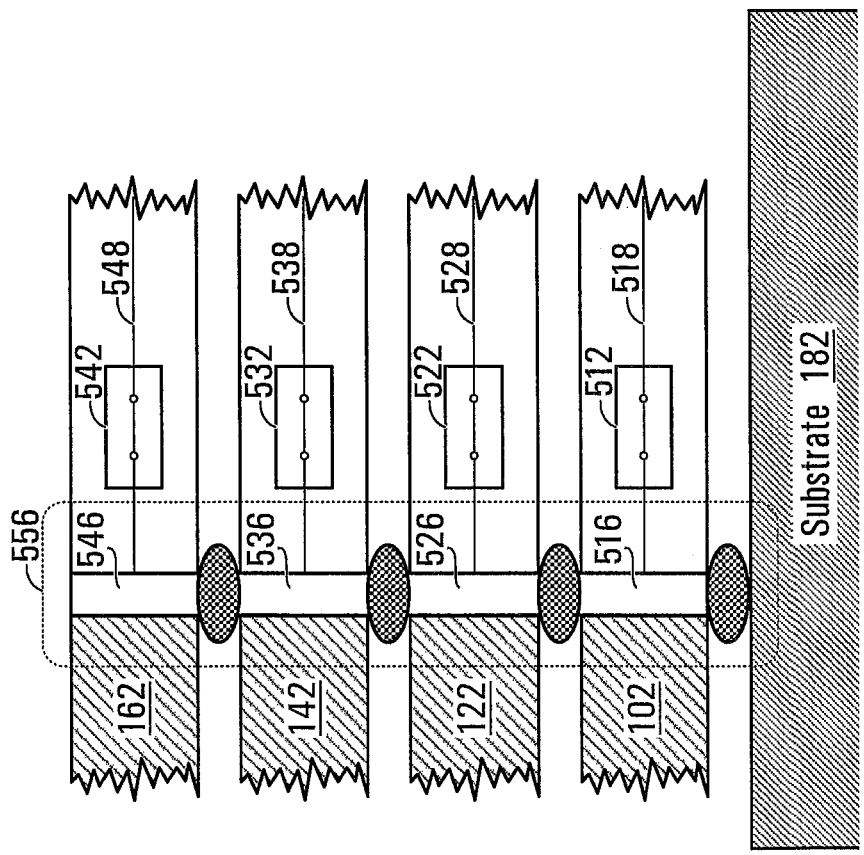
FIG. 5B
FIG. 5A

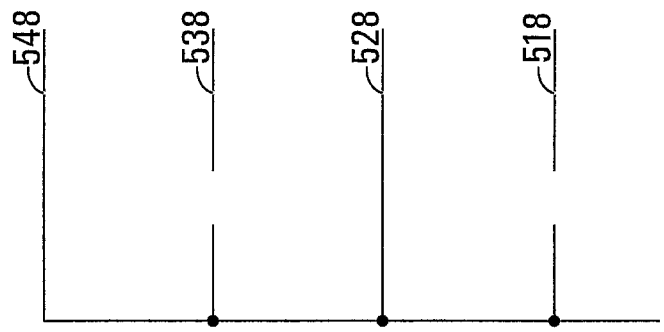
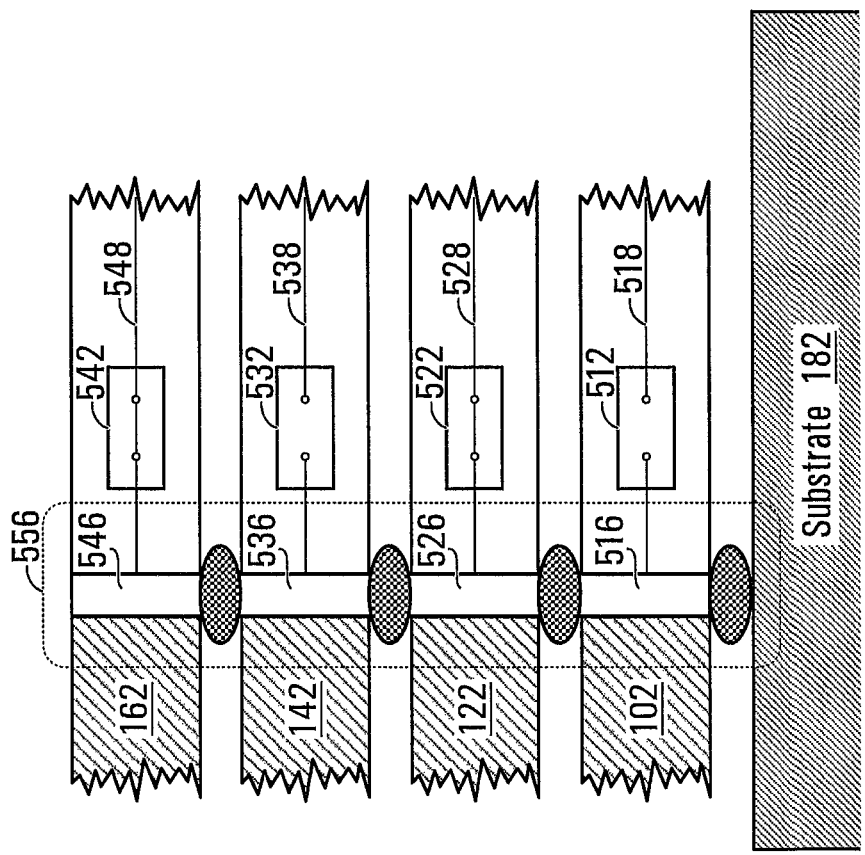
FIG. 8B
FIG. 8A

SEMICONDUCTOR DEVICE WITH THROUGH-SILICON VIAS

CROSS-REFERENCE TO RELATED APPLICATIONS

The present application claims the benefit under 35 U.S.C. §119(e) of U.S. Provisional Patent Application Ser. No. 61/355,861, filed Jun. 17, 2010 and U.S. Provisional Patent Application Ser. No. 61/362,448, filed Jul. 8, 2010, both of which are hereby incorporated by reference herein in their entireties.

TECHNICAL FIELD

The present invention generally relates to semiconductor devices and, more particularly, to semiconductor devices implementing through-silicon via (TSV) technology.

BACKGROUND

As process technology scales down to below 30 nm, it becomes challenging to develop memory devices (e.g., flash memories) with a smaller geometry due to worsening transistor reliability and characteristics such as retention and endurance. Moreover, the cost for developing every next generation of process technology increases enormously. Against this background of factors, through-silicon-via (TSV) technology reveals itself as a good candidate to overcome scaling limits, and increase memory capacity without diminishing performance or increasing costs. Fundamentally, TSV technology involves methods for using short vertical interconnects through stacked dies, thereby implementing semiconductor devices with a 3-dimensional structure. TSV technology may thus provide significant benefits including high density, high bandwidth, low power consumption and small form factor.

The following publications provide additional background material related to TSV technology and are hereby incorporated by reference herein:

J. Burns, et al., "Three-Dimensional Integrated Circuits for Low Power, High-Bandwidth System on a Chip," ISSCC Dig. Tech. Paper, pp. 268-269, February 2001.

P. E. Emma, E. Kursun, "Is 3D chip technology the next growth engine for performance improvement?" IBM J. Res. & Dev. 52, No. 6, 541-552, November 2008.

Gabriel H. Loh, "3D-Stacked Memory Architectures for Multi-Core Processors," 35th ACM/IEEE International Conference on Computer Architecture, June 2008.

R. Patti, "Three-Dimensional Integrated Circuits and the Future of System-on-Chip Designs," Proc. of the IEEE, vol. 84, no. 6, June 2006.

W. Topol, J. D. C. La Tulipe, L. Shi, et al., "Three Dimensional Integrated Circuits," IBM Journal of Research and Development, vol. 50, no. 4/5, pp. 491-506, July/September 2006.

Uksong Kang, et al., "8 Gb 3D DDR3 DRAM Using Through-Silicon-Via Technology," ISSCC Dig. Tech. Paper, pp. 130-131, February 2009.

Two main types of TSV technology are "Via First" and "Via Last". Depending on the type of TSV technology, either reactive-ion etching (RIE) or laser drilling is performed before a TSV metallization process (TSV formation). TSV implementation using RIE and Via First has been discussed in M. Kawano, et al., "A 3D Packaging Technology for 4 Gbit Stacked DRAM with 3 Gbps Data Transfer," IEEE IEDM Dig. Tech. Papers, pp. 581-584, 2006, hereby incorporated by reference herein. Additionally, TSV implementation using laser drilling and Via Last has been discussed in Uksong Kang, et al., "8 Gb 3D DDR3 DRAM Using Through-Silicon-Via Technology," ISSCC Dig. Tech. Paper, pp. 130-131, February 2009.

SUMMARY

According to an aspect of the present invention, there is provided a semiconductor device with through-silicon vias (TSVs), comprising: a primary TSV group; a plurality of signal lines connected to the primary TSV group; a redundant TSV group; connection circuitry responsive to a control signal having a predetermined value to electrically connect the signal lines to the redundant TSV group.

According to a further aspect of the present invention, there is provided a method of configuring a semiconductor device having a plurality of signal lines connected to a primary through-silicon via (TSV) group, the method comprising: determining whether the primary TSV group has a critical defect; in response to determining that the primary TSV group has a critical defect, providing a control signal to connection circuitry on the semiconductor device to electrically connect the signal lines to a redundant TSV group on the semiconductor device.

According to yet another aspect of the present invention, there is provided a semiconductor device with through-silicon vias (TSVs), comprising: a primary TSV group with a critical defect; a plurality of signal lines connected to the primary TSV group; a redundant TSV group; connection circuitry having been previously configured to electrically connect the plurality of signal lines to the redundant TSV group.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached figures, wherein:

FIG. 5A is a schematic view of a cross-section of the semiconductor device taken along the line V-V in FIG. 1, in which a transmission gate on each die electrically connects a respective signal line on that die to a respective TSV on that die;

FIG. 5B is a connection diagram representing the interconnection shown in FIG. 5A;

FIG. 8A is a variant of FIGS. 5A, 6A and 7A, wherein the transmission gates on two of the dies electrically connect the respective signal line to the respective TSV and wherein the transmission gates on the other two dies electrically isolate the respective signal line from the respective TSV;

FIG. 8B is a connection diagram representing the interconnection shown in FIG. 8A;

FIG. 16A is a block diagram illustrating a configurable and reparable redundant TSV group that provides redundancy for a first primary TSV groups and a second primary TSV group;

The figures provided herein are diagrammatic. For example, certain circuit elements may have been omitted from various figures so as to not obscure more important details of illustrated example embodiments. Also, certain circuit elements may be shown as directly connected or directly coupled to other circuit elements simply for convenience of illustration and without excluding the possibility that those circuit elements might be coupled together through intervening circuit elements.

DETAILED DESCRIPTION

Figure 1:
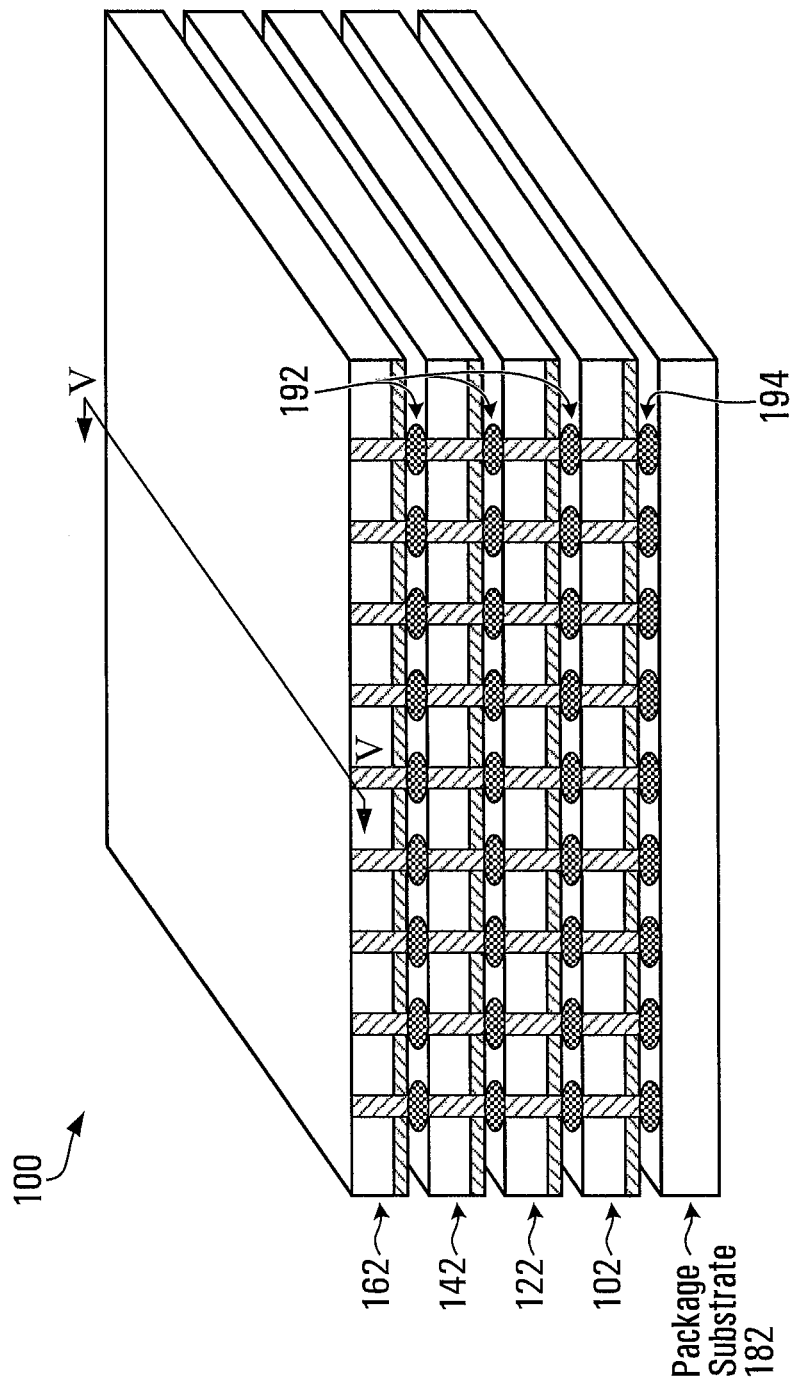
FIG. 1 is a cross-sectional perspective view of a semiconductor device with a plurality of semiconductor dies stacked together and onto a package substrate.

FIG. 1 is a cross-sectional perspective view of a semiconductor device 100 with four (4) semiconductor chips (or dies) 102, 122, 142, 162 stacked together and onto a package substrate 182. At least one of the dies in the stack may be in communication with a controller device (not shown), which may be separate from the stack, or alternatively may form a part of the stack.

The semiconductor dies 102, 122, 142, 162 include through-silicon vias (TSVs). A TSV is a conductive pathway through the thickness of a given semiconductor die that interconnects the given semiconductor die with other dies that may be stacked above or below. Bonding pads 192 are provided between TSVs that appear on adjacent semiconductor dies and are aligned with each other. Bonding pads 194 are similarly provided between the TSVs of the lowest semiconductor die 102 and the substrate 182.

Figure 2:
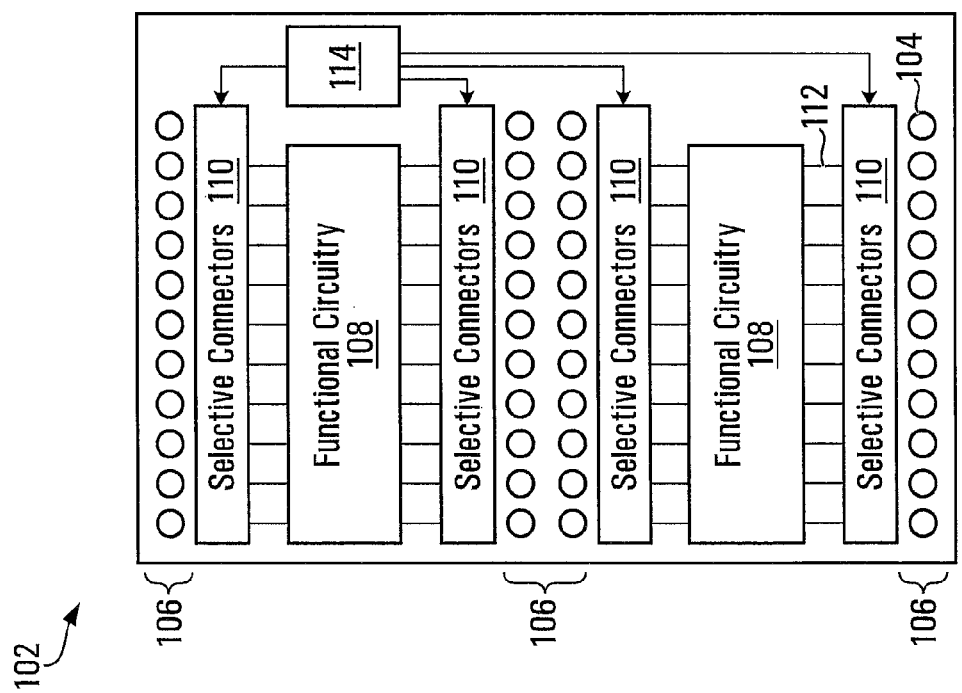
FIG. 2 is a top view of a semiconductor die having a plurality of through-silicon vias (TSVs) distributed among several TSV zones.

FIG. 2 is a top view of one of the semiconductor dies 102, 122, 142, 162 (for example, semiconductor die 102) equipped with a plurality of through-silicon vias (TSVs) 104. In accordance with some example embodiments, the TSVs 104 are concentrated within one or more TSV zones 106 on semiconductor die 102. A TSV zone is an area of a semiconductor die that includes a concentration of TSVs. It is observed that the TSV zones 106 may be located at or near the edges of semiconductor die 102 and/or in a band passing through the center of semiconductor die 102. One or more of the TSV zones 106 could also suitably occupy other regions of the semiconductor die 102, depending on operational requirements. For example, a TSV zone could be located entirely within a central region of semiconductor die 102, away from the edges. Each of the TSV zones 106 may contain several hundreds or thousands of TSVs depending on chip size, TSV pitch and TSV diameter. In an embodiment, the TSV zones together occupy a limited surface area of the semiconductor die 102. For example, the TSV zones together occupy no more than 25% of the surface area of semiconductor die 102. In another embodiment, the TSV zones together occupy no more than 15% of the surface area of semiconductor die 102. The TSVs in a given TSV zone may be divided amongst one or more TSV groups, as will be described in greater detail later on.

In accordance with some example embodiments, semiconductor die 102 includes functional circuitry 108 and a set of selective connectors 110, the two being connected by signal lines 112. For example, in the case of a memory device, the functional circuitry 108 provides a memory storage/retrieval function. To this end, semiconductor die 102 may include, for example, one or more memory cell arrays and associated control circuits. For its part, the selective connectors 110 are used for controllably connecting the functional circuitry 108 to the TSVs 104, thereby to establish electrical connections between the signal lines 112 on semiconductor die 102 and corresponding signal lines on other stacked dies. The selective connectors 110 may be distributed among one or more areas of semiconductor die 102 proximate one or more of the TSV zones 106.

The selective connectors 110 can take on many forms, some of which will be described in further detail, although it should be appreciated that variants not specifically described but within the purview of a person of ordinary skill in the art are nevertheless to be considered as being within the scope of the present invention. In accordance with some example embodiments, the selective connectors 110 may include transmission gates, multiplexers, demultiplexers and/or other elements to provide selective and independent control of connectivity between the signal lines 112 and the TSVs 104.

To enable configurability, the selective connectors 110 can be connected to a configuration controller 114, which may be located on semiconductor die 102 or on any other one of the dies in the stack, or externally to the semiconductor device. The configuration controller 114 may include a register to program the selective connectors 110 during the chip fabrication process. This permits a degree of flexibility in choosing whether to allow a given one of the signal lines 112 to be connected to a given one of the TSVs 104. Such flexibility may be beneficial under various circumstances.

In one example, during the fabrication process, a test may be run in order to identify failed TSVs. For example, failed TSVs (e.g., open circuited TSVs and/or short circuits between TSVs) may be the result of misalignment of adjacent semiconductor dies, problems with the soldering process, dislocation, process variations and/or mechanical stress. In such a scenario, the selective connectors 110 should be configured so as to disconnect the failed TSVs from any of the signal lines.

In another example, the design architecture may be such that certain ones of the signal lines 112 on semiconductor die 102 should not connect to the signal lines on any other of the dies in the stack. This scenario liberates those TSVs that would normally be electrically connected to those signal lines, allowing such TSVs to be used for interconnecting signals lines on stacked dies other than semiconductor die 102.

Figure 3:
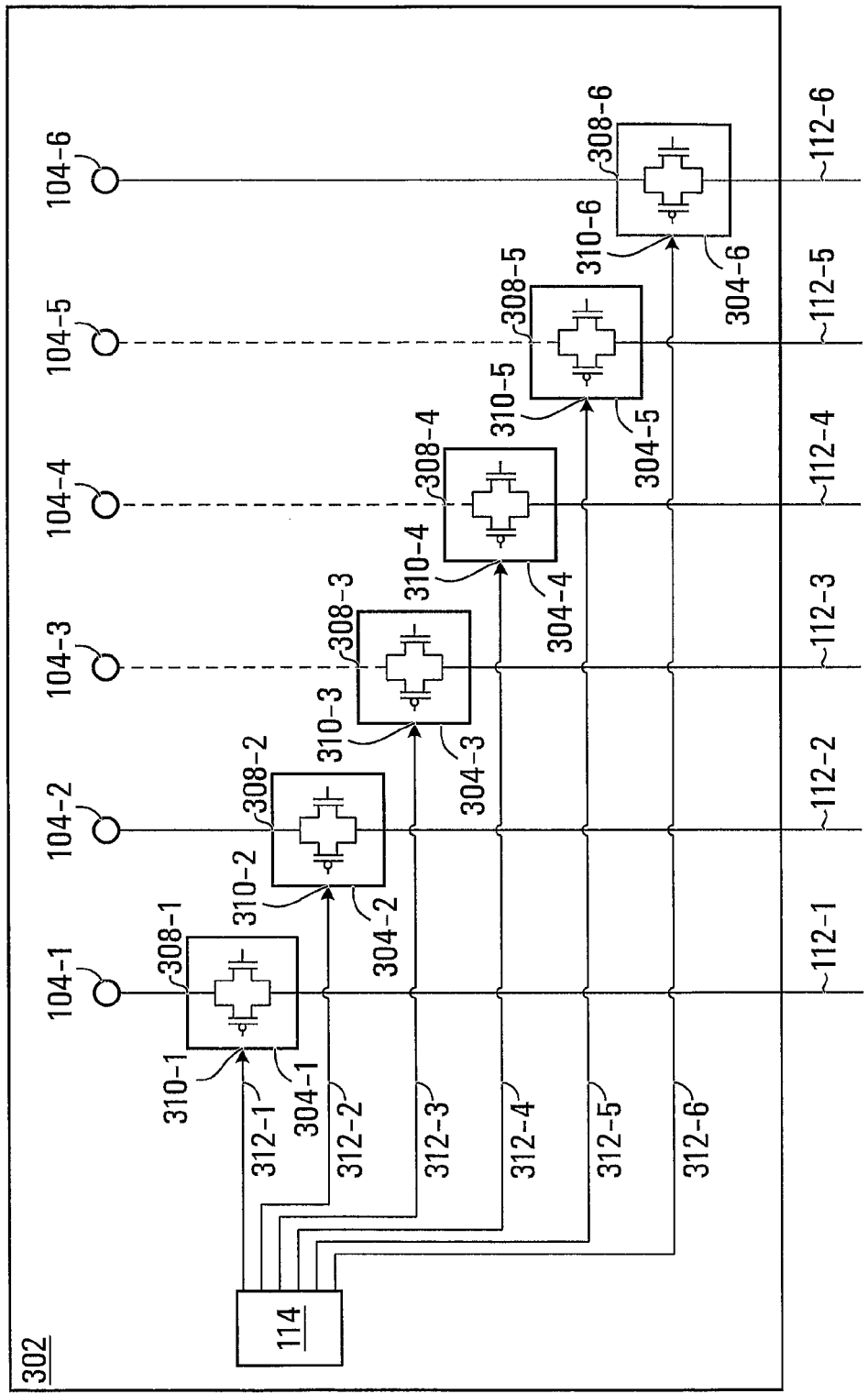
FIG. 3 depicts a TSV group on a semiconductor die, comprising a set of TSVs and a set of selective connectors that are implemented as a plurality of transmission gates.

As mentioned previously with reference to FIG. 2, the TSVs in a given TSV zone 106 may be divided amongst one or more TSV groups. FIG. 3 shows a TSV group 302 on semiconductor die 102. The TSV group 302 is connected to a set of signal lines 112-1, 112-2, . . . , 112-6. The term "TSV group" as used herein generally means a set of TSVs on a semiconductor die together with an associated set of selective connectors. In the presently illustrated embodiment, the TSV group 302 includes six (6) TSVs 104-1, 104-2, . . . , 104-6, and the selective connectors are implemented as a set of transmission gates 304-1, 304-2, . . . , 304-6. Each of the transmission gates 304-1, 304-2, . . . , 304-6 has a respective input 306-1, 306-2, . . . , 306-6, a respective output 308-1, 308-2, . . . , 308-6 and a respective control port 310-1, 310-2, . . . , 310-6. Each of the inputs 306-1, 306-2, . . . , 306-6 is connected to a corresponding one of the signal lines 112-1, 112-2, . . . , 112-6, while each of the outputs 308-1, 308-2, . . . , 308-6 is connected to a corresponding one of the TSVs 104-1, 104-2, . . . , 104-6.

The TSV group 302 in the illustrated example has six (6) TSVs 104-1, 104-2, . . . , 104-6 simply for convenience of illustration. However, it should be understood that the number of TSVs in the TSV group 302 is not particularly limited. It should also be understood that semiconductor die 102 may include multiple TSV groups similar to the TSV group 302.

Each of the transmission gates 304-1, 304-2, . . . , 304-6 can acquire a conductive state or a high-impedance output state. When a given one of the transmission gates 304-1, 304-2, . . . , 304-6 is in the conductive state, then the corresponding one of the outputs 308-1, 308-2, . . . , 308-6 is electrically connected to the corresponding one of the inputs 306-1, 306-2, . . . , 306-6. In contrast, when a given one of the transmission gates 304-1, 304-2, . . . , 304-6 is in the high-impedance output state, the corresponding one of the outputs 308-1, 308-2, . . . , 308-6 is electrically isolated from the corresponding one of the inputs 306-1, 306-2, . . . , 306-6. The state of each of the transmission gates 304-1, 304-2, . . . , 304-6 (namely, conductive or high-impedance) can be programmed by a control signal received at the corresponding one of the control ports 310-1, 310-2, . . . , 310-6 from the configuration controller 114. The control signal received at the control port of a particular one of the transmission gates 304-1, 304-2, . . . , 304-6 can be binary, with a first predetermined value indicating that the particular transmission gate is to be placed in the conductive state and with a second predetermined value indicating that the particular transmission gate is to be placed in the high-impedance state. In accordance with some example embodiments, the control signals for the transmission gates 304-1, 304-2, . . . , 304-6 can be programmed by, for example, fuses (including e-fuses), e-fuses or other programming elements, although other possibilities exist and are within the scope of the present invention.

Consider now a specific non-limiting operational scenario in which it is desired to meet a certain connectivity requirement for connecting a subset of the signal lines 112-1, 112-2, . . . , 112-6 relative to the TSVs 104-1, 104-2, . . . , 104-6 in the embodiment of FIG. 3. The connectivity requirement may be determined as a result of having carried out semiconductor die testing during a fabrication stage. The connectivity requirement is known to the configuration controller 114. For the purposes of the present non-limiting embodiment, the connectivity requirement is such that signal lines 112-1, 112-2 and 112-6 are to be connected to TSVs 104-1, 104-2 and 104-6, respectively.

Accordingly, transmission gate 304-1 is programmed with a control signal 312-1 so as to cause signal line 112-1 to be electrically connected to TSV 104-1. Similarly, transmission gate 304-2 is programmed with a control signal 312-2 so as to cause signal line 112-2 to be electrically connected to TSV 104-2 and transmission gate 304-3 is programmed with a control signal 312-3 so as to cause signal line 112-3 to be electrically connected to TSV 104-3. In addition, transmission gate 304-4 is programmed with a control signal 312-4 so as to cause signal line 112-4 to be electrically isolated from all the TSVs (including TSV 104-4), transmission gate 304-5 is programmed with a control signal 312-5 so as to cause signal line 112-5 to be electrically isolated from all the TSVs (including TSV 104-5), and transmission gate 304-6 is programmed with a control signal 312-6 so as to cause signal line 112-6 to be electrically isolated from all the TSVs (including TSV 104-6).

It should be appreciated that the transmission gates 304-1, 304-2, . . . , 304-6 may be designed so as to remain in the high-impedance output state by default, namely in the absence of a control signal at the corresponding one of the control ports 310-1, 310-2, ..., 310-6. If this were the case, then it would not be necessary for the configuration controller 114 to issue a specific control signal to transmission gates 304-3, 304-4 and 304-5 in order for them to acquire the desired (high-impedance) state.

Alternatively, the transmission gates 304-1, 304-2, ..., 304-6 may be designed so as to remain in the conductive state by default. If this were the case, then it would not be necessary for the configuration controller 114 to issue a specific control signal to transmission gates 304-1, 304-2 and 304-6 in order for them to acquire the desired (conductive) state in the illustrated embodiment.

Figure 4:
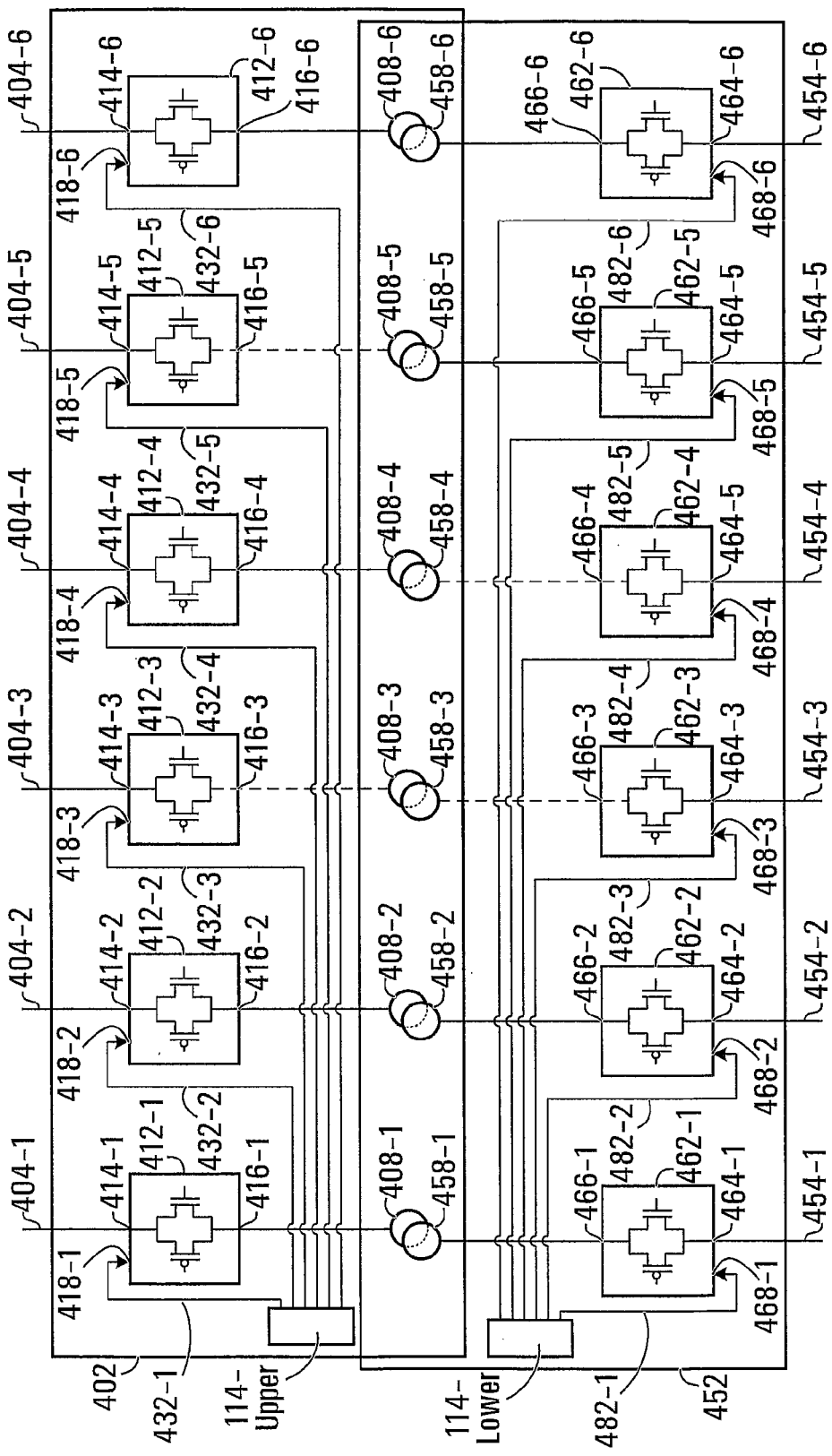
FIG. 4 depicts TSV groups on both an upper semiconductor die and a lower semiconductor die, wherein the TSVs have been aligned with one another.

FIG. 4 conceptually illustrates an upper TSV group 402 connected to a set of signal lines 404-1, 404-2, ..., 404-6 on an upper semiconductor die of a stack, and a lower TSV group 452 connected to a set of signal lines 454-1, 454-2, ..., 454-6 on a lower semiconductor die of the stack.

The upper TSV group 402 includes six (6) TSVs 408-1, 408-2, ..., 408-6 together with selective connectors as implemented as a set of transmission gates 412-1, 412-2, ..., 412-6. Each of the transmission gates 412-1, 412-2, ..., 412-6 has a respective input 414-1, 414-2, ..., 414-6, a respective output 416-1, 416-2, ..., 416-6 and a respective control port 418-1, 418-2, ..., 418-6. Each of the inputs 414-1, 414-2, ..., 414-6 is connected to a corresponding one of the signal lines 404-1, 404-2, ..., 404-6 on the upper semiconductor die, while each of the outputs 416-1, 416-2, ..., 416-6 is connected to a corresponding one of the TSVs 408-1, 408-2, ..., 408-6.

Each of the transmission gates 412-1, 412-2, ..., 412-6 can acquire a conductive state (in which case the output 416-1, 416-2, ..., 416-6 can be electrically connected to the input 414-1, 414-2, ..., 414-6) or a high-impedance output state (in which case the output 416-1, 416-2, ..., 416-6 is electrically isolated from the input 414-1, 414-2, ..., 414-6). The state of each transmission gate 412-1, 412-2, ..., 412-6 (namely, conductive or high-impedance) can be programmed by a control signal received at the control port 418-1, 418-2, ..., 418-6 from a configuration controller 114-UPPER in the upper semiconductor die. The control signal received at the control port of a particular one of the transmission gates 412-1, 412-2, ..., 412-6 can be binary, with a first predetermined value indicating that the particular transmission gate is to be placed in the conductive state and with a second predetermined value indicating that the particular transmission gate is to be placed in the high-impedance state. In accordance with some example embodiments, the control signals for the transmission gates 412-1, 412-2, ..., 412-6 can be programmed by, for example, fuses (including e-fuses) or other programming elements, although other possibilities exist and are within the scope of the present invention.

The lower TSV group 452 includes a matching set of six (6) TSVs 458-1, 458-2, ..., 458-6 together with selective connectors implemented as a set of transmission gates 462-1, 462-2, ..., 462-6. Each of the transmission gates 462-1, 462-2, ..., 462-6 has a respective input 464-1, 464-2, ..., 464-6, a respective output 466-1, 466-2, ..., 466-6 and a respective control port 468-1, 468-2, ..., 468-6. Each of the inputs 464-1, 464-2, ..., 464-6 is connected to a corresponding one of the signal lines 454-1, 454-2, ..., 454-6 on the lower semiconductor die, while each of the outputs 466-1, 466-2, ..., 466-6 is connected to a corresponding one of the TSVs 458-1, 458-2, ..., 458-6.

Each of the transmission gates 462-1, 462-2, ..., 462-6 can acquire a conductive state (in which case the output 466-1, 466-2, ..., 466-6 can be electrically connected to the input 464-1, 464-2, ..., 464-6) or a high-impedance output state (in which case the output 466-1, 466-2, ..., 466-6 is electrically isolated from the input 464-1, 464-2, ..., 464-6). The state of each transmission gate 462-1, 462-2, ..., 462-6 (namely, conductive or high-impedance) can be programmed by a control signal received at the control port 468-1, 468-2, ..., 468-6 from a configuration controller 114-LOWER in the upper semiconductor die. The control signal received at the control port of a particular one of the transmission gates 462-1, 462-2, ..., 462-6 can be binary, with a first predetermined value indicating that the particular transmission gate is to be placed in the conductive state and with a second predetermined value indicating that the particular transmission gate is to be placed in the high-impedance state. In accordance with some example embodiments, the control signals for the transmission gates 462-1, 462-2, ..., 462-6 can be programmed by, for example, fuses (including e-fuses) or other programming elements, although other possibilities exist and are within the scope of the present invention.

Each of the TSVs 408-1, 408-2, ..., 408-6 in the upper TSV group 402 is electrically connected to a corresponding one of the TSVs 458-1, 458-2, ..., 458-6 in the lower TSV group 452 by a respective bonding pad (not shown). This allows an electrical connection to potentially be established between one of the signal lines 404-1, 404-2, ..., 404-6 in the upper semiconductor die and a matching one of the signal lines 454-1, 454-2, ..., 454-6 in the lower semiconductor die. However, due to action of the transmission gates 412-1, 412-2, ..., 412-6, 462-1, 462-2, ..., 462-6, it is also possible not to electrically connect matching pairs of signal lines. For example, it is feasible to electrically connect one of the matching signal lines (say, signal line 404-2 on the upper semiconductor die) to its associated TSV (TSV 408-2 on the upper semiconductor die) but to electrically isolate the other one of the matching signal lines (signal line 454-2 on the lower semiconductor die) from its associated TSV (TSV 458-2 on the lower semiconductor die). This allows TSVs 408-2 and 458-2 to be used for connecting matching signal lines in a subset of (rather than all) layers of the stack.

Each of the TSV groups 402, 452 in the illustrated example has six (6) TSVs simply for convenience of illustration. However, it should be understood that the number of TSVs in either TSV group is not particularly limited. It should also be understood that the upper and lower semiconductor dies may each include multiple TSV groups with TSVs that may be aligned pair-wise and configured as described above.

Consider now a specific non-limiting operational scenario in which it is desired to meet a certain connectivity requirement for connecting a subset of the signal lines 404-1, 404-2, ..., 404-6 relative to the TSVs 408-1, 408-2, ..., 408-6 and for connecting a subset of the signal lines 454-1, 454-2, ..., 454-6 relative to the TSVs 458-1, 458-2, ..., 458-6 in the embodiment of FIG. 4. The connectivity requirement may be determined as a result of having carried out semiconductor die testing during a fabrication stage. The connectivity requirement is known to the configuration controllers 114-UPPER, 114-LOWER. For the purposes of the present non-limiting embodiment, the connectivity requirement is such that signal lines 404-1, 404-2, 404-4, 404-6 are to be connected to TSVs 408-1, 408-2, 408-4, 408-6, respectively, and such that signal lines 454-1, 454-2, 454-5, 454-6 are to be connected to TSVs 458-1, 458-2, 458-5, 458-6, respectively.

Accordingly, as far as the upper semiconductor die is concerned, transmission gate 412-1 is programmed with a control signal 432-1 so as to cause signal line 404-1 to be electrically connected to TSV 408-1, transmission gate 412-2 is programmed with a control signal 432-2 so as to cause signal line 404-2 to be electrically connected to TSV 408-2, transmission gate 412-3 is programmed with a control signal 432-3 so as to cause signal line 404-3 to be electrically connected to TSV 408-3 and transmission gate 412-4 is programmed with a control signal 432-4 so as to cause signal line 404-4 to be electrically connected to TSV 408-4. In addition, transmission gate 412-5 is programmed with a control signal 432-5 so as to cause signal line 404-5 to be electrically isolated from all the TSVs (including TSV 408-5) and transmission gate 412-6 is programmed with a control signal 432-6 so as to cause signal line 404-6 to be electrically isolated from all the TSVs (including TSV 408-6).

Additionally, as far as the lower semiconductor die is concerned, transmission gate 462-1 is programmed with a control signal 482-1 so as to cause signal line 454-1 to be electrically connected to TSV 458-1, transmission gate 462-2 is programmed with a control signal 482-2 so as to cause signal line 454-2 to be electrically connected to TSV 458-2, transmission gate 462-3 is programmed with a control signal 482-3 so as to cause signal line 454-3 to be electrically connected to TSV 458-3 and transmission gate 462-4 is programmed with a control signal 482-4 so as to cause signal line 454-4 to be electrically connected to TSV 458-4. In addition, transmission gate 462-5 is programmed with a control signal 482-5 so as to cause signal line 454-5 to be electrically isolated from all the TSVs (including TSV 458-5) and transmission gate 462-6 is programmed with a control signal 482-6 so as to cause signal line 454-6 to be electrically isolated from all the TSVs (including TSV 458-6).

As a result, it will be observed that even though TSV 408-5 in the upper semiconductor die is electrically connected to TSV 458-5 in the lower semiconductor die by virtue of a bonding pad, signal line 404-5 in the upper semiconductor die is electrically isolated from signal line 454-5 in the lower semiconductor die. This is by virtue of transmission gate 412-5 in the upper semiconductor die having been programmed to acquire a high-impedance output state. Similarly, transmission gate 462-4 in the lower semiconductor die was programmed to acquire a high-impedance output state, which electrically isolates signal line 404-4 in the upper semiconductor die from signal line 454-4 in the lower semiconductor die, despite the fact that TSV 408-4 in the upper semiconductor die is electrically connected to TSV 458-4 in the lower semiconductor die by a bonding pad.

It should be appreciated that the transmission gates 412-1, 412-2, ..., 412-6, 462-1, 462-2, ..., 462-6 may be designed so as to remain in the high-impedance output state by default, namely in the absence of a control signal at the corresponding one of the control ports 418-1, 418-2, ..., 418-6, 468-1, 468-2, ..., 468-6. If this were the case, then it would not be necessary for the configuration controllers 114-UPPER, 114-LOWER to issue a specific control signal to transmission gates 412-3, 412-5, 462-3 and 462-4 in order for them to acquire the desired (high-impedance) state as in the illustrated embodiment.

Alternatively, the transmission gates 412-1, 412-2, ..., 412-6, 462-1, 462-2, ..., 462-6 may be designed so as to remain in the conductive state by default. If this were the case, then it would not be necessary for the configuration controllers 114-UPPER, 114-LOWER to issue a specific control signal to transmission gates 412-1, 412-2, 412-4, 412-6, 462-1, 462-2, 462-5 and 462-6 in order for them to acquire the desired (conductive) state as in the illustrated embodiment.

FIG. 5A shows a schematic view of a cross-section of the semiconductor device 100 taken along the line V-V in FIG. 1. A single TSV in each of the four (4) semiconductor dies 102, 122, 142, 162 is illustrated. Specifically, this includes TSV 516 in semiconductor die 102, TSV 526 in semiconductor die 122, TSV 536 in semiconductor die 142 and TSV 546 in semiconductor die 162. Collectively, TSVs 516, 526, 536 and 546 form a plurality of joined TSVs, hereinafter alternatively referred to as a through-and-through silicon via (TTSV) 556. Also shown is a signal line in each of the semiconductor dies to which the TSV in that semiconductor die could potentially be connected, depending on the state of a transmission gate fabricated on the surface of that semiconductor die. Specifically, this includes signal line 518 in semiconductor die 102, which is connectable to TSV 516 by transmission gate 512, signal line 528 in semiconductor die 122, which is connectable to TSV 526 by transmission gate 522, signal line 538 in semiconductor die 142, which is connectable to TSV 536 by transmission gate 532 and signal line 548 in semiconductor die 162, which is connectable to TSV 546 by transmission gate 542. It will be appreciated that the depiction of transmission gates 512, 522, 532, 542 in FIG. 5A (as well as FIGS. 6A, 7A and 8A) is conceptual and that in an actual implementation, transmission gates 512, 522, 532, 542 can be fabricated on the surface of the respective semiconductor die 102, 122, 142, 162.

It is seen that the TTSV 556 electrically connects all of the TSVs 516, 526, 536, 546. However, this does not imply that the signal lines to which those TSVs could potentially be connected are indeed electrically connected to one another. In fact, depending on the state of the transmission gates 512, 522, 532, 542 (namely, conductive or high-impedance), it is possible to connect the signal lines on only selected ones of the semiconductor dies 102, 122, 142, 162. This provides greater interconnection flexibility.

FIG. 5A illustrates the case where all of the transmission gates 512, 522, 532, 542 are placed in the conductive state (or, equivalently, the case where none of the transmission gates 512, 522, 532, 542 is placed in the high-impedance output state), thereby electrically connecting signal lines 518, 528, 538, 548 on semiconductor dies 102, 122, 142, 162 to one another via TTSV 556. The equivalent connection diagram is shown in schematic form in FIG. 5B.

Figure 6B:
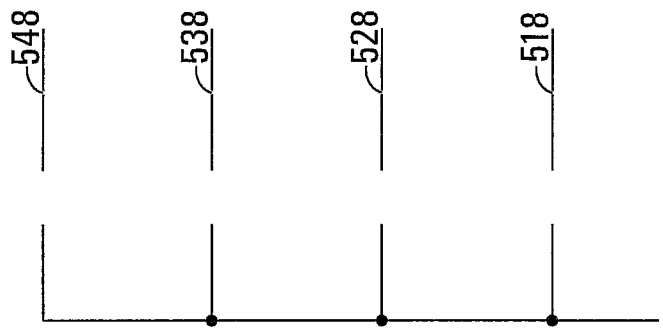
FIG. 6B is a connection diagram representing the interconnection shown in FIG. 6A.
Figure 6A:
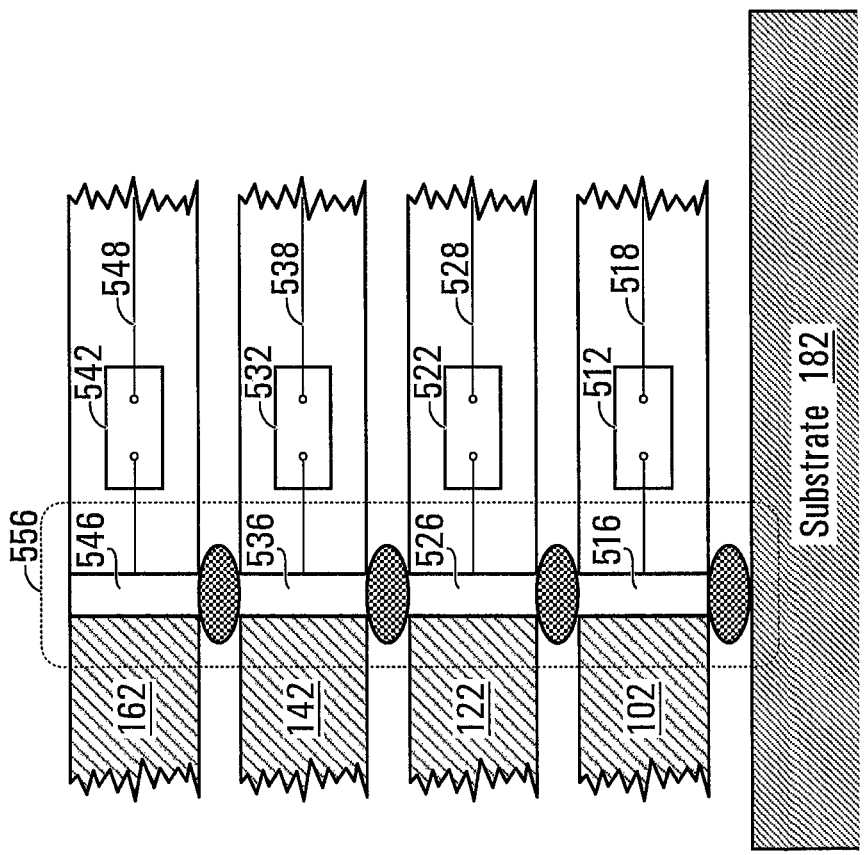
FIG. 6A is a variant of FIG. 5A, wherein the transmission gate on each die electrically isolates the respective signal line from the respective TSV.

FIG. 6A illustrates the case where none of the transmission gates 512, 522, 532, 542 is placed in the conductive state (and/or the case where all of the transmission gates 512, 522, 532, 542 are placed in the high-impedance output state), thereby electrically isolating signal lines 518, 528, 538, 548 on semiconductor dies 102, 122, 142, 162 from one another. The equivalent connection diagram is shown in schematic form in FIG. 6B.

Figure 7B:
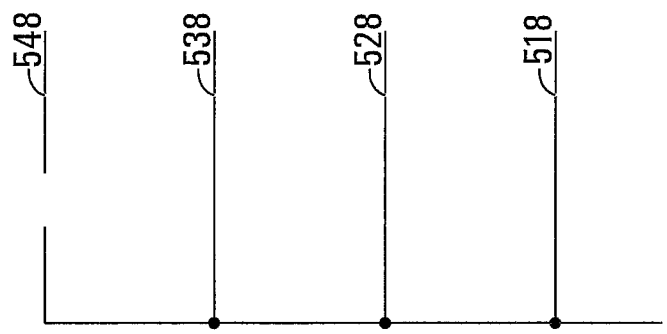
FIG. 7B is a connection diagram representing the interconnection shown in FIG. 7A.
Figure 7A:
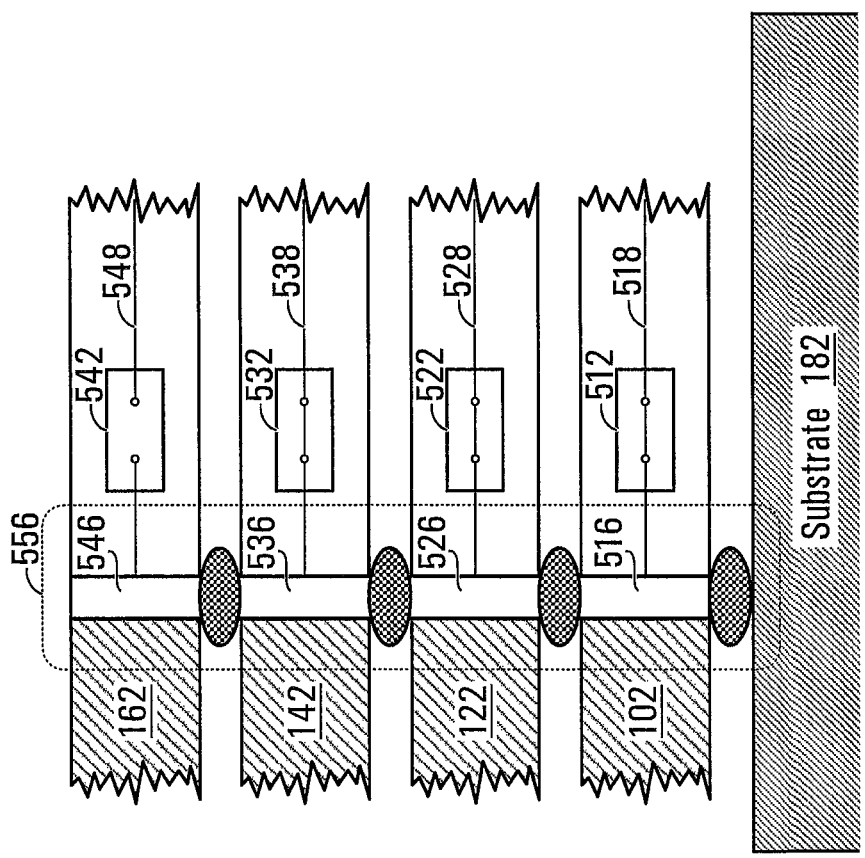
FIG. 7A is a variant of FIGS. 5A and 6A, wherein the transmission gates on three of the dies electrically connect the respective signal line to the respective TSV and wherein the transmission gate on the fourth die electrically isolates the respective signal line from the respective TSV.

FIG. 7A illustrates the case where selective connectors 512, 522 and 532 on semiconductor dies 102, 122 and 142 are placed in the conductive state and transmission gate 542 on semiconductor die 162 is placed in the high-impedance output state, thereby electrically connecting signal lines 518, 528, 538 on semiconductor dies 102, 122, 142 to one another via TTSV 556, but which are electrically isolated from signal line 548 on semiconductor die 162. The equivalent connection diagram is shown in schematic form in FIG. 7B.

FIG. 8A illustrates the case where transmission gates 522 and 542 on semiconductor dies 122 and 162 are placed in the conductive state and transmission gates 512 and 532 on semiconductor dies 102 and 142 are placed in the high-impedance output state, thereby electrically connecting signal lines 528 and 548 on semiconductor dies 122 and 162 to one another via TTSV 556, while signal lines 518, 538 on semiconductor dies 102, 142 are electrically isolated from each other and from signal lines 528 and 548. The equivalent connection diagram is shown in schematic form in FIG. 8B.

Figure 9:
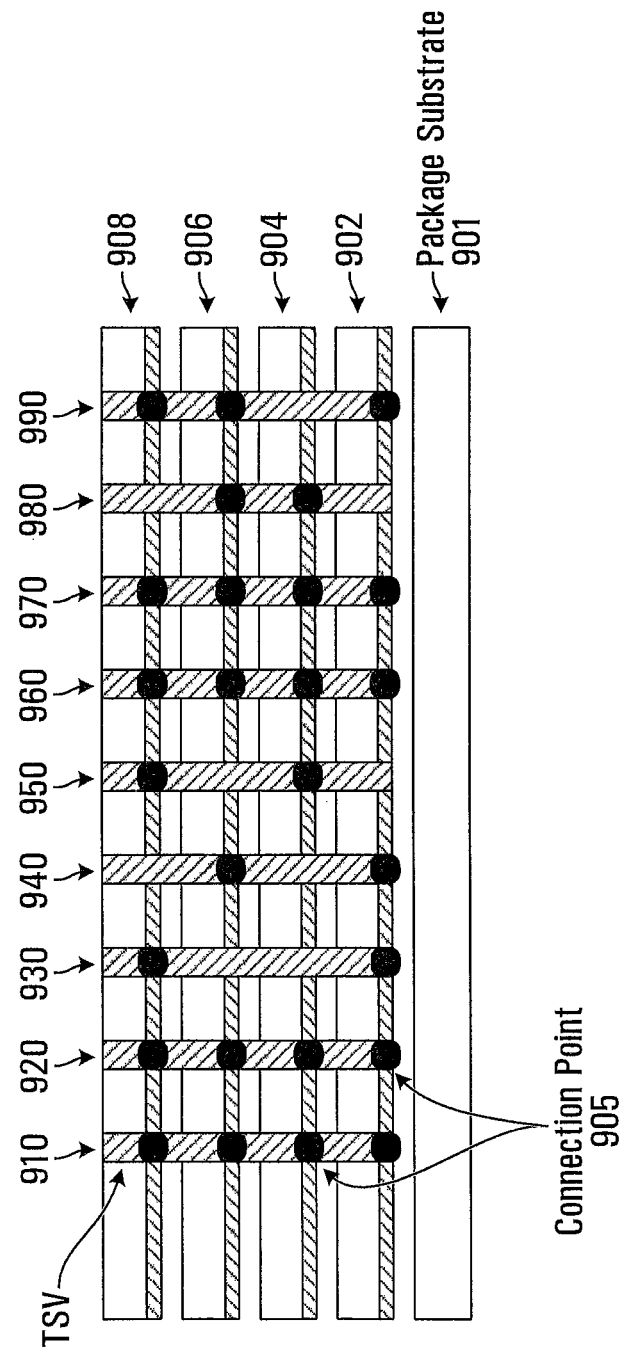
FIG. 9 is a schematic cross-sectional view of a stacked semiconductor device, in which electrical connections between signal lines and TSVs have been selectively established at different layers of the stack.

FIG. 9 shows an example of a semiconductor device 900 that has been selectively configured using the techniques described above, in order to achieve electrical connections between signal lines on selected layers only. Specifically, FIG. 9 shows a plurality of TTSVs 910, 920, 930, 940, 950, 960, 970, 980, 990, each of which is made up of a TSV on each of four semiconductor dies 902, 904, 906, 908. Pairs of TSVs on adjacent ones of the semiconductor dies 902, 904, 906, 908 are aligned and electrically connected by bonding pads. Semiconductor die 902 is connected to a package substrate 901.

Connection points appearing in FIG. 9 in association with a given TSV for a given semiconductor die illustrate the establishment of a connection between a signal line on the given semiconductor die and the given TSV. Specifically, one will observe that TTSV 910 electrically connects a signal line on each of the semiconductor dies 902, 904, 906, 908 to one another. Similarly, TTSVs 920, 960 and 970 each electrically connect a signal line on each of the semiconductor dies 902, 904, 906 908 to one another. However, TTSV 930 connects a signal line on semiconductor die 902 to a signal line on semiconductor die 908 but does not connect these two signal lines to a signal line on either semiconductor die 904 or semiconductor die 906. Similarly, TTSV 940 connects a signal line on semiconductor die 902 to a signal line on semiconductor die 906 but does not connect these two signal lines to a signal line on either semiconductor die 904 or semiconductor die 908. In addition, TTSV 950 connects a signal line on semiconductor die 904 to a signal line on semiconductor die 908 but does not connect these signal lines to a signal line on either semiconductor die 902 or semiconductor die 906. Furthermore, TTSV 980 connects a signal line on semiconductor die 904 to a signal line on semiconductor die 906 but does not connect these signal lines to a signal line on either semiconductor die 902 or semiconductor die 908. Finally, TTSV 990 connects a signal line on semiconductor die 902 to a signal line on semiconductor die 906 and to a signal line on semiconductor die 908, but does not connect these signal lines to a signal line on semiconductor die 904.

Those skilled in the art will appreciate that the embodiment of FIG. 9 is merely an example and that it is not to be considered limiting.

Figure 10:
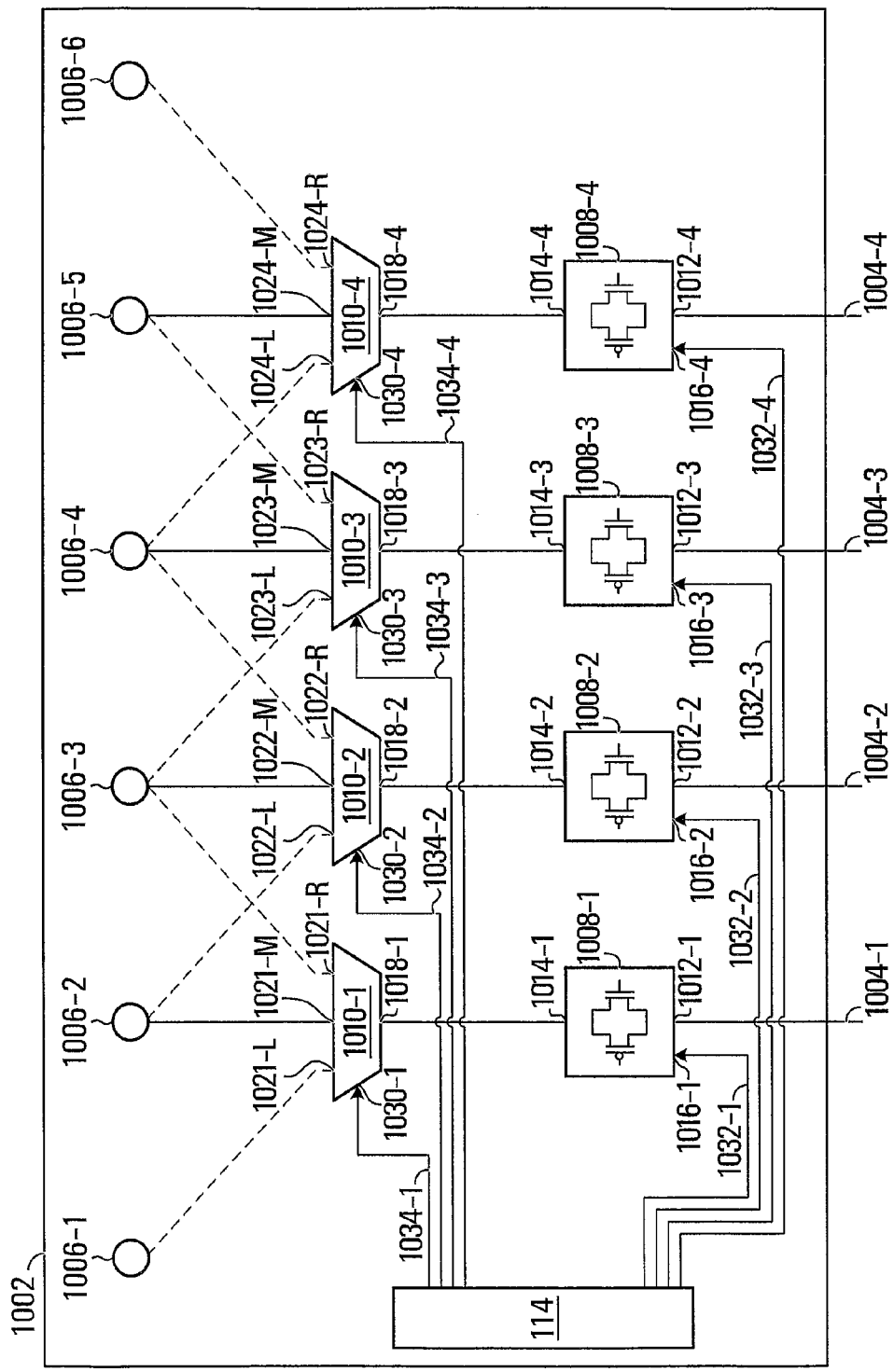
FIG. 10 depicts a TSV group on a semiconductor die, comprising a set of TSVs and a set of selective connectors that are implemented as a plurality of transmission gates in series with a respective plurality of demultiplexers.

Turning now to FIG. 10, there is shown a TSV group 1002 connected to a plurality of signal lines 1004-1, 1004-2, 1004-3, 1004-4. It is recalled that a "TSV group" comprises a group of TSVs on a semiconductor die together with an associated set of selective connectors. In the presently illustrated embodiment, the TSV group 1002 includes six (6) TSVs 1006-1, 1006-2, ..., 1006-6, and the selective connectors are implemented as a set of four (4) transmission gates 1008-1, 1008-2, 1008-3, 1008-4 in series with a respective set of four (4) demultiplexers 1010-1, 1010-2, 1010-3, 1010-4.

It is noted that the number of TSVs in the TSV group 1002 is greater than the number of signal lines connected to the TSV group 1002. This provides redundancy, allowing the TSV group 1002 to exhibit redundancy, which is useful when repairing defects. Specifically, in the illustrated embodiment, which is non-limiting, there are four (4) signal lines 1004-1, 1004-2, 1004-3, 1004-4 and six (6) TSVs 1006-1, 1006-2, ..., 1006-6. The two additional TSVs allow for proper functionality of the TSV group 1002 as a whole, even in the event that up to two (2) of the TSVs 1006-1, 1006-2, ..., 1006-6 were to suffer a failure. However, it should be understood that there is no particular limitation on either the number of signal lines connected to the TSV group 1002 or the number of additional TSVs in the TSV group 1002.

Each of the transmission gates 1008-1, 1008-2, 1008-3, 1008-4 has a respective input 1012-1, 1012-2, 1012-3, 1012-4, a respective output 1014-1, 1014-2, 1014-3, 1014-4 and a respective control port 1016-1, 1016-2, 1016-3, 1016-4. Each of the inputs 1012-1, 1012-2, 1012-3, 1012-4 is connected to a corresponding one of the signal lines, while the each of the outputs 1014-1, 1014-2, 1014-3, 1014-4 is connected to a respective one of the demultiplexers 1010-1, 1010-2, 1010-3, 1010-4. Each of the transmission gates 1008-1, 1008-2, 1008-3, 1008-4 can acquire a conductive state or a high-impedance output state. When a given one of the transmission gates 1008-1, 1008-2, 1008-3, 1008-4 is in the conductive state, then the corresponding one of the outputs 1014-1, 1014-2, 1014-3, 1014-4 is electrically connected to the corresponding one of the inputs 1012-1, 1012-2, 1012-3, 1012-4. In contrast, when a given one of the transmission gates 1008-1, 1008-2, 1008-3, 1008-4 is in the high-impedance output state, the corresponding one of the outputs 1014-1, 1014-2, 1014-3, 1014-4 is electrically isolated from the corresponding one of the inputs 1012-1, 1012-2, 1012-3, 1012-4. The state of each of the transmission gates 1008-1, 1008-2, 1008-3, 1008-4 (namely, conductive or high-impedance) can be programmed by a control signal received at the corresponding one of the control ports 1016-1, 1016-2, 1016-3, 1016-4 from the configuration controller 114. The control signal received at the control port of a particular one of the transmission gates 1008-1, 1008-2, 1008-3, 1008-4 can be binary, with a first predetermined value indicating that the particular transmission gate is to be placed in the conductive state and with a second predetermined value indicating that the particular transmission gate is to be placed in the high-impedance state. In accordance with some example embodiments, the control signals for the transmission gates 1008-1, 1008-2, 1008-3, 1008-4 can be programmed by, for example, fuses (including e-fuses) or other programming elements, although other possibilities exist and are within the scope of the present invention.

Each of the demultiplexers 1010-1, 1010-2, 1010-3, 1010-4 has a respective input 1018-1, 1018-2, 1018-3, 1018-4 connected to a respective one of the transmission gates 1008-1, 1008-2, 1008-3, 1008-4.

Each of the demultiplexers 1010-1, 1010-2, 1010-3, 1010-4 also has a respective plurality of outputs associated with a corresponding subset of the TSVs. In the illustrated embodiment, each of the demultiplexers 1010-1, 1010-2, 1010-3, 1010-4 has three (3) outputs, which are referred to for convenience and simplicity as the "left" output (-L), the "middle" output (-M) and the "right" output (-R), each of which is connected to a corresponding one of the TSVs associated with that demultiplexer. However, it should be appreciated that in general, the number of outputs of any given one of the demultiplexers is not limited, and may range anywhere from two upwards. Moreover, the various demultiplexers are not required to all have the same number of outputs.

Specifically, demultiplexer 1010-1 includes a plurality of outputs 1021-L, 1021-M, 1021-R, which are respectively connected to TSVs 1006-1, 1006-2, 1006-3. Demultiplexer 1010-2 includes a plurality of outputs 1022-L, 1022-M, 1022-R, which are respectively connected to TSVs 1006-2, 1006-3, 1006-4. Demultiplexer 1010-3 includes a plurality of outputs 1023-L, 1023-M, 1023-R, which are respectively connected to TSVs 1006-3, 1006-4, 1006-5. Finally, demultiplexer 1010-4 includes a plurality of outputs 1024-L, 1024-M, 1024-R, which are respectively connected to TSVs 1006-4, 1006-5, 1006-6.

Each of the demultiplexers 1010-1, 1010-2, 1010-3, 1010-4 also has a respective control port 1030-1, 1030-2, 1030-3, 1030-4. The control port of a given one of the demultiplexers 1010-1, 1010-2, 1010-3, 1010-4 receives a control signal from the configuration controller 114, on the basis of which the given one of the demultiplexers 1010-1, 1010-2, 1010-3, 1010-4 establishes an electrical connection between its input and only one of its outputs (either the "left", the "middle" or the "right"), with the other outputs remaining electrically isolated from the input. The control signal received at the control port of a particular one of the demultiplexers 1010-1, 1010-2, 1010-3, 1010-4 can have one of 3 predetermined values (e.g., it can be a 2-bit signal), with a first predetermined value indicating that the particular demultiplexer is to establish an electrical connection between its input and its "left" output, a second predetermined value indicating that the particular demultiplexer is to establish an electrical connection between its input and its "middle" output and a third predetermined value indicating that the particular demultiplexer is to establish an electrical connection between its input and its "right" output. Generally speaking, for a particular one of the demultiplexers 1010-1, 1010-2, 1010-3, 1010-4 having between $(2^{n-1}+1)$ and $2^n$ outputs, the control signal received at the corresponding control port can be an n-bit signal.

It is noted that in some cases, a particular TSV may be connected to an output of only one of the demultiplexers 1010-1, 1010-2, 1010-3, 1010-4. This applies to TSVs 1006-1 and 1006-6, which can only be connected to the "left" output of demutiplexer 1010-1 and to the "right" output of demultiplexer 1010-4, respectively. In other cases, a particular TSV may potentially be connected to an output of two or more of the demultiplexers 1010-1, 1010-2, 1010-3, 1010-4. For example, TSV 1006-3 may be potentially connected to the "left" output of demultiplexer 1010-3, to the "middle" output of demultiplexer 1010-2 and to the "right" output of demultiplexer 1010-1. During manufacture, each of the demultiplexers 1010-1, 1010-2, 1010-3, 1010-4 receives a respective control signal, which causes the respective demultiplexer to establish an electrical connection with only one of its outputs. As a result, when assembly of the semiconductor device is complete, each of the demultiplexers 1010-1, 1010-2, 1010-3, 1010-4 causes a corresponding electrical connection to be established with only one of the TSVs 1006-1, 1006-2, . . . , 1006-6.

It should be appreciated that it is within the scope of the invention for each of the TSVs 1006-1, 1006-2, . . . , 1006-6 to be potentially connected to an output of a greater number of demultiplexers 1010-1, 1010-2, 1010-3, 1010-4 than has been illustrated in FIG. 10. For example, it is envisaged that in some example embodiments, each of the TSVs 1006-1, 1006-2, . . . , 1006-6 may be potentially connected to an output of all of the demultiplexers 1010-1, 1010-2, 1010-3, 1010-4.

Consider now a specific non-limiting operational scenario in which it is desired to meet a certain connectivity requirement for connecting the signal lines 1004-1, 1004-2, 1004-3, 1004-4 relative to the TSVs 1006-1, 1006-2, . . . , 1006-6 in the embodiment of FIG. 10. The connectivity requirement may be determined as a result of having carried out semiconductor die testing during a fabrication stage. The connectivity requirement is known to the configuration controller 114. For the purposes of the present non-limiting embodiment, the connectivity requirement is such that signal lines 1004-1, 1004-2, 1004-3, 1004-4 are to be connected to TSVs 1006-2, 1006-3, 1006-4, 1006-5, respectively.

FIG. 10 illustrates a specific operating scenario, in which transmission gate 1008-1 is programmed with a control signal 1032-1 so as to cause signal line 1004-1 to be electrically connected to the input 1018-1 of demultiplexer 1010-1. Similarly, transmission gate 1008-2 is programmed with a control signal 1032-2 so as to cause signal line 1004-2 to be electrically connected to the input 1018-2 of demultiplexer 1010-2, transmission gate 1008-3 is programmed with a control signal 1032-3 so as to cause signal line 1004-3 to be electrically connected to the input 1018-3 of demultiplexer 1010-3 and transmission gate 1008-4 is programmed with a control signal 1032-4 so as to cause signal line 1004-4 to be electrically connected to the input 1018-4 of demultiplexer 1010-4.

Also, demultiplexer 1010-1 receives a control signal 1034-1 instructing it to establish an electrical connection with its "middle" output 1021-M, thereby causing an electrical connection to be established between the output 1014-1 of transmission gate 1008-1 and TSV 1006-2. Similarly, demultiplexer 1010-2 receives a control signal 1034-2 instructing it to establish an electrical connection with its "middle" output 1022-M, thereby causing an electrical connection to be established between the output 1014-2 of transmission gate 1008-2 and TSV 1006-3, demultiplexer 1010-3 receives a control signal 1034-3 instructing it to establish an electrical connection with its "middle" output 1023-M, thereby causing an electrical connection to be established between the output 1014-3 of transmission gate 1008-3 and TSV 1006-4, and demultiplexer 1010-4 receives a control signal 1034-4 instructing it to establish an electrical connection with its "middle" output 1024-M, thereby causing an electrical connection to be established between the output 1014-4 of transmission gate 1008-4 and TSV 1006-5.

It should be appreciated that the transmission gates 1008-1, 1008-2, 1008-3, 1008-4 may be designed so as to remain in the high-impedance state by default, namely in the absence of a control signal at the corresponding one of the control ports 1016-1, 1016-2, 1016-3, 1016-4.

Alternatively, the transmission gates 1008-1, 1008-2, 1008-3, 1008-4 may be designed so as to remain in the conductive state by default. If this were the case, then it would not be necessary for the configuration controller 114 to issue a specific control signal to transmission gates 1008-1, 1008-2, 1008-3, 1008-4 in order for them to acquire the desired (conductive) state.

Also, it should be appreciated that in a default state (i.e., in the absence of a control signal at the corresponding one of the control ports 1030-1, 1030-2, 1030-3, 1030-4), each of the demultiplexers 1010-1, 1010-2, 1010-3, 1010-4 may cause its respective input to be electrically connected to its "middle" output. If this were the case, then it would not be necessary for the configuration controller 114 to issue a specific control signal to demultiplexers 1010-1, 1010-2, 1010-3, 1010-4 in order for them to operate as indicated in FIG. 10. Alternatively, in a default state, each of the demultiplexers 1010-1, 1010-2, 1010-3, 1010-4 may cause its respective input to be electrically connected to its "left" or "right" output.

The control signals 1032-1, 1032-2, 1032-3, 1032-4 sent to the transmission gates 1008-1, 1008-2, 1008-3, 1008-4 can be used to provide configurability, namely to electrically isolate a subset of the signal lines 1004-1, 1004-2, 1004-3, 1004-4 from all of the TSVs 1006-1, 1006-2, . . . , 1006-6.

With this in mind, consider a specific non-limiting operational scenario in which it is desired to meet a certain connectivity requirement, whereby signal lines 1004-1 and 1004-3 are to be connected to TSVs 1006-2 and 1006-4, respectively.

Figure 11:
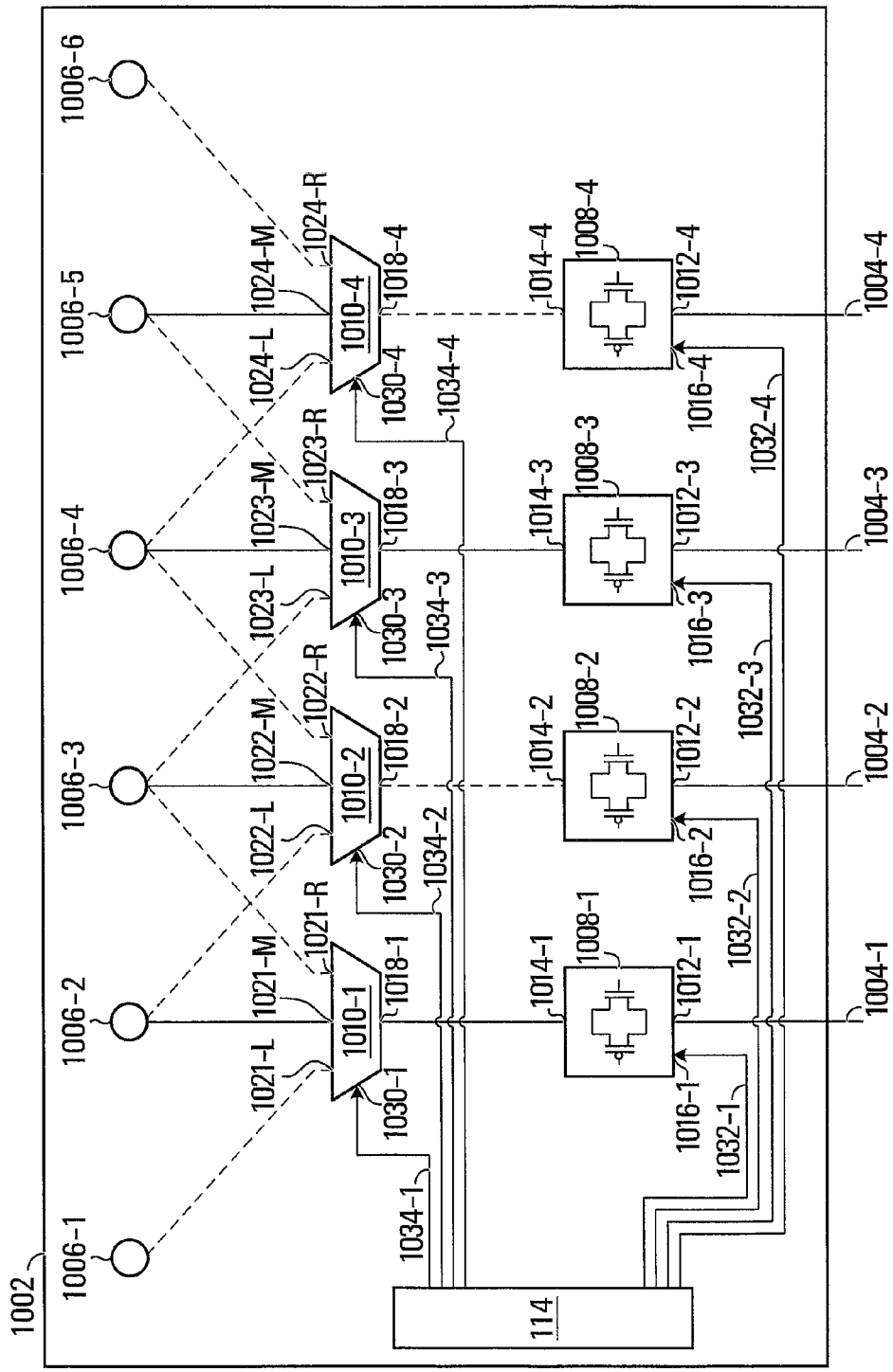
FIG. 11 shows the diagram of FIG. 10, wherein a subset of the transmission gates have acquired a conductive state and wherein another subset of the transmission gates have acquired a high-impedance output state.

Specifically, with reference to FIG. 11, transmission gate 1008-1 is programmed with control signal 1032-1 so as to cause signal line 1004-1 to be electrically connected to the input 1018-1 of demultiplexer 1010-1. Similarly, transmission gate 1008-3 is programmed with control signal 1032-3 so as to cause signal line 1004-3 to be electrically connected to the 1018-3 input of demultiplexer 1010-3. However, transmission gate 1008-2 is programmed with control signal 1032-2 so as to cause signal line 1004-2 to be electrically isolated from the input 1018-2 of demultiplexer 1010-2, thereby electrically isolating signal line 1004-2 from all the TSVs including TSVs 1006-2, 1006-3 and 1006-4. Similarly, transmission gate 1008-4 is programmed with control signal 1032-4 so as to cause signal line 1004-4 to be electrically isolated from the input 1018-4 of demultiplexer 1010-4, thereby electrically isolating signal line 1004-4 from all the TSVs including TSVs 1006-4, 1006-5 and 1006-6.

It will be seen that TSVs 1006-1, 1006-3, 1006-5 and 1006-6 are electrically isolated from all the signal lines 1004-1, 1004-2, 1004-3, 1004-4, which allows TSVs 1006-1, 1006-3, 1006-5 and 1006-6 to be used for establishing selective interconnections between other signal lines at different layers of the stack.

While the control signals 1032-1, 1032-2, 1032-3, 1032-4 sent to the transmission gates 1008-1, 1008-2, 1008-3, 1008-4 can be used to provide configurability, the control signals 1034-1, 1034-2, 1034-3, 1034-4 sent to the demultiplexers 1010-1, 1010-2, 1010-3, 1010-4 can be used to provide reparability when a failure is detected as a result of running a test or similar activity.

Consider therefore a specific non-limiting operational scenario in which it is desired to meet a certain connectivity requirement that is determined upon detecting that TSV 1006-4 has failed (while the other TSVs remain intact). To bypass the failed TSV, the new connectivity requirement may mandate that signal lines 1004-1 and 1004-3 are to be connected to TSVs 1006-2 and 1006-5, respectively.

Figure 12:
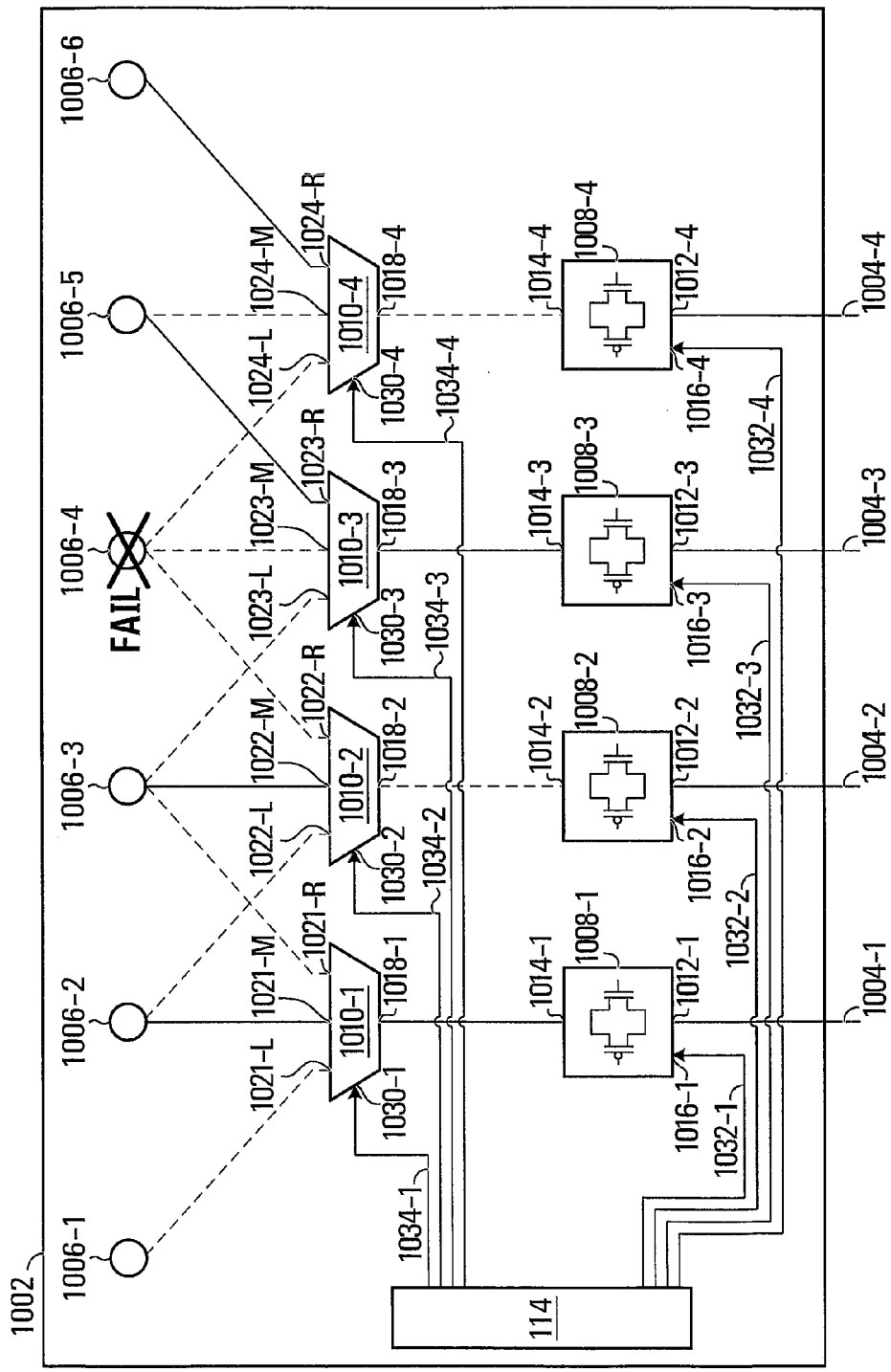
FIG. 12 shows the diagram of FIG. 11, wherein the demultiplexers have been specifically configured to bypass a failed TSV.

Thus, with reference to FIG. 12, the same control signals as in FIG. 11 are sent to transmission gates 1008-1, 1008-2, 1008-3, 1008-4. This results in transmission gates 1008-1 and 1008-3 acquiring the conductive state and transmission gates 1008-2 and 1008-4 acquiring the high-impedance output state. In addition, failure of TSV 1006-4 (or, analogously, failure of another TSV located on a different semiconductor die but electrically connected to TSV 1006-4) is detected during running of a test or similar activity. This prompts utilization of a different set of TSVs to which to connect certain ones of the signal lines 1004-1, 1004-2, 1004-3, 1004-4.

In particular, demultiplexer 1010-1 receives control signal 1034-1 instructing it to establish an electrical connection between its input 1018-1 and its "middle" output 1021-M, thereby causing an electrical connection to be established between the output 1014-1 of transmission gate 1008-1 (which is in the conductive state) and TSV 1006-2.

Demultiplexer 1010-2 receives control signal 1034-2 instructing it to establish an electrical connection between its input 1018-2 and its "middle" output 1022-M, thereby causing an electrical connection to be established between the output 1014-2 of transmission gate 1008-2 (which is in the high-impedance output state) and TSV 1006-3.

Demultiplexer 1010-3 receives control signal 1034-3 instructing it to establish an electrical connection between its input 1018-3 and its "right" output 1023-R, thereby causing an electrical connection to be established between the output 1014-3 of transmission gate 1008-3 (which is in the conductive state) and TSV 1006-5.

Finally, demultiplexer 1010-4 receives control signal 1034-4. Control signal 1034-4 could be configured so as to instruct demultiplexer 1010-4 to establish an electrical connection between its input 1018-4 and its "middle" output 1024-M as in the case of FIG. 11. However, this would cause demultiplexer 1010-4 to be electrically connected to demultiplexer 1010-3, which might in some circumstances not be desirable as it may introduce additional loading or capacitive problems. Therefore, control signal 1034-4 can be configured so as to instruct demultiplexer 1010-4 to establish an electrical connection between its input 1018-4 and its "right" output 1024-R, thereby causing an electrical connection to be established between the output 1014-4 of transmission gate 1008-4 (which is in the high-impedance output state) and TSV 1006-6.

It is seen that from a functional point of view, the TSV group 1002 still supports four (4) working TSVs, and that the failed TSV, namely TSV 1006-4, has been bypassed. Of course, it should be appreciated that TSV groups that are aligned with TSV group 1002 but located on other semiconductor dies in the stack may also need to be reconfigured in order to allow beneficial use of the repaired configuration of TSVs.

It should be appreciated that two failed TSVs in the TSV group 1002 can be bypassed in a similar fashion without affecting the ability of the TSV group 1002 to support four (4) working TSVs.

In a variant, the functionality of a transmission gate and a demultiplexer can be combined into a single device, namely an enhanced demultiplexer capable of acquiring a high-impedance output state. Accordingly, reference is made to FIG. 13, which shows a TSV group 1302 connected to signal lines 1004-1, 1004-2, 1004-3, 1004-4. It is recalled that a "TSV group" comprises a group of TSVs on a semiconductor die together with an associated set of selective connectors. In the presently illustrated embodiment, the TSV group 1302 includes the aforementioned six (6) TSVs 1006-1, 1006-2, . . . , 1006-6, and the selective connectors are implemented as a set of four (4) enhanced demultiplexers 1310-1, 1310-2, 1310-3, 1310-4. Each of the enhanced demultiplexers 1310-1, 1310-2, 1310-3, 1310-4 is capable of acquiring a high-impedance output state.

It is noted that the number of TSVs in the TSV group 1302 is greater than the number of signal lines connected to the TSV group 1302. This allows the TSV group 1302 to exhibit redundancy, which is useful when repairing defects. Specifically, in the illustrated embodiment, which is non-limiting, there are four (4) signal lines 1004-1, 1004-2, 1004-3, 1004-4 and six (6) TSVs 1006-1, 1006-2, . . . , 1006-6. The two additional TSVs allow for proper functionality of the TSV group 1302 as a whole, even in the event that up to two (2) of the TSVs 1006-1, 1006-2, . . . , 1006-6 were to suffer a failure. However, it should be understood that there is no particular limitation on either the number of signal lines connected to the TSV group 1302 or the number of additional TSVs in the TSV group 1302.

Each of the enhanced demultiplexers 1310-1, 1310-2, 1310-3, 1310-4 has a respective input 1318-1, 1318-2, 1318-3, 1318-4 connected to a respective one of the signal lines 1004-1, 1004-2, 1004-3, 1004-4.

Each of the enhanced demultiplexers 1310-1, 1310-2, 1310-3, 1310-4 also has a respective plurality of outputs associated with a corresponding subset of the TSVs. In the illustrated embodiment, each of the enhanced demultiplexers 1310-1, 1310-2, 1310-3, 1310-4 has three (3) outputs, which are referred to for convenience and simplicity as the "left" output (-L), the "middle" output (-M) and the "right" output (-R), each of which is connected to a corresponding one of the TSVs associated with that enhanced demultiplexer. However, it should be appreciated that in general, the number of outputs of any given one of the enhanced demultiplexers is not limited, and may range anywhere from two upwards. Moreover, the various enhanced demultiplexers are not required to all have the same number of outputs.

Specifically, enhanced demultiplexer 1310-1 includes a plurality of outputs 1321-L, 1321-M, 1321-R, which are respectively connected to TSVs 1006-1, 1006-2, 1006-3. Enhanced demultiplexer 1310-2 includes a plurality of outputs 1322-L, 1322-M, 1322-R, which are respectively connected to TSVs 1006-2, 1006-3, 1006-4. Enhanced demultiplexer 1310-3 includes a plurality of outputs 1323-L, 1323-M, 1323-R, which are respectively connected to TSVs 1006-3, 1006-4, 1006-5. Finally, enhanced demultiplexer 1310-4 includes a plurality of outputs 1324-L, 1324-M, 1324-R, which are respectively connected to TSVs 1006-4, 1006-5, 1006-6.

Each of the enhanced demultiplexers 1310-1, 1310-2, 1310-3, 1310-4 also has a respective control port 1330-1, 1330-2, 1330-3, 1330-4. The control port of a given one of the enhanced demultiplexers 1310-1, 1310-2, 1310-3, 1310-4 receives a control signal from the configuration controller 114, on the basis of which the given one of the enhanced demultiplexers 1310-1, 1310-2, 1310-3, 1310-4 either (i) electrically isolates its input from all of its outputs or (ii) establishes an electrical connection between its input and only one of its outputs (either the "left", the "middle" or the "right"), with the other outputs remaining electrically isolated from the input. The control signal received at the control port of a particular one of the enhanced demultiplexers 1310-1, 1310-2, 1310-3, 1310-4 can have one of 4 predetermined values (e.g., it can be a 2-bit signal), with a first value indicating that the particular enhanced demultiplexer is to establish an electrical connection between its input and its "left" output, a second predetermined value indicating that the particular enhanced demultiplexer is to establish an electrical connection between its input and its "middle" output, a third predetermined value indicating that the particular enhanced demultiplexer is to establish an electrical connection between its input and its "right" output, and a fourth predetermined value indicating that the particular enhanced demultiplexer is to electrically isolate its input from all of its outputs. Generally speaking, for a particular one of the enhanced demultiplexers 1310-1, 1310-2, 1310-3, 1310-4 having between $(2^{n-1})$ and $(2^n-1)$ outputs, the control signal received at the corresponding control port can be an n-bit signal.

Control signals 1334-1, 1334-2, 1334-3, 1334-4 sent to the enhanced demultiplexers 1310-1, 1310-2, 1310-3, 1310-4 can be used to provide configurability, namely to electrically isolate one or more of the signal lines 1004-1, 1004-2, 1004-3, 1004-4 from all of the TSVs 1006-1, 1006-2, . . . , 1006-6.

Figure 13:
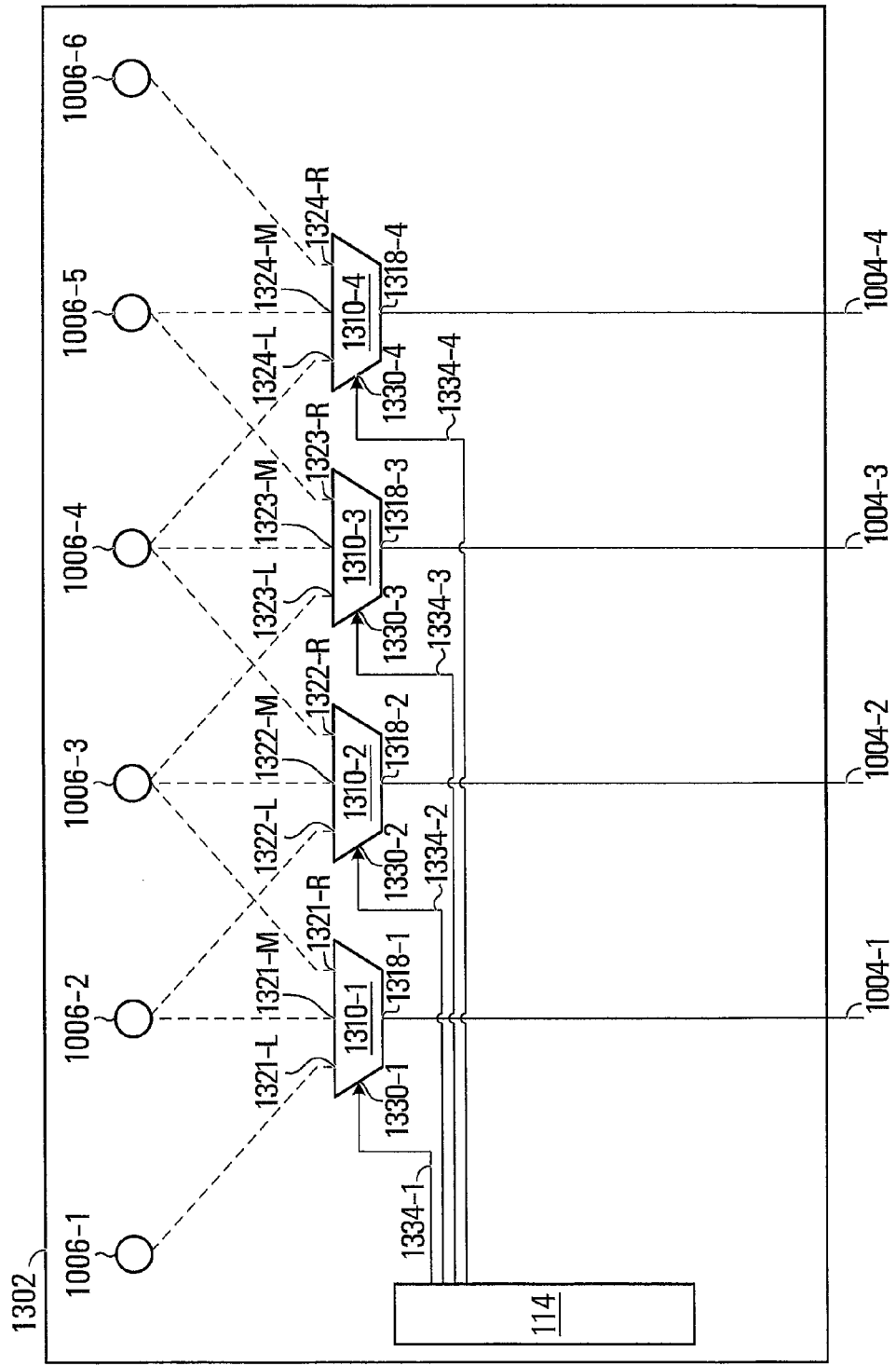
FIG. 13 depicts a TSV group on a semiconductor die, comprising a set of TSVs and a set of selective connectors that are implemented as a plurality of enhanced demultiplexers.

With this in mind, consider a specific non-limiting operational scenario in which it is desired to meet a certain connectivity requirement for connecting the signal lines 1004-1, 1004-2, 1004-3, 1004-4 relative to the TSVs 1006-1, 1006-2, . . . , 1006-6 in the embodiment of FIG. 13. The connectivity requirement may be determined as a result of having carried out semiconductor die testing during a fabrication stage. The connectivity requirement is known to the configuration controller 114. For the purposes of the present non-limiting embodiment, the connectivity requirement is such that signal lines 1004-1 and 1004-3 are to be connected to TSVs 1006-2 and 1006-4, respectively.

Figure 14:
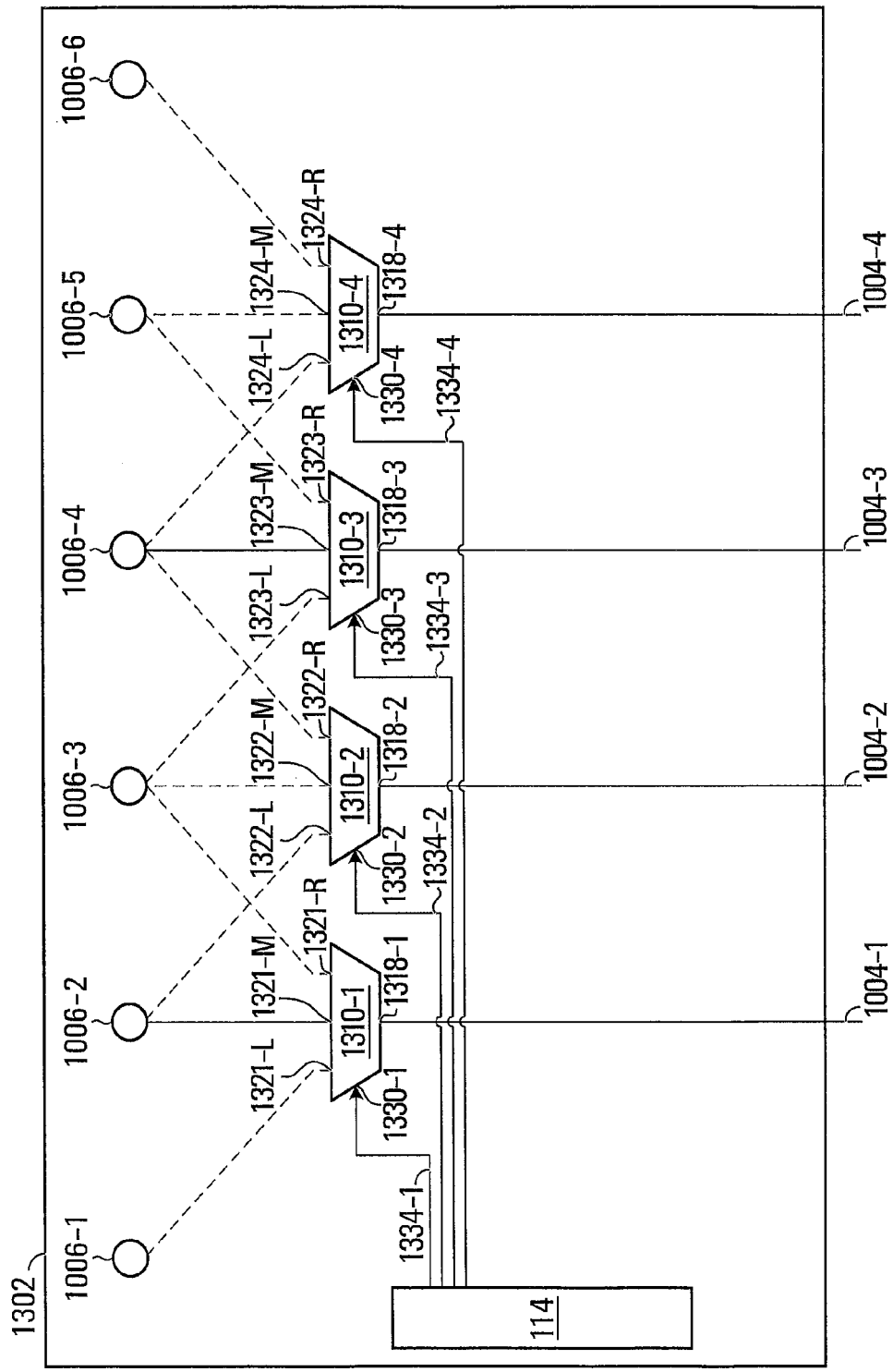
FIG. 14 shows the diagram of FIG. 13, wherein a subset of the enhanced demultiplexers connectors have acquired a conductive state and wherein another subset of the enhanced demultiplexers have acquired a high-impedance output state.

Accordingly, with reference to FIG. 14, enhanced demultiplexer 1310-1 is programmed with control signal 1334-1 so as to cause signal line 1004-1 to be electrically connected to TSV 1006-2. Similarly, enhanced demultiplexer 1310-3 is programmed with control signal 1334-3 so as to cause signal line 1004-3 to be electrically connected to TSV 1006-4. However, enhanced demultiplexer 1310-2 is programmed with control signal 1334-2 so as to cause signal line 1004-2 to be electrically isolated from all the TSVs including TSVs 1006-2, 1006-3 and 1006-4. Similarly, enhanced demultiplexer 1310-4 is programmed with control signal 1334-4 so as to cause signal line 1004-4 to be electrically isolated from all the TSVs including TSVs 1006-4, 1006-5 and 1006-6.

It will be seen that TSVs 1006-1, 1006-3, 1006-5 and 1006-6 are electrically isolated from all the signal lines 1004-1, 1004-2, 1004-3, 1004-4, which allows TSVs 1006-1, 1006-3, 1006-5 and 1006-6 to be used for establishing selective interconnections between other signal lines at different layers of the stack.

In addition to providing configurability, the control signals 1334-1, 1334-2, 1334-3, 1334-4 sent to the enhanced demultiplexers 1310-1, 1310-2, 1310-3, 1310-4 can be used to provide reparability when a failure is detected as a result of running a test or similar activity.

Consider therefore a specific non-limiting operational scenario in which it is desired to meet a certain connectivity requirement that is determined upon detecting that TSV 1006-4 has failed (which the other TSVs remain intact). To bypass the failed TSV, the new connectivity requirement may mandate that signal lines 1004-1, 1004-2 are to be connected to TSVs 1006-2 and 1006-5, respectively.

Figure 15:
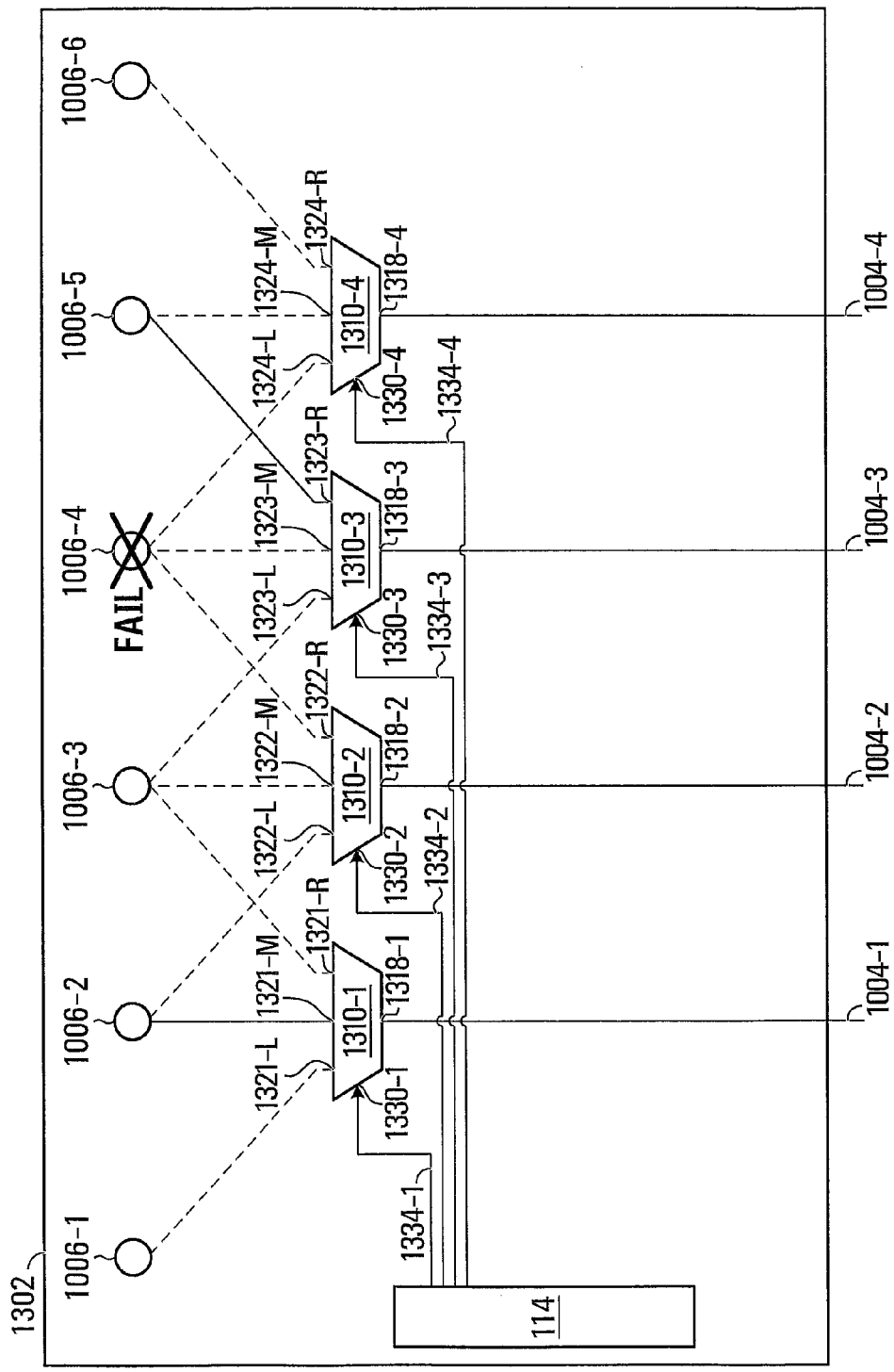
FIG. 15 shows the diagram of FIG. 14, wherein the enhanced demultiplexers have been specifically configured to bypass a failed TSV.

Accordingly, with reference to FIG. 15, failure of TSV 1006-4 (or, analogously, failure of another TSV located on a different semiconductor die but electrically connected to TSV 1006-4) is detected during running of a test or similar activity. This prompts utilization of a different set of TSVs to which to connect certain ones of the signal lines 1004-1, 1004-2, 1004-3, 1004-4.

In particular, enhanced demultiplexer 1310-1 receives control signal 1334-1 instructing it to establish an electrical connection between its input 1318-1 and its "middle" output 1321-M, thereby causing an electrical connection to be established between signal line 1004-1 and TSV 1006-2.

Enhanced demultiplexer 1310-2 receives control signal 1334-2 instructing it to remain in the high-impedance output state, thereby causing signal line 1004-2 to continue to be electrically isolated from all the TSVs including TSVs 1006-2, 1006-3 and 1006-4.

Enhanced demultiplexer 1310-3 receives control signal 1334-3 instructing it to establish an electrical connection between its input 1318-3 and its "right" output 1323-R, thereby causing an electrical connection to be established between signal line 1004-3 and TSV 1006-5.

Finally, enhanced demultiplexer 1310-4 receives control signal 1334-4 instructing it to remain in the high-impedance output state, thereby causing signal line 1004-4 to continue to be electrically isolated from all the TSVs including TSVs 1006-4, 1006-5 and 1006-6. In this embodiment, because enhanced demultiplexer 1310-4 is capable of being placed in the high-impedance output state, the issues of loading and capacitance that were present with demultiplexer 1010-4 in FIG. 12 do not manifest themselves in this embodiment.

It is seen that from a functional point of view, the TSV group 1302 still supports four (4) working TSVs, and that the failed TSV, namely TSV 1006-4, has been bypassed. Of course, it should be appreciated that TSV groups that are aligned with TSV group 1302 but located on other semiconductor dies in the stack may also need to be reconfigured in order to allow beneficial use of the repaired configuration of TSVs.

It should be appreciated that two failed TSVs in the TSV group 1302 can be bypassed in a similar fashion without affecting the ability of the TSV group 1302 to support four (4) working TSVs.

It should be appreciated that in some cases, the number of failed TSVs in a given TSV group may exceed the number of superfluous TSVs in that group. As a result, the number of intact TSVs in the given TSV group may end up being less than the number of signal lines. In other cases, the selective connectors of the given TSV group may fail. When either of these situations occurs, the given TSV group may be considered to have a critical defect. Under such circumstances, reparability can still be achieved, for example by providing a redundant TSV group.

Figure 16A:
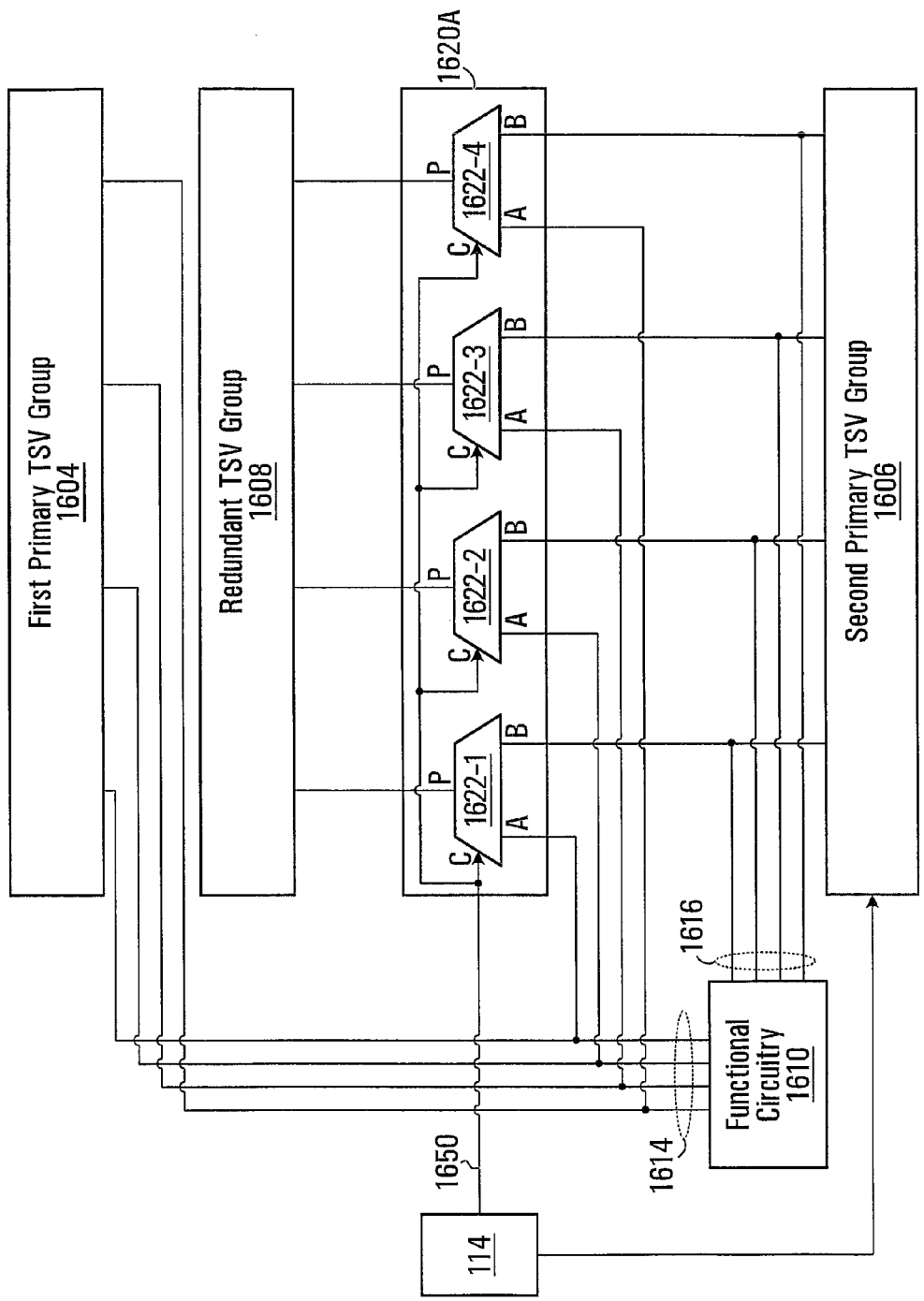
FIG. 16A is a block diagram illustrating a redundant TSV group that provides redundancy for two primary TSV groups.

Specifically, with reference to FIG. 16A, a semiconductor device includes a first primary TSV group 1604, a second primary TSV group 1606 and a redundant TSV group 1608. The first primary TSV group 1604, the second primary TSV group 1606 and the redundant TSV group 1608 can each be a TSV group with a plurality of TSVs and an associated set of selective connectors, such as has been described earlier in this specification, although this is not a requirement. In other words, the first primary TSV group 1604, the second primary TSV group 1606 and the redundant TSV group 1608 may, but need not be, configurable and/or reparable.

A set of first signal lines 1614 emanating from functional circuitry 1610 on the semiconductor device extends to the first primary TSV group 1604 and branches out to group switching circuitry 1620A. A set of second signal lines 1616 emanating from the functional circuitry 1610 extends to the second primary TSV group 1606 and also branches out to the group switching circuitry 1620A. The group switching circuitry 1620A is further connected to the selective connectors of the redundant TSV group 1608.

The group switching circuitry 1620A may include a bank of enhanced multiplexers 1622-1, 1622-2, 1622-3, 1622-4, each of which has two respective inputs (A and B), an output (P) and a control port (C). Considering a particular one of the enhanced multiplexers 1622-1, 1622-2, 1622-3, 1622-4, input A receives one of the first signal lines 1614, while input B receives one of the second signal lines 1616. The output P of each of the mutliplexers 1622-1, 1622-2, 1622-3, 1622-4 is connected to a respective selective connector of the redundant TSV group 1608. The control port C of each of the enhanced multiplexers 1622-1, 1622-2, 1622-3, 1622-4 receives a control signal 1650 from the configuration controller 114. The control ports C of the various enhanced multiplexers 1622-1, 1622-2, 1622-3, 1622-4 may be electrically connected together, since they will all be caused to exhibit the same switching behavior.

The control signal 1650 received from the configuration controller 114 causes each of the enhanced multiplexers 1622-1, 1622-2, 1622-3, 1622-4 to either:

(i) electrically connect one of its respective inputs (A or B) to its respective output P, thereby causing an electrical connection between the respective one of the first signal lines 1614 or the respective one of the second signal lines 1616 and the redundant TSV group 1608; or (ii) acquire a high-impedance output state, whereby both the respective one of the first signal lines 1614 and the respective one of the second signal lines 1616 are electrically isolated from the redundant TSV group 1608.

To this end, the control signal 1650 received at the control port C of each of the enhanced multiplexers 1622-1, 1622-2, 1622-3, 1622-4 can have one of 3 predetermined values (e.g., it can be a 2-bit signal), with a first predetermined value indicating that the enhanced multiplexers are to establish an electrical connection between their respective input A and their respective output, a second predetermined value indicating that the enhanced multiplexers are to establish an electrical connection between the respective input B and their respective output and a third predetermined value indicating that the enhanced multiplexers are to acquire a high-impedance state. Generally speaking, when the enhanced multiplexers 1622-1, 1622-2, 1622-3, 1622-4 have between ($2^{m-1}$) and ($2^m-1$) inputs, the control signal 1650 can be an m-bit signal.

In the absence of the control signal 1650, the enhanced multiplexers 1622-1, 1622-2, 1622-3, 1622-4 may be configured (by default) to acquire a high-impedance output state, as a result of which the first signal lines 1614 and the second signal lines 1616 will be electrically isolated from the redundant TSV group 1608.

Figure 16B:
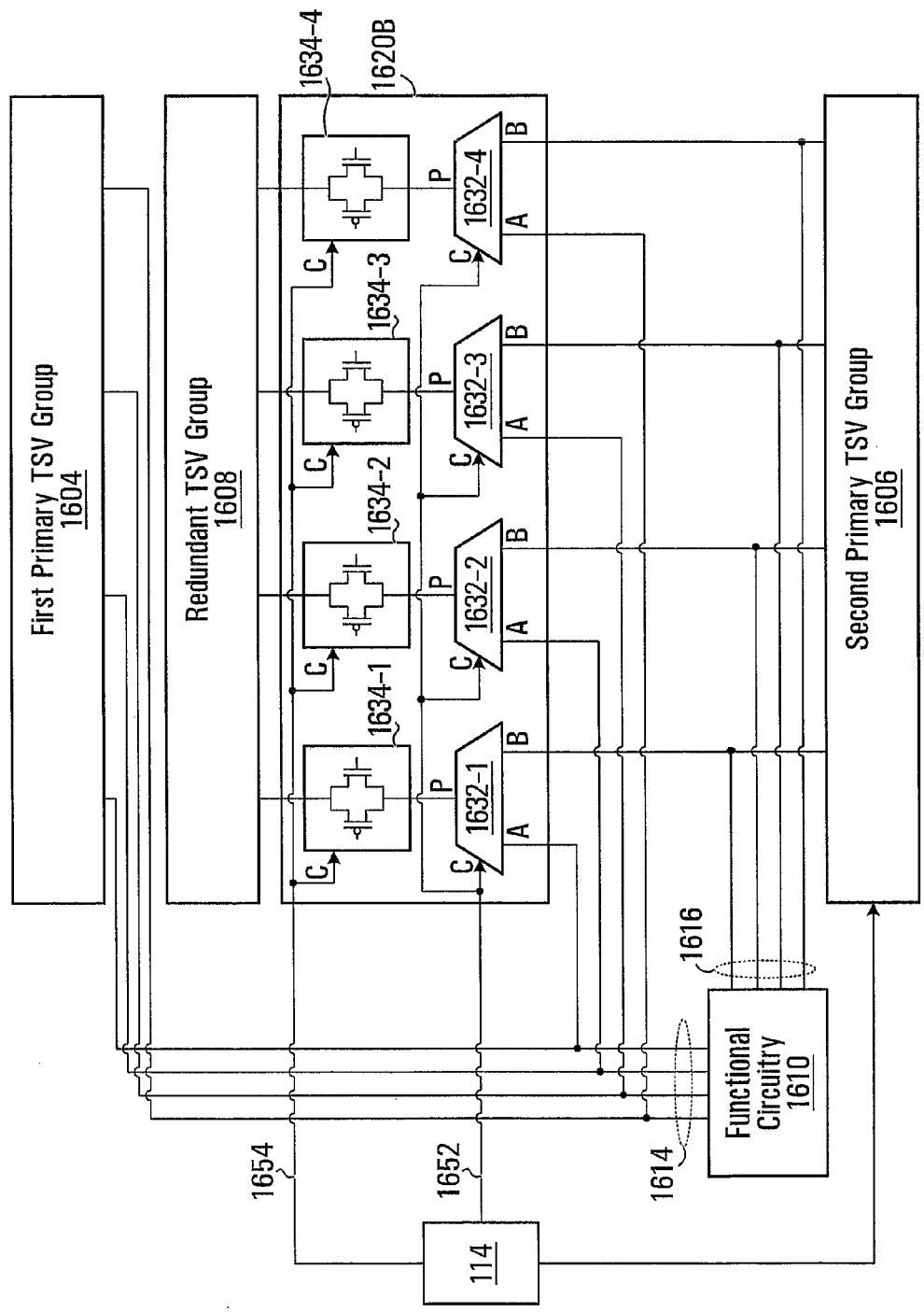
FIG. 16B is a block diagram illustrating a redundant TSV group that provides redundancy for a single primary TSV group.

In another example embodiment, shown in FIG. 16B, the semiconductor device includes group switching circuitry 1620B, which includes a bank of multiplexers 1632-1, 1632-2, 1632-3, 1632-4. However, the multiplexers 1632-1, 1632-2, 1632-3, 1632-4 are not capable of acquiring a high-impedance output state. Accordingly, a bank of transmission gates 1634-1, 1634-2, 1634-3, 1634-4 is provided between the outputs P of the multiplexers and the redundant TSV group 1608. Each of the transmission gates 1634-1, 1634-2, 1634-3, 1634-4 may includes a control port (C). The control ports C of the various transmission gates 1634-1, 1634-2, 1634-3, 1634-4 may be electrically connected together, since they will all be caused to exhibit the same switching behavior.

The configuration controller 114 provides a control signal that has a first component 1652 and a second component 1654. The first component 1652 of the control signal causes each of the multiplexers 1632-1, 1632-2, 1632-3, 1632-4 to electrically connect one of its respective inputs (A or B) to the output P, thereby causing an electrical connection between the respective one of the first signal lines 1614 or the respective one of the second signal lines 1616 and the redundant TSV group 1608. In the absence of the first component 1652 of the control signal, the multiplexers 1632-1, 1632-2, 1632-3, 1632-4 may be configured (by default) to cause the first signal lines 1614—or the second signal lines 1616—to be electrically connected to the redundant TSV group 1608.

To this end, the first component 1652 received at the control port C of each of the multiplexers 1632-1, 1632-2, 1632-3, 1632-4 can have one of 2 predetermined values (e.g., it can be a 1-bit signal), with a first predetermined value indicating that the multiplexers are to establish an electrical connection between their respective input A and their respective output and a second predetermined value indicating that the multiplexers are to establish an electrical connection between their respective input B and their respective output. Generally speaking, when the multiplexers 1632-1, 1632-2, 1632-3, 1632-4 have between ($2^{m-1}+1$) and $2^m$ inputs, the first component 1652 can be an m-bit signal.

The second component 1654 of the control signal is provided to the transmission gates 1634-1, 1634-2, 1634-3, 1634-4 in order to cause the outputs P of the multiplexers 1632-1, 1632-2, 1632-3, 1632-4 to be either electrically connected to or electrically isolated from the redundant TSV group 1608. In the absence of the second component 1654 of the control signal, the transmission gates 1634-1, 1634-2, 1634-3, 1634-4 may be configured (by default) to acquire either a conductive state or a high-impedance output state.

To this end, the second component 1654 received at the control port C of each of the transmission gates 1634-1, 1634-2, 1634-3, 1634-4 can have one of 2 predetermined values (e.g., it can be a 1-bit signal), with a first predetermined value indicating that the transmission gates are to acquire a conductive state and a second predetermined value indicating that the particular transmission gates are to acquire a high-impedance state.

In non-limiting example embodiments, the second component 1654 of the control signal can be programmed by, for example, fuses (including e-fuses) or other programmable elements, although other possibilities exist and are within the scope of the present invention.

Although only two (2) primary TSV groups 1604, 1606 are shown, it should be understood that there is no particular limitation on the number of TSV groups handled by the redundant TSV group 1608. In fact, in a fully redundant system, the redundant TSV group 1608 can provide redundancy for a single primary TSV group, as will now be described.

Figure 16C:
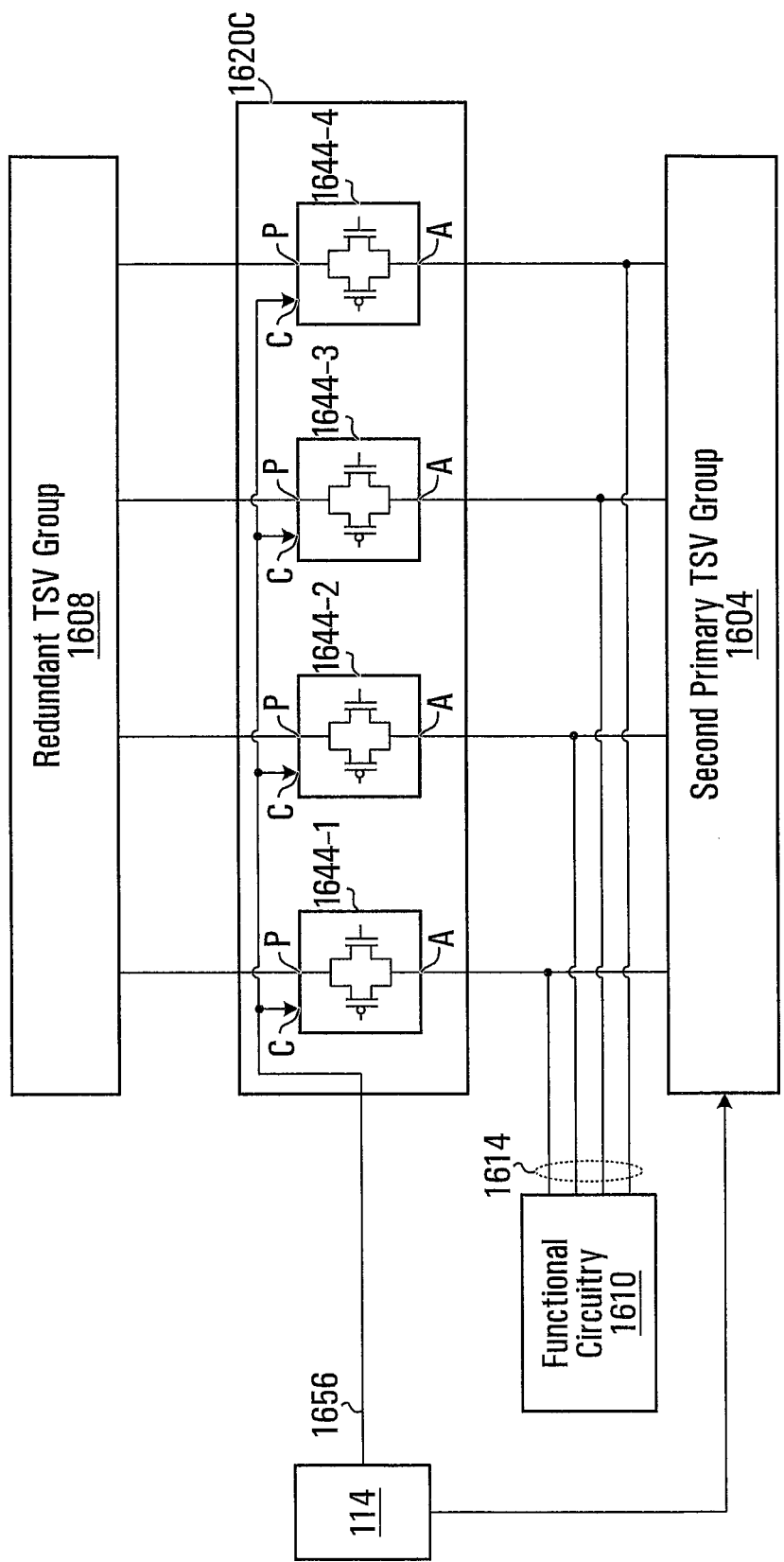
FIG. 16C is a block diagram illustrating a variant of FIG. 16A.

Specifically, with reference to FIG. 16C, the semiconductor device includes a single primary TSV group 1604, a redundant TSV group 1608 and group switching circuitry 1620C. The primary TSV group 1604 and the redundant TSV group 1608 can each be a TSV group with a plurality of TSVs and an associated set of selective connectors, such as has been described earlier in this specification, although this is not a requirement. In other words, the primary TSV group 1604 and the redundant TSV group 1608 may, but need not be, configurable and/or reparable.

The first signal lines 1614 emanating from the functional circuitry 1610 on the semiconductor device extend to the first primary TSV group 1604 and branch out to group switching circuitry 1620C, which is connected to the redundant TSV group 1608. The group switching circuitry 1620C may include a bank of transmission gates 1644-1, 1644-2, 1644-3, 1644-4, each of which has an input A, an output P and a control port C. The input A is connected to a respective one of the signal lines 1614, while the output P is connected to a respective selective connector of the redundant TSV group 1608. The control port C of each of the transmission gates 1644-1, 1644-2, 1644-3, 1644-4 receives a control signal 1656 from the configuration controller 114. The control port C of the various transmission gates 1644-1, 1644-2, 1644-3, 1644-4 may be electrically connected together, since they will all be caused to exhibit the same switching behavior.

The control signal 1656 received from the configuration controller 114 causes each of the transmission gates 1644-1, 1644-2, 1644-3, 1644-4 to either:
  (i) electrically connect its respective input A to its respective output P, thereby causing an electrical connection between the respective one of the first signal lines 1614 and the redundant TSV group 1608; or
  (ii) acquire a high-impedance output state, whereby the respective one of the first signal lines 1614 is electrically isolated from the redundant TSV group 1608.

To this end, the control signal at the control port C of each of the transmission gates 1644-1, 1644-2, 1644-3, 1644-4 can have one of 2 predetermined values (e.g., it can be a 1-bit signal), with a first predetermined value indicating that the transmission gates are to acquire a conductive state and a second predetermined value indicating that the particular transmission gates are to acquire a high-impedance state.

In the absence of the control signal 1656, the transmission gates 1644-1, 1644-2, 1644-3, 1644-4 may be configured (by default) to acquire either a conductive state or a high-impedance output state.

Figure 17:
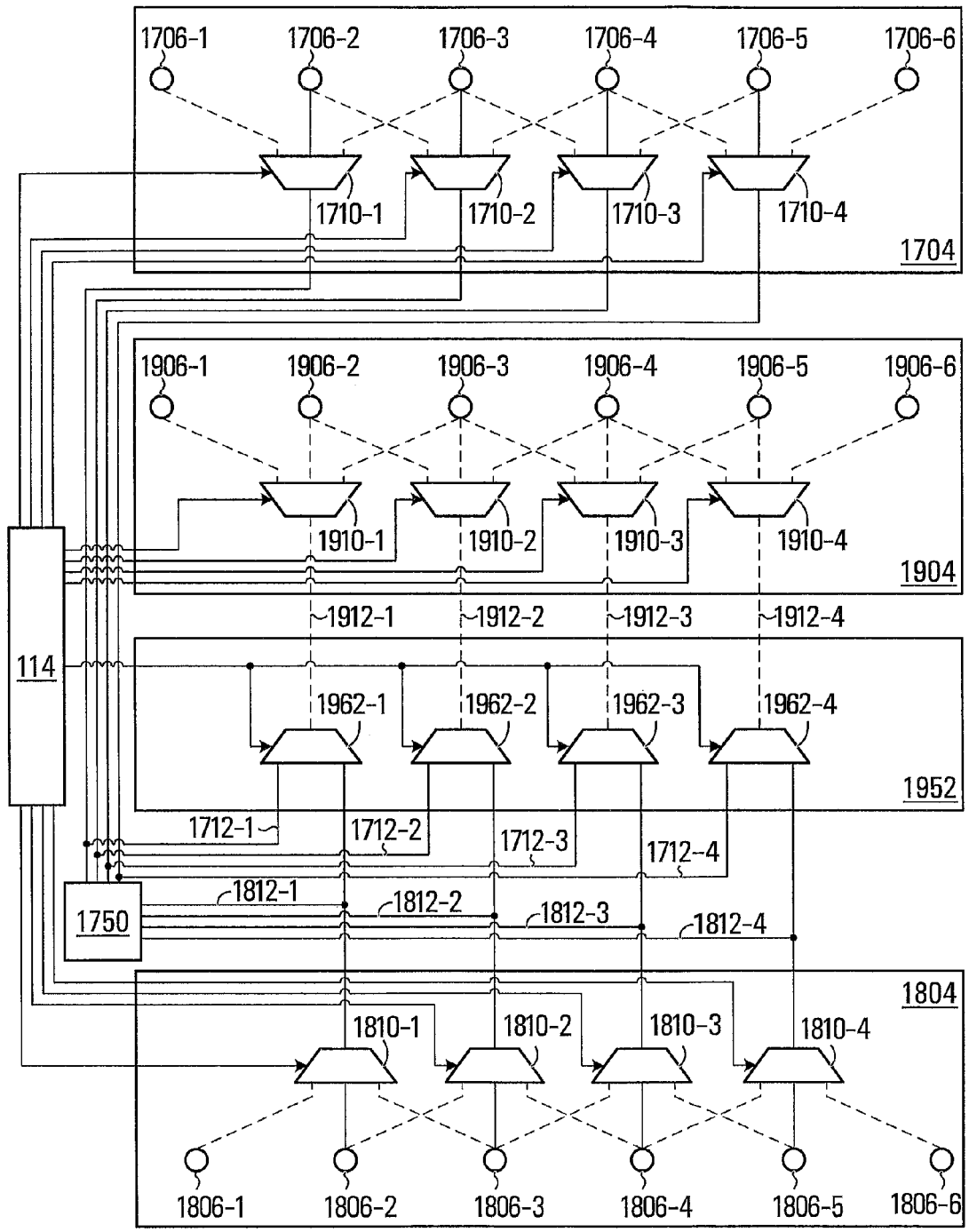
FIG. 17 is a block diagram illustrating

FIG. 17 is a conceptual diagram showing a semiconductor device having a configurable and reparable redundant TSV group 1904 that provides redundancy for two primary TSV groups 1704, 1804 that are also configurable and reparable. As such, the architecture to be described is based on that of FIG. 16A, namely wherein one redundant TSV group provides redundancy for two primary TSV groups. However, it should be appreciated that this choice has been made purely for convenience and simplicity. Indeed, the redundant TSV group 1904 may provide redundancy for as few as one primary TSV group or for any larger number of primary TSV groups. Also, the redundant TSV group 1904 need not itself be reparable. Also, the primary TSV groups (or group) for which the redundant TSV group 1904 provides redundancy need not themselves be reparable.

In the presently illustrated embodiment, the first primary TSV group 1704 includes six (6) TSVs 1706-1, 1706-2, ..., 1706-6, and a set of four (4) selective connectors implemented as enhanced demultiplexers 1710-1, 1710-2, 1710-3, 1710-4. Each of the enhanced demultiplexers 1710-1, 1710-2, 1710-3, 1710-4 is capable of acquiring a high-impedance output state. However, other implementations exist and are within the scope of the present invention.

It is noted that the number of TSVs in the first primary TSV group 1704 is greater than the number of signal lines connected to the first primary TSV group 1704. This allows the first primary TSV group 1704 to exhibit redundancy, which is useful when repairing defects. Specifically, in the illustrated embodiment, which is non-limiting, there are four (4) first signal lines 1712-1, 1712-2, 1712-3, 1712-4 and six (6) TSVs 1706-1, 1706-2, ..., 1706-6. The two additional TSVs allow for proper functionality of the first primary TSV group 1704 as a whole, even in the event that up to two (2) of the TSVs 1706-1, 1706-2, ..., 1706-6 were to suffer a failure. However, it should be understood that there is no particular limitation on either the number of signal lines connected to the first primary TSV group 1704 or the number of additional TSVs in the first primary TSV group 1704.

Each of the enhanced demultiplexers 1710-1, 1710-2, 1710-3, 1710-4 has a respective input connected to a respective one of the signal lines 1712-1, 1712-2, 1712-3, 1712-4.

Each of the enhanced demultiplexers 1710-1, 1710-2, 1710-3, 1710-4 also has a respective plurality of outputs associated with a corresponding subset of the TSVs. In the illustrated embodiment, each of the enhanced demultiplexers 1710-1, 1710-2, 1710-3, 1710-4 has three (3) outputs, which are referred to for convenience and simplicity as the "left" output, the "middle" output and the "right" output, each of which is connected to a corresponding one of the TSVs associated with that enhanced demultiplexer. However, it should be appreciated that in general, the number of outputs of any given one of the enhanced demultiplexers is not limited, and may range anywhere from two upwards. Moreover, the various enhanced demultiplexers are not required to all have the same number of outputs.

Specifically, enhanced demultiplexer 1710-1 includes a plurality of outputs respectively connected to TSVs 1706-1, 1706-2, 1706-3. Enhanced demultiplexer 1710-2 includes a plurality of outputs respectively connected to TSVs 1706-2, 1706-3, 1706-4. Enhanced demultiplexer 1710-3 includes a plurality of outputs respectively connected to TSVs 1706-3, 1706-4, 1706-5. Finally, enhanced demultiplexer 1710-4 includes a plurality of outputs respectively connected to TSVs 1706-4, 1706-5, 1706-6.

Each of the enhanced demultiplexers 1710-1, 1710-2, 1710-3, 1710-4 also has a respective control port. The control port of a given one of the enhanced demultiplexers 1710-1, 1710-2, 1710-3, 1710-4 receives a control signal from the configuration controller 114, on the basis of which the given one of the enhanced demultiplexers 1710-1, 1710-2, 1710-3, 1710-4 either (i) electrically isolates its input from all of its outputs or (ii) establishes an electrical connection between its input and only one of its outputs (either the "left", the "middle" or the "right"), with the other outputs remaining electrically isolated from the input. The control signal received at the control port of a particular one of the enhanced demultiplexers 1710-1, 1710-2, 1710-3, 1710-4 can have one of 4 predetermined values (e.g., it can be a 2-bit signal), with a first predetermined value indicating that the particular enhanced demultiplexer is to establish an electrical connection between its input and its "left" output, a second predetermined value indicating that the particular enhanced demultiplexer is to establish an electrical connection between its input and its "middle" output, a third predetermined value indicating that the particular enhanced demultiplexer is to establish an electrical connection between its input and its "right" output and a fourth predetermined value indicating that the particular enhanced demultiplexer is to electrically isolate its input from all of its outputs. Generally speaking, for a particular one of the demultiplexers 1710-1, 1710-2, 1710-3, 1710-4 having between $(2^{n-1})$ and $(2^n-1)$ outputs, the control signal received at the corresponding control port can be an n-bit signal.

Analogously, the second primary TSV group 1804 includes six (6) TSVs 1806-1, 1806-2, ..., 1806-6, and a set of four (4) selective connectors implemented as enhanced demultiplexers 1810-1, 1810-2, 1810-3, 1810-4. Each of the enhanced demultiplexers 1810-1, 1810-2, 1810-3, 1810-4 is capable of acquiring a high-impedance output state. However, other implementations exist and are within the scope of the present invention.

It is noted that the number of TSVs in the second primary TSV group 1804 is greater than the number of signal lines connected to the second primary TSV group 1804. This allows the second primary TSV group 1804 to exhibit redundancy, which is useful when repairing defects. Specifically, in the illustrated embodiment, which is non-limiting, there are four (4) first signal lines 1812-1, 1812-2, 1812-3, 1812-4 and six (6) TSVs 1806-1, 1806-2, ..., 1806-6. The two additional TSVs allow for proper functionality of the second primary TSV group 1804 as a whole, even in the event that up to two (2) of the TSVs 1806-1, 1806-2, ..., 1806-6 were to suffer a failure. However, it should be understood that there is no particular limitation on either the number of signal lines connected to the second primary TSV group 1804 or the number of additional TSVs in the second primary TSV group 1804.

Each of the enhanced demultiplexers 1810-1, 1810-2, 1810-3, 1810-4 has a respective input connected to a respective one of the signal lines 1812-1, 1812-2, 1812-3, 1812-4.

Each of the enhanced demultiplexers 1810-1, 1810-2, 1810-3, 1810-4 also has a respective plurality of outputs associated with a corresponding subset of the TSVs. In the illustrated embodiment, each of the enhanced demultiplexers 1810-1, 1810-2, 1810-3, 1810-4 has three (3) outputs, which are referred to for convenience and simplicity as the "left" output, the "middle" output and the "right" output, each of which is connected to a corresponding one of the TSVs associated with that enhanced demultiplexer. However, it should be appreciated that in general, the number of outputs of any given one of the enhanced demultiplexers is not limited, and may range anywhere from two upwards. Moreover, the various enhanced demultiplexers are not required to all have the same number of outputs.

Specifically, enhanced demultiplexer 1810-1 includes a plurality of outputs respectively connected to TSVs 1806-1, 1806-2, 1806-3. Enhanced demultiplexer 1810-2 includes a plurality of outputs respectively connected to TSVs 1806-2, 1806-3, 1806-4. Enhanced demultiplexer 1810-3 includes a plurality of outputs respectively connected to TSVs 1806-3, 1806-4, 1806-5. Finally, enhanced demultiplexer 1810-4 includes a plurality of outputs respectively connected to TSVs 1806-4, 1806-5, 1806-6.

Each of the enhanced demultiplexers 1810-1, 1810-2, 1810-3, 1810-4 also has a respective control port. The control port of a given one of the enhanced demultiplexers 1810-1, 1810-2, 1810-3, 1810-4 receives a control signal from the configuration controller 114, on the basis of which the given one of the enhanced demultiplexers 1810-1, 1810-2, 1810-3, 1810-4 either (i) electrically isolates its input from all of its outputs or (ii) establishes an electrical connection between its input and only one of its outputs (either the "left", the "middle" or the "right"), with the other outputs remaining electrically isolated from the input. The control signal received at the control port of a particular one of the enhanced demultiplexers 1810-1, 1810-2, 1810-3, 1810-4 can have one of 4 predetermined values (e.g., it can be a 2-bit signal), with a first predetermined value indicating that the particular enhanced demultiplexer is to establish an electrical connection between its input and its "left" output, a second predetermined value indicating that the particular enhanced demultiplexer is to establish an electrical connection between its input and its "middle" output, a third predetermined value indicating that the particular enhanced demultiplexer is to establish an electrical connection between its input and its "right" output and a fourth predetermined value indicating that the particular enhanced demultiplexer is to electrically isolate its input from all of its outputs. Generally speaking, for a particular one of the enhanced demultiplexers 1810-1, 1810-2, 1810-3, 1810-4 having between $2^n$ and $(2^n-1)$ outputs, the control signal received at the corresponding control port can be an n-bit signal.

In addition, the redundant TSV group 1904 includes six (6) TSVs 1906-1, 1906-2, ..., 1906-6, and a set of four (4) selective connectors implemented as enhanced demultiplexers 1910-1, 1910-2, 1910-3, 1910-4. Each of the enhanced demultiplexers 1910-1, 1910-2, 1910-3, 1910-4 is capable of acquiring a high-impedance output state. However, other implementations exist and are within the scope of the present invention.

It is noted that the number of TSVs in the redundant TSV group 1904 is greater than the number of signal lines connected to the redundant TSV group 1904. This allows the redundant TSV group 1904 to exhibit redundancy, which is useful when repairing defects. Specifically, in the illustrated embodiment, which is non-limiting, there are four (4) signal lines 1912-1, 1912-2, 1912-3, 1912-4 and six (6) TSVs 1906-1, 1906-2, ..., 1906-6. The two additional TSVs allow for proper functionality of the redundant TSV group 1904 as a whole, even in the event that up to two (2) of the TSVs 1906-1, 1906-2, ..., 1906-6 were to suffer a failure. However, it should be understood that there is no particular limitation on either the number of signal lines connected to the redundant TSV group 1904 or the number of additional TSVs in the redundant TSV group 1904.

Each of the enhanced demultiplexers 1910-1, 1910-2, 1910-3, 1910-4 has a respective input connected to a respective one of the signal lines 1912-1, 1912-2, 1912-3, 1912-4.

Each of the enhanced demultiplexers 1910-1, 1910-2, 1910-3, 1910-4 also has a respective plurality of outputs associated with a corresponding subset of the TSVs. In the illustrated embodiment, each of the enhanced demultiplexers 1910-1, 1910-2, 1910-3, 1910-4 has three (3) outputs, which are referred to for convenience and simplicity as the "left" output, the "middle" output and the "right" output, each of which is connected to a corresponding one of the TSVs associated with that enhanced demultiplexer. However, it should be appreciated that in general, the number of outputs of any given one of the enhanced demultiplexers is not limited, and may range anywhere from two upwards. Moreover, the various enhanced demultiplexers are not required to all have the same number of outputs.

Specifically, enhanced demultiplexer 1910-1 includes a plurality of outputs respectively connected to TSVs 1906-1, 1906-2, 1906-3. Enhanced demultiplexer 1910-2 includes a plurality of outputs respectively connected to TSVs 1906-2, 1906-3, 1906-4. Enhanced demultiplexer 1910-3 includes a plurality of outputs respectively connected to TSVs 1906-3, 1906-4, 1906-5. Finally, enhanced demultiplexer 1910-4 includes a plurality of outputs respectively connected to TSVs 1906-4, 1906-5, 1906-6.

Each of the enhanced demultiplexers 1910-1, 1910-2, 1910-3, 1910-4 also has a respective control port. The control port of a given one of the enhanced demultiplexers 1910-1, 1910-2, 1910-3, 1910-4 receives a control signal from the configuration controller 114, on the basis of which the given one of the enhanced demultiplexers 1910-1, 1910-2, 1910-3, 1910-4 either (i) electrically isolates its input from all of its outputs or (ii) establishes an electrical connection between its input and only one of its outputs (either the "left", the "middle" or the "right"), with the other outputs remaining electrically isolated from the input. The control signal received at the control port of a particular one of the enhanced demultiplexers 1910-1, 1910-2, 1910-3, 1910-4 can have one of 4 predetermined values (e.g., it can be a 2-bit signal), with a first predetermined value indicating that the particular enhanced demultiplexer is to establish an electrical connection between its input and its "left" output, a second predetermined value indicating that the particular enhanced demultiplexer is to establish an electrical connection between its input and its "middle" output, a third predetermined value indicating that the particular enhanced demultiplexer is to establish an electrical connection between its input and its "right" output and a fourth predetermined value indicating that the particular enhanced demultiplexer is to electrically isolate its input from all of its outputs. Generally speaking, for a particular one of the demultiplexers 1910-1, 1910-2, 1910-3, 1910-4 having between $2^{n-1}$ and $(2^n-1)$ outputs, the control signal received at the corresponding control port can be an n-bit signal.

The set of first signal lines 1712-1, 1712-2, 1712-3, 1712-4 emanating from functional circuitry 1750 on the semiconductor device extends to the first primary TSV group 1704 and also branches out to group switching circuitry 1952. Also, the set of second signal lines 1812-1, 1812-2, 1812-3, 1812-4 emanating from the functional circuitry 1750 extends to the second primary TSV group 1804 and also branches out to the group switching circuitry 1952. The group switching circuitry 1952 is further connected to the selective connectors (namely, the enhanced demultiplexers 1910-1, 1910-2, 1910-3, 1910-4) of the redundant TSV group 1904 via the signal lines 1912-1, 1912-2, 1912-3, 1912-4.

The group switching circuitry 1952 may include a bank of enhanced multiplexers 1962-1, 1962-2, 1962-3, 1962-4, each of which has two respective inputs, an output and a control port. Considering a particular one of the enhanced multiplexers 1962-1, 1962-2, 1962-3, 1962-4, one of its inputs receives one of the first signal lines 1712-1, 1712-2, 1712-3, 1712-4, while the other one of its inputs receives one of the second signal lines 1812-1, 1812-2, 1812-3, 1812-4. The output of each of the mutliplexers 1962-1, 1962-2, 1962-3, 1962-4 is connected to a respective selective connector of the redundant TSV group 1904. The control port of each of the enhanced multiplexers 1962-1, 1962-2, 1962-3, 1962-4 receives a control signal from the configuration controller 114. The control ports of the various enhanced multiplexers 1962-1, 1962-2, 1962-3, 1962-4 may be electrically connected together, since they will all be caused to exhibit the same switching behavior.

The control signal received from the configuration controller 114 causes each of the enhanced multiplexers 1962-1, 1962-2, 1962-3, 1962-4 to either:

(iii) electrically connect one of its respective inputs to its respective output, thereby causing an electrical connection between the respective one of the first signal lines 1712-1, 1712-2, 1712-3, 1712-4 or the respective one of the second signal lines 1812-1, 1812-2, 1812-3, 1812-4 and the input of the respective one of the enhanced demultiplexers 1910-1, 1910-2, 1910-3, 1910-4 in the redundant TSV group 1904; or (iv) acquire a high-impedance output state, whereby both the respective one of the first signal lines 1712-1, 1712-2, 1712-3, 1712-4 and the respective one of the second signal lines 1812-1, 1812-2, 1812-3, 1812-4 are electrically isolated from the enhanced demultiplexers 1910-1, 1910-2, 1910-3, 1910-4 in the redundant TSV group 1904.

To this end, the control signal received at the control port of each of the enhanced multiplexers 1962-1, 1962-2, 1962-3, 1962-4 can have one of 3 predetermined values (e.g., it can be a 2-bit signal), with a first value indicating that the enhanced multiplexers are to establish an electrical connection between the respective one of the first signal lines 1712-1, 1712-2, 1712-3, 1712-4 and their respective output, a second value indicating that the enhanced multiplexers are to establish an electrical connection between the respective one of the first signal lines 1812-1, 1812-2, 1812-3, 1812-4 and their respective output and a third value indicating that the enhanced multiplexers are to acquire a high-impedance state. Generally speaking, when the enhanced multiplexers 1962-1, 1962-2, 1962-3, 1962-4 have between $2^{m-1}$ and $(2^m-1)$ inputs, the control signal can be an m-bit signal.

With this in mind, consider a specific non-limiting operational scenario in which it is desired to meet a certain connectivity requirement for connecting the first signal lines 1712-1, 1712-2, 1712-3, 1712-4 relative to the TSVs in the first TSV group 1704 and for connecting the second signal lines 1812-1, 1812-2, 1812-3, 181-4 relative to the TSVs in the second TSV group 1804 in the embodiment of FIG. 17. The connectivity requirement may be determined as a result of having carried out semiconductor die testing during a fabrication stage. The connectivity requirement is known to the configuration controller 114. For the purposes of the present non-limiting embodiment, the connectivity requirement is such that first signal lines 1712-1, 1712-2, 1712-3, 1712-4 are to be connected to TSVs 1706-2, 1706-3, 1706-4, 1706-5, respectively, and second signal lines 1812-1, 1812-2, 1812-3, 1812-4 are to be connected to TSVs 1806-2, 1806-3, 1806-4, 1806-5, respectively.

Accordingly, the configuration controller 114 issues control signals that cause each of the enhanced demultiplexers 1710-1, 1710-2, 1710-3, 1710-4, 1810-1, 1810-2, 1810-3, 1810-4 to electrically connect its respective input to its respective "middle" output. Also, the configuration controller 114 issues control signals that cause each of the enhanced demultiplexers 1910-1, 1910-2, 1910-3, 1910-4 (in the redundant TSV group 1904) to electrically isolate its respective input from all of its respective outputs.

Also, the configuration controller 114 issues a control signal that causes each the enhanced multiplexers 1962-1, 1962-2, 1962-3, 1962-4 (in the group switching circuitry 1952) to electrically isolate its respective inputs from its respective output. As a result, the first signal lines 1712-1, 1712-2, 1712-3, 1712-4 and the second signal lines 1812-1, 1812-2, 1812-3, 1812-4 will be electrically isolated from the enhanced demultiplexers 1910-1, 1910-2, 1910-3, 1910-4 in the redundant TSV group 1904.

Consider now a specific non-limiting operational scenario for meeting a different connectivity requirement, by virtue of which the functionality of the redundant TSV group 1904 is used to replace the functionality of the first primary TSV group 1704. For example, a test run during the fabrication process may identify three (3) failed TSVs in the first primary TSV group 1704. For example, and considering FIG. 18, the failed TSVs are TSVs 1706-2, 1706-3 and 1706-5. Now, recalling that the first primary TSV group 1704 has only (2) redundant TSVs, this means that the first primary TSV group 1704 is reparable only to the extent that there would be two or fewer failed TSVs. In this case, since there are three (3) failed TSVs, the first primary TSV group 1704 is not reparable and the test result will indicate that the first primary TSV group 1704 has a critical defect.

Figure 18:
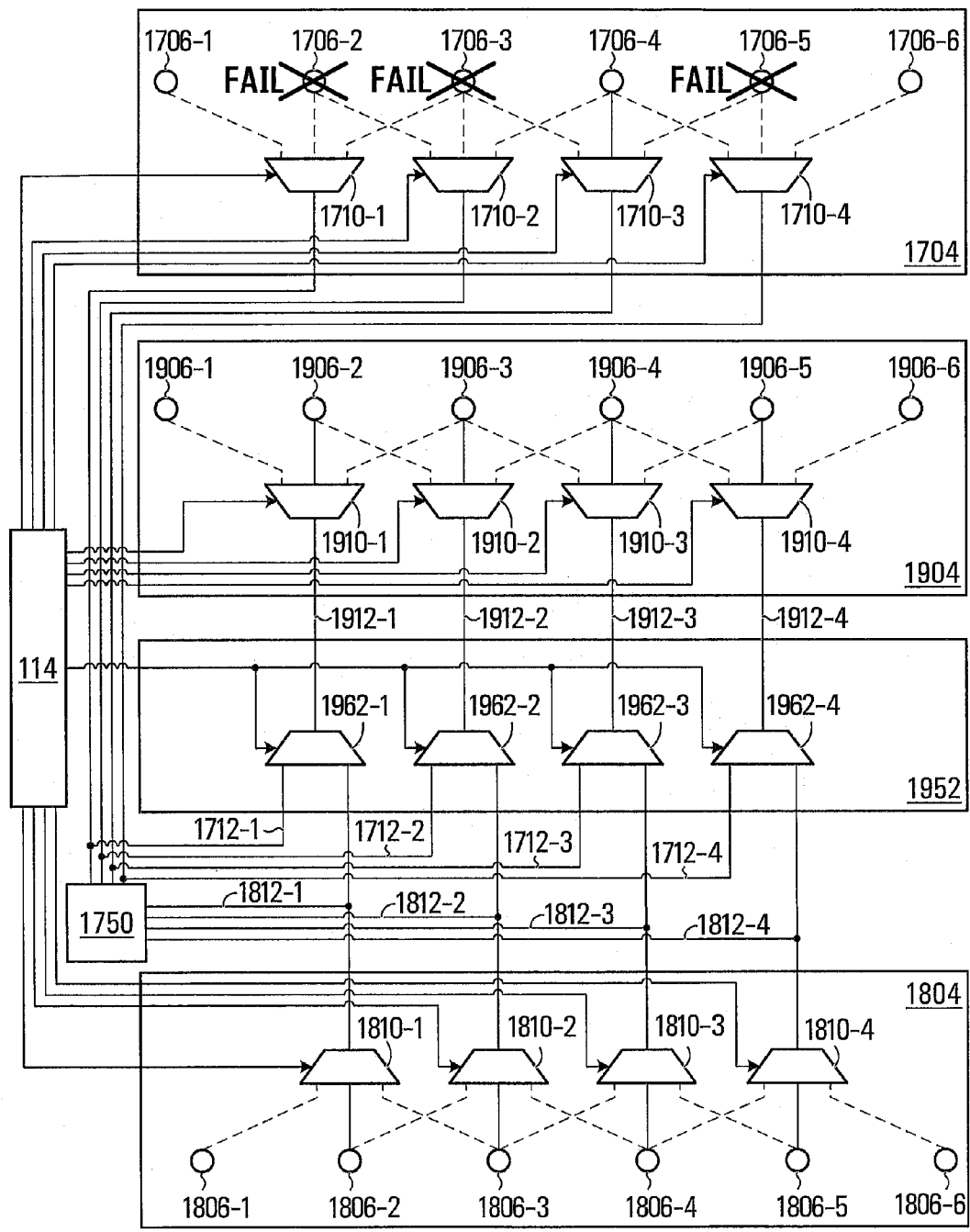
FIG. 18 shows the diagram of FIG. 17, wherein the redundant TSV group is used demultiplexers have been specifically configured to bypass the first primary TSV group having a critical defect.

In this case, the group switching circuitry 1952 needs to be configured so as to electrically connect the entire first set of signal lines 1712-1, 1712-2, 1712-3, 1712-4 to the redundant TSV group 1904. This is achieved through control of the control signal sent to the control port of each of the enhanced multiplexers 1962-1, 1962-2, 1962-3, 1962-4. Assuming (for now) that there are no failed TSVs in the redundant TSV group 1904, the enhanced demultiplexers 1910-1, 1910-2, 1910-3, 1910-4 in the redundant TSV group 1904 can be instructed to connect their respective input to their respective "middle" output (as shown in FIG. 18). Of course, it will be appreciated that the enhanced demultiplexers 1910-1, 1910-2, 1910-3, 1910-4 in the redundant TSV group 1904 could equivalently be instructed to connect their respective input to their respective "right" output or to their respective "left" output.

It will be appreciated that a short circuit among any two of the failed TSVs 1706-2, 1706-3 and 1706-5 may cause a short circuit among two or more of the first signal lines 1712-1, 1712-2, 1712-3, 1712-4. Such an undesirable outcome is beyond the control of the group switching circuitry 1952. However, it can be overcome by isolating the first signal lines 1712-1, 1712-2, 1712-3, 1712-4 from the TSVs 1706-1, 1706-2, ..., 1706-6. Accordingly, the first signal lines 1712-1, 1712-2, 1712-3, 1712-4 may be electrically isolated from the TSVs 1706-1, 1706-2, ..., 1706-6 in the first primary TSV group 1704 by sending appropriate control signals to the enhanced demultiplexers 1710-1, 1710-2, 1710-3, 1710-4 in the first primary TSV group 1704. As a result, each of the enhanced demultiplexers 1710-1, 1710-2, 1710-3, 1710-4 can be controlled so as to electrically isolate their respective input from all of their three (3) respective outputs. Meanwhile, the first signal lines 1712-1, 1712-2, 1712-3, 1712-4 remain connected to the redundant TSV group 1904 via the group switching circuitry 1952.

Consider now a specific operational scenario for meeting yet another connectivity requirement, by virtue of which the functionality of the redundant TSV group 1904 is used to replace the functionality of the second primary TSV group 1804. For example, a test run during the fabrication process may identify three (3) failed TSVs in the second primary TSV group 1804. For example, and with reference to FIG. 19, the failed TSVs are TSVs 1806-2, 1806-3 and 1806-4. Now, recalling that the second primary TSV group 1804 has only (2) redundant TSVs, this means that the second primary TSV group 1804 is reparable only to the extent that there would be two or fewer failed TSVs. In this case, since there are three (3) failed TSVs, the second primary TSV group 1804 is not reparable and the test result will indicate that the second primary TSV group 1804 has a critical defect.

Figure 19:
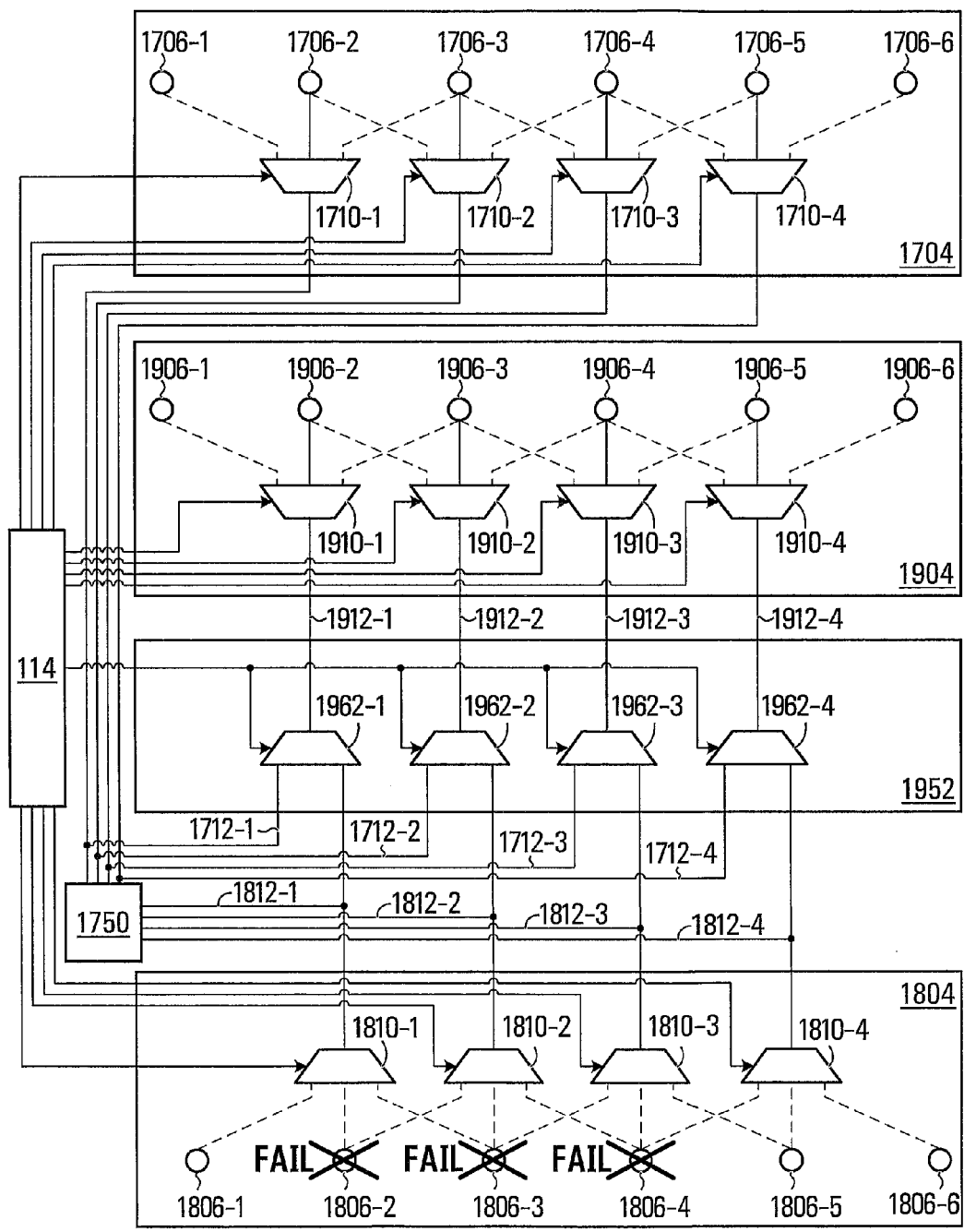
FIG. 19 shows the diagram of FIG. 17, wherein the redundant TSV group is used demultiplexers have been specifically configured to bypass the second primary TSV group having a critical defect.

In this case, the group switching circuitry 1952 needs to be configured so as to electrically connect the entire second set of signal lines 1812-1, 1812-2, 1812-3, 1812-4 to the redundant TSV group 1904. This is achieved through control of the control signal sent to the control port of each of the enhanced multiplexers 1962-1, 1962-2, 1962-3, 1962-4. Assuming (for now) that there are no failed TSVs in the redundant TSV group 1904, the enhanced demultiplexers 1910-1, 1910-2, 1910-3, 1910-4 in the redundant TSV group 1904 can be instructed to connect their respective input to their respective "middle" output (as shown in FIG. 19). Of course, it will be appreciated that the enhanced demultiplexers 1910-1, 1910-2, 1910-3, 1910-4 in the redundant TSV group 1904 could equivalently be instructed to connect their respective input to their respective "right" output or to their respective "left" output.

It will be appreciated that a short circuit among any two of the failed TSVs 1806-2, 1806-3 and 1806-4 may cause a short circuit among two or more of the second signal lines 1812-1, 1812-2, 1812-3, 1812-4. Such an undesirable outcome is beyond the control of the group switching circuitry 1952. However, it can be overcome by isolating the second signal lines 1812-1, 1812-2, 1812-3, 1812-4 from the TSVs 1806-1, 1806-2, ..., 1806-6. Accordingly, the second signal lines 1812-1, 1812-2, 1812-3, 1812-4 may be electrically isolated from the TSVs 1806-1, 1806-2, ..., 1806-6 in the second primary TSV group 1804 by sending appropriate control signals to the enhanced demultiplexers 1810-1, 1810-2, 1810-3, 1810-4 in the second primary TSV group 1804. As a result, each of the enhanced demultiplexers 1810-1, 1810-2, 1810-3, 1810-4 can be controlled so as to electrically isolate their respective input from all of their three (3) respective outputs. Meanwhile, the second signal lines 1812-1, 1812-2, 1812-3, 1812-4 remain connected to the redundant TSV group 1904 via the group switching circuitry 1952.

Figure 20:
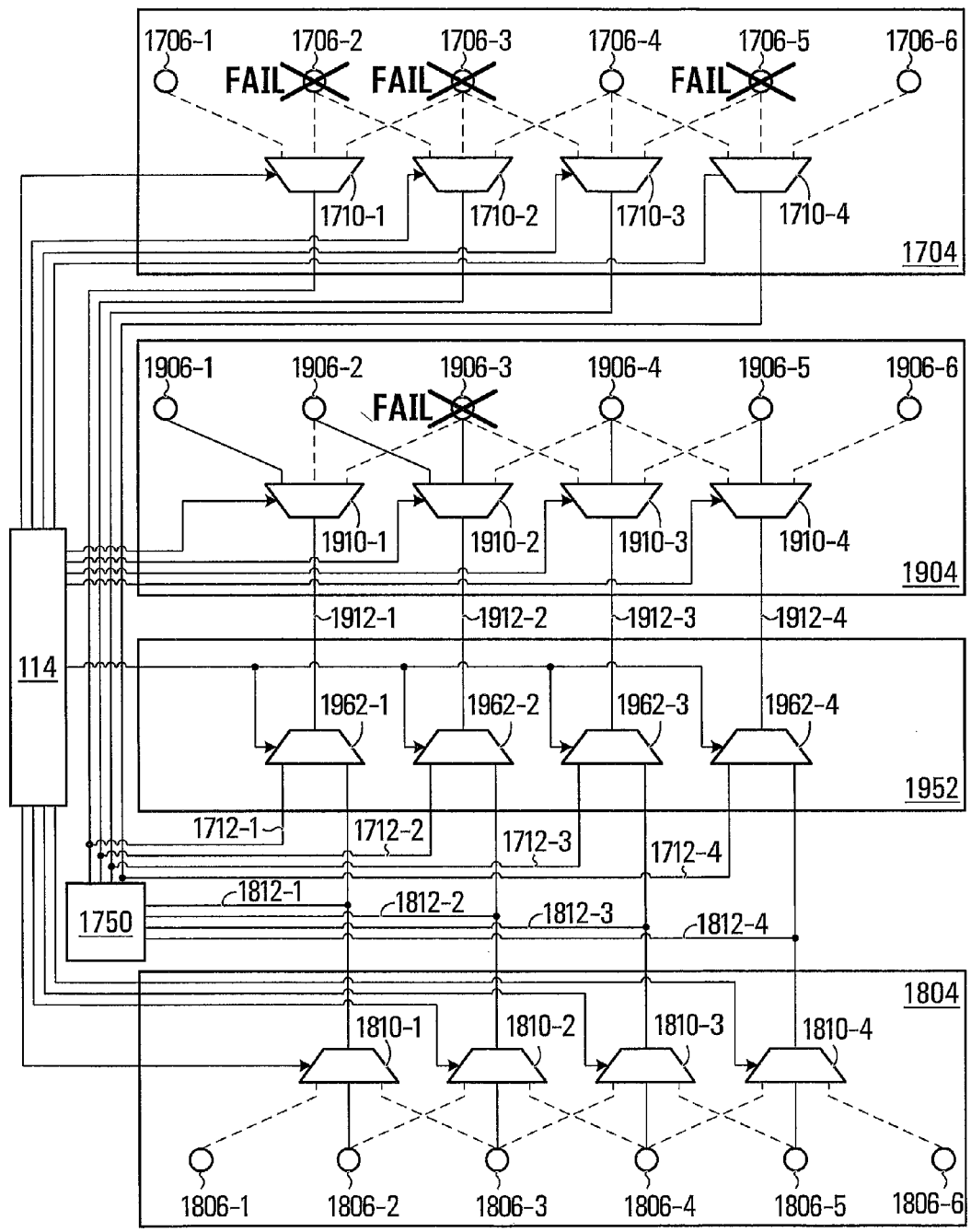
FIG. 20 shows the diagram of FIG. 18, wherein the redundant TSV group is reconfigured to bypass a failed TSV in the redundant TSV group.

Reference is now made to FIG. 20, which illustrates another specific operational scenario for meeting yet another particular connectivity requirement FIG. 20 is similar to FIG. 18 in that it illustrates the semiconductor device of FIG. 18 in the case where the functionality of the redundant TSV group 1904 is used to replace the functionality of the first primary TSV group 1704. However, it is assumed for the purposes of this example that there is one failed TSV in the redundant TSV group 1904, namely TSV 1906-3. This constrains the range of outputs to which certain enhanced demultiplexers in the redundant TSV group 1904 will be allowed to connect their respective input.

In particular, enhanced demultiplexer 1910-1 receives a control signal instructing it to establish an electrical connection between its input and its "left" output, thereby causing an electrical connection to be established between signal line 1712-1 and TSV 1906-1. Enhanced demultiplexer 1910-2 receives a control signal instructing it to establish an electrical connection between its input and its "left" output, thereby causing an electrical connection to be established between signal line 1712-2 and TSV 1906-2. Enhanced demultiplexer 1910-3 receives a control signal instructing it to establish an electrical connection between its input and its "middle" output, thereby causing an electrical connection to be established between signal line 1712-3 and TSV 1906-4. Finally, enhanced demultiplexer 1910-4 receives a control signal instructing it to establish an electrical connection between its input its "middle" output, thereby causing an electrical connection to be established between signal line 1712-4 and TSV 1906-5.

It is seen that from a functional point of view, the redundant TSV group 1904 still supports four (4) working TSVs, and that the failed TSV, namely TSV 1906-3, has been bypassed. Of course, it should be appreciated that TSV groups that are aligned with the redundant TSV group 1904 but located on other semiconductor dies in the stack may also need to be reconfigured in order to allow beneficial use of the repaired configuration of TSVs.

Figure 21:
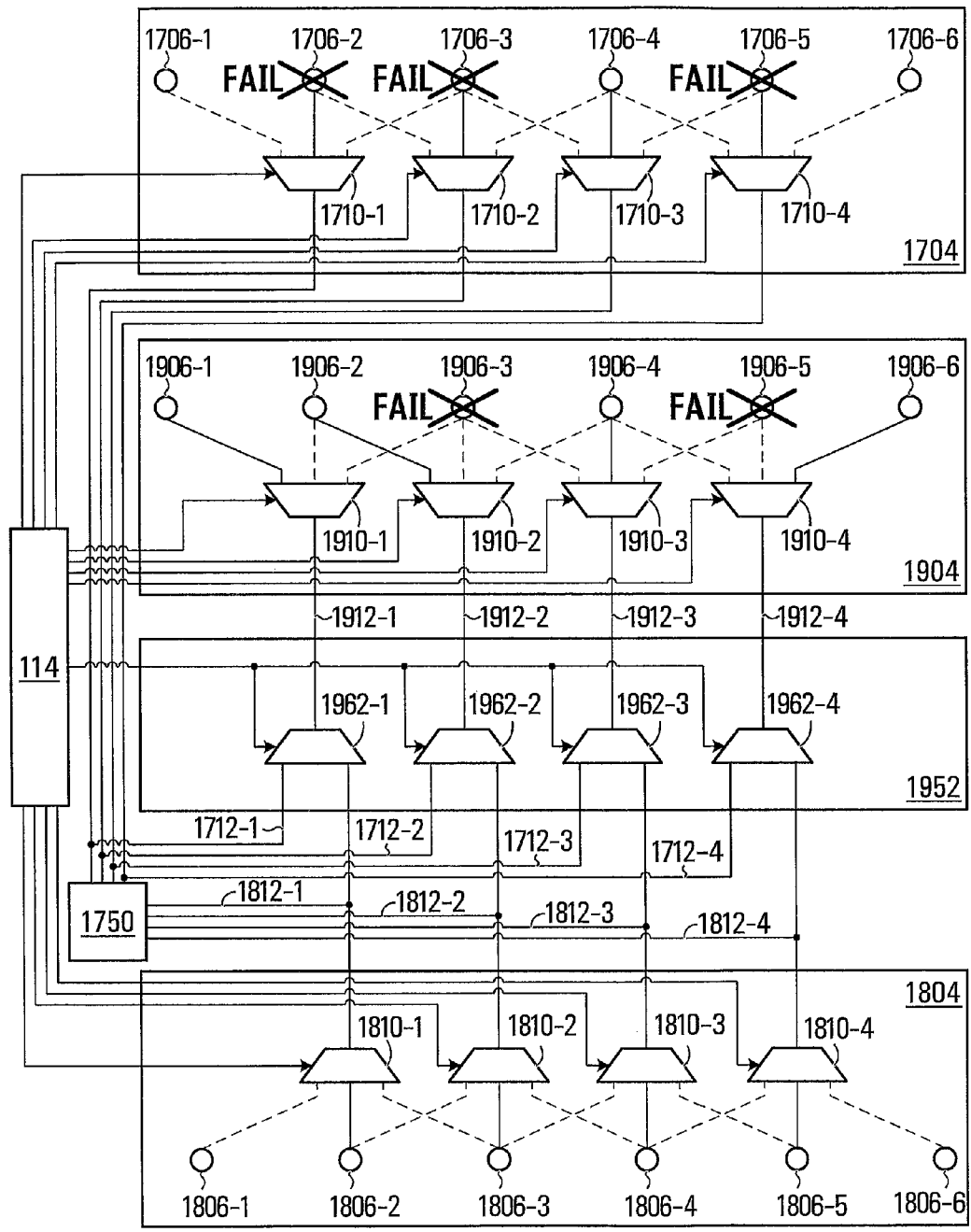
FIG. 21 shows the diagram of FIG. 18, wherein the redundant TSV group is reconfigured to bypass a pair of failed TSVs in the redundant TSV group.

Reference is now made to FIG. 21, which illustrates another specific operational scenario for meeting yet another particular connectivity requirement FIG. 21 is similar to FIG. 20. However, it is assumed for the purposes of this example that there are two failed TSVs in the redundant TSV group 1904, namely TSVs 1906-3 and 1906-5. This further constrains the range of outputs to which certain enhanced demultiplexers in the redundant TSV group 1904 will be allowed to connect their respective input.

In particular, enhanced demultiplexer 1910-1 receives a control signal instructing it to establish an electrical connection between its input and its "left" output, thereby causing an electrical connection to be established between signal line 1712-1 and TSV 1906-1. Enhanced demultiplexer 1910-2 receives a control signal instructing it to establish an electrical connection between its input and its "left" output, thereby causing an electrical connection to be established between signal line 1712-2 and TSV 1906-2. Enhanced demultiplexer 1910-3 receives a control signal instructing it to establish an electrical connection between its input and its "middle" output, thereby causing an electrical connection to be established between signal line 1712-3 and TSV 1906-4. Finally, enhanced demultiplexer 1910-4 receives a control signal instructing it to establish an electrical connection between its input its "right" output, thereby causing an electrical connection to be established between signal line 1712-4 and TSV 1906-6.

It is seen that from a functional point of view, the redundant TSV group 1904 still supports four (4) working TSVs, and that the failed TSVs, namely TSV 1906-3 and TSV 1906-5, have been bypassed. Of course, it should be appreciated that TSV groups that are aligned with the redundant TSV group 1904 but located on other semiconductor dies in the stack may also need to be reconfigured in order to allow beneficial use of the repaired configuration of TSVs.

Figure 22:
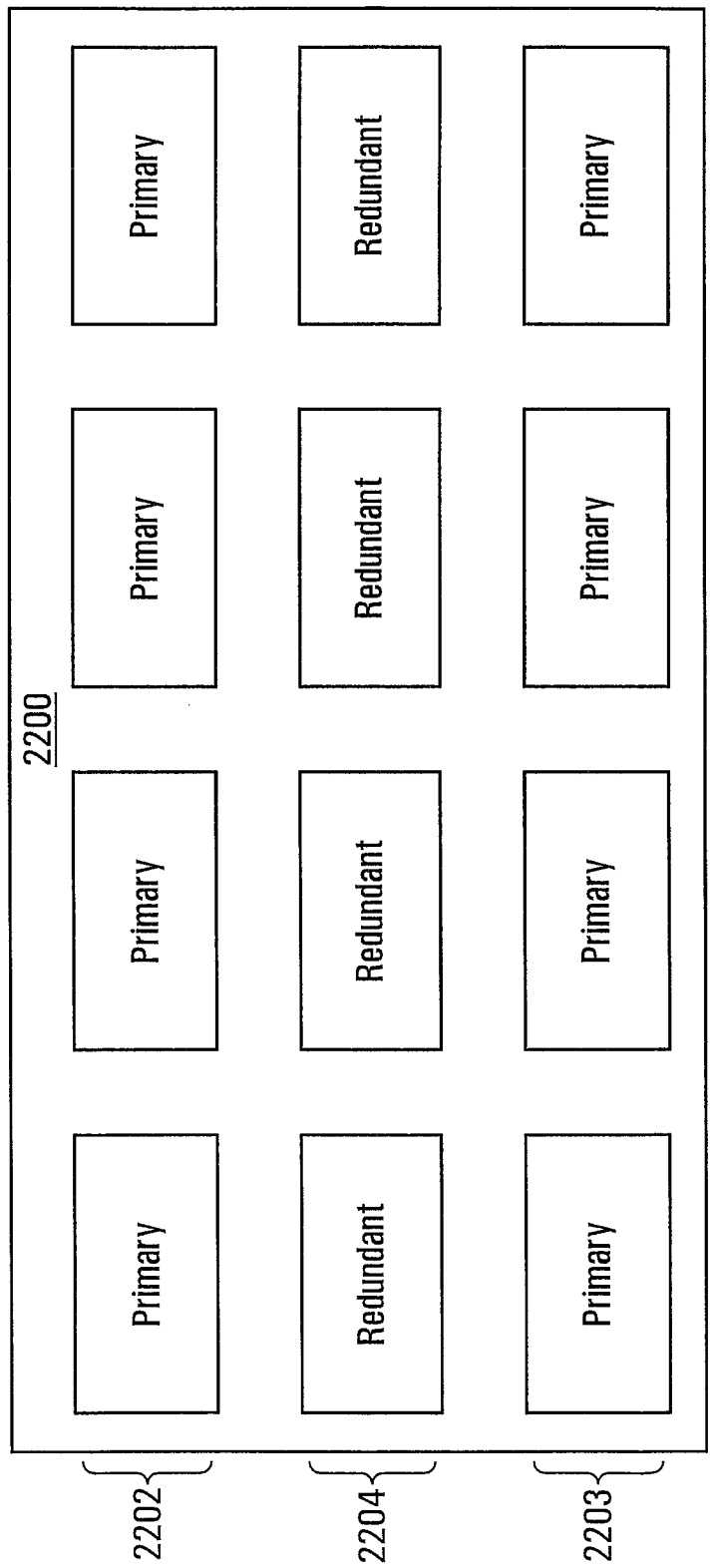
FIG. 22 conceptually illustrates an array including rows and columns of TSV groups including two primary TSV groups and a redundant TSV groups in each column, in addition to group switching circuitry.

With reference now to FIG. 22, there is shown conceptually a semiconductor die 2200 with a set of primary TSV groups 2202, 2203 and a set of redundant TSV groups 2204. As has already been described, each of the TSV groups 2202, 2203, 2204 includes a plurality of TSVs and an associated set of selective connectors. The TSV groups 2202, 2203, 2204 are shown as arranged in an array with three (3) rows and four (4) columns. The primary TSV groups 2202, 2203 occupy the top and bottom rows, respectively, and the redundant TSV groups 2204 occupy the middle row. It should be understood that the number of rows and columns in the array is not particularly limited (i.e., the TSV groups 2202, 2203, 2204 can be arranged into N rows and M columns for any two values of M and N). Also, whether a row is populated by primary or redundant TSV groups is also not particularly limited. Moreover, the illustrated arrangement is provided merely for convenience and that diverse physical arrangements of the TSV groups 2202, 2203, 2204 other than an array are possible in an actual implementation.

Moreover, although not shown in FIG. 22, group switching circuitry is disposed on the semiconductor die to achieve redundancy. The group switching circuitry is configured according the level of redundancy provided, which can differ from one embodiment to the next, as now described with reference to FIGS. 23-25.

Figure 23:
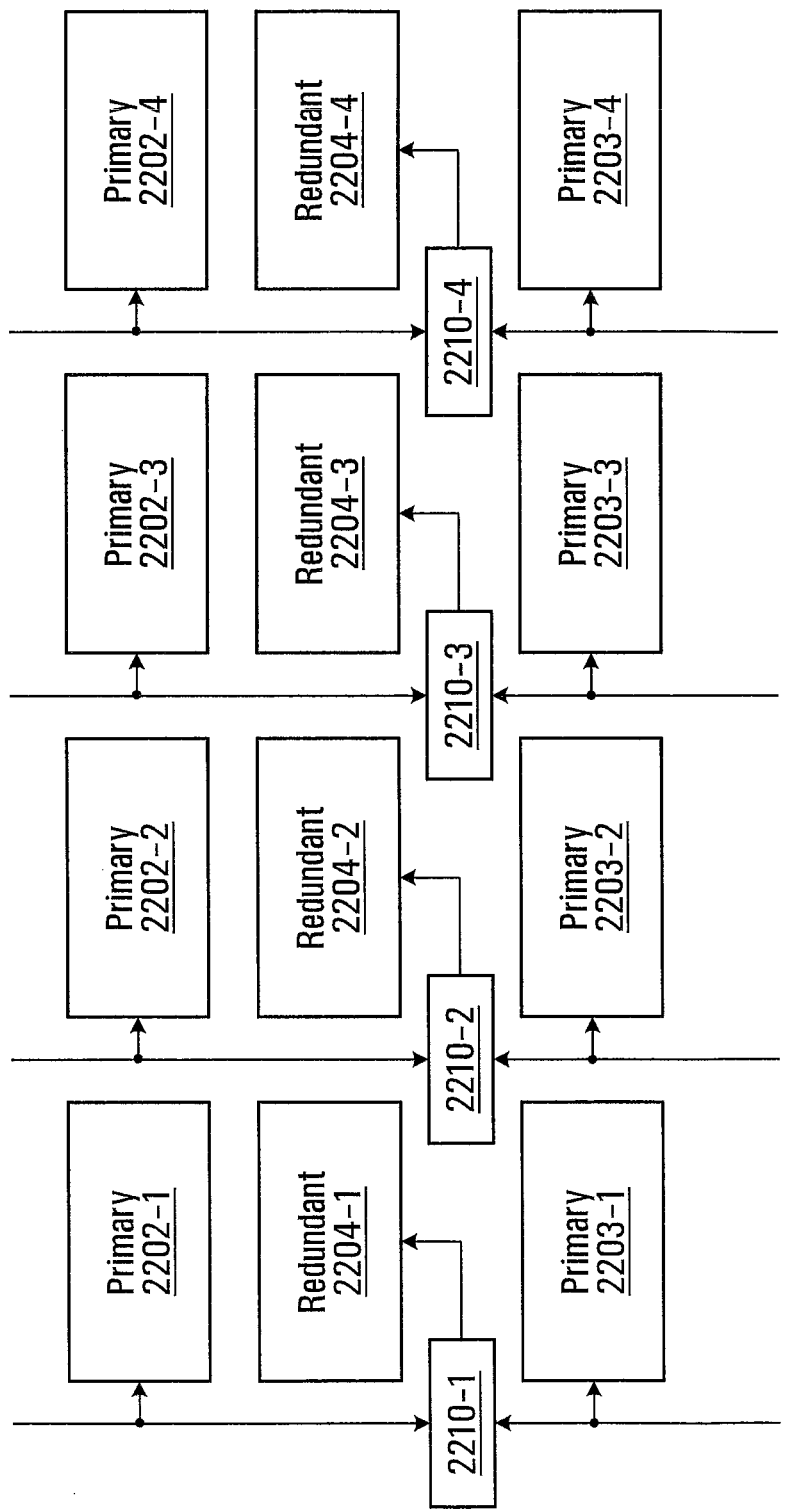
FIG. 23 shows the diagram of FIG. 22 wherein the group switching circuitry functions on a per-column basis.

Turning first to FIG. 23, the group switching circuitry functions on a per-column basis, therefore yielding M independent group switching circuits, where M is the number of columns in the array. In this case, M=4 by way of example, and thus there are four (4) independent group switching circuits 2210-1, 2210-2, 2210-3, 2210-4. Each of the group switching circuits 2210-1, 2210-2, 2210-3, 2210-4 is associated with a corresponding one of the redundant TSV groups 2204-1, 2204-2, 2204-3, 2204-4, a corresponding one of the primary TSV groups from the top row (namely 2202-1, 2202-2, 2202-3, 2202-4) and a corresponding one of the primary TSV groups from the bottom row (namely 2203-1, 2203-2, 2203-3, 2203-4). As such, each of the redundant TSV groups 2204-1, 2204-2, 2204-3, 2204-4 provides redundancy for two corresponding primary TSV groups, in a similar fashion to FIGS. 18-21. Moreover, the redundancy provided by different ones of the redundant TSV groups 2204-1, 2204-2, 2204-3, 2204-4 is independent.

Considering the case of a given column in the array (e.g., the second column) that includes primary TSV group 2202-2 in the top row, primary TSV group 2203-2 from the bottom row and redundant TSV group 2204-2, it should be appreciated that the number of TSVs in primary TSV group 2202-2 in the top row need not be identical to the number of TSVs in primary TSV group 2203-2 in the bottom row. For example, the number of TSVs in primary TSV group 2202-2 in the top row could be $N_T$ and the number of TSVs in primary TSV group 2203-2 in the bottom row could be $N_B$, where $N_T \neq N_B$. In the event that $N_T > N_B$, the number of TSVs in redundant TSV group 2204-2 should be at least as great as $N_T$. Moreover, if the number of TSVs in redundant TSV group 2204-2 is $N_R \geq N_T > N_B$, then it will be appreciated that the configuration controller 114 may issue control signals that dynamically block out a certain number of TSVs in redundant TSV group 2204-2, thus blocking out $N_R - N_T$ TSVs when the functionality of primary TSV group 2202-2 in the top row is being replaced and blocking out $N_R - N_B$ TSVs when the functionality of primary TSV group 2203-2 in the bottom row is being replaced. To this end, and within the context of the embodiments of FIGS. 17-21, the configuration controller 114 can appropriately control the control signals being sent to the enhanced demultiplexers 1910-1, 1910-2, 1910-3, 1910-4 in order to achieve an adjustment in the effective size of redundant TSV group 2204-2.

Figure 24:
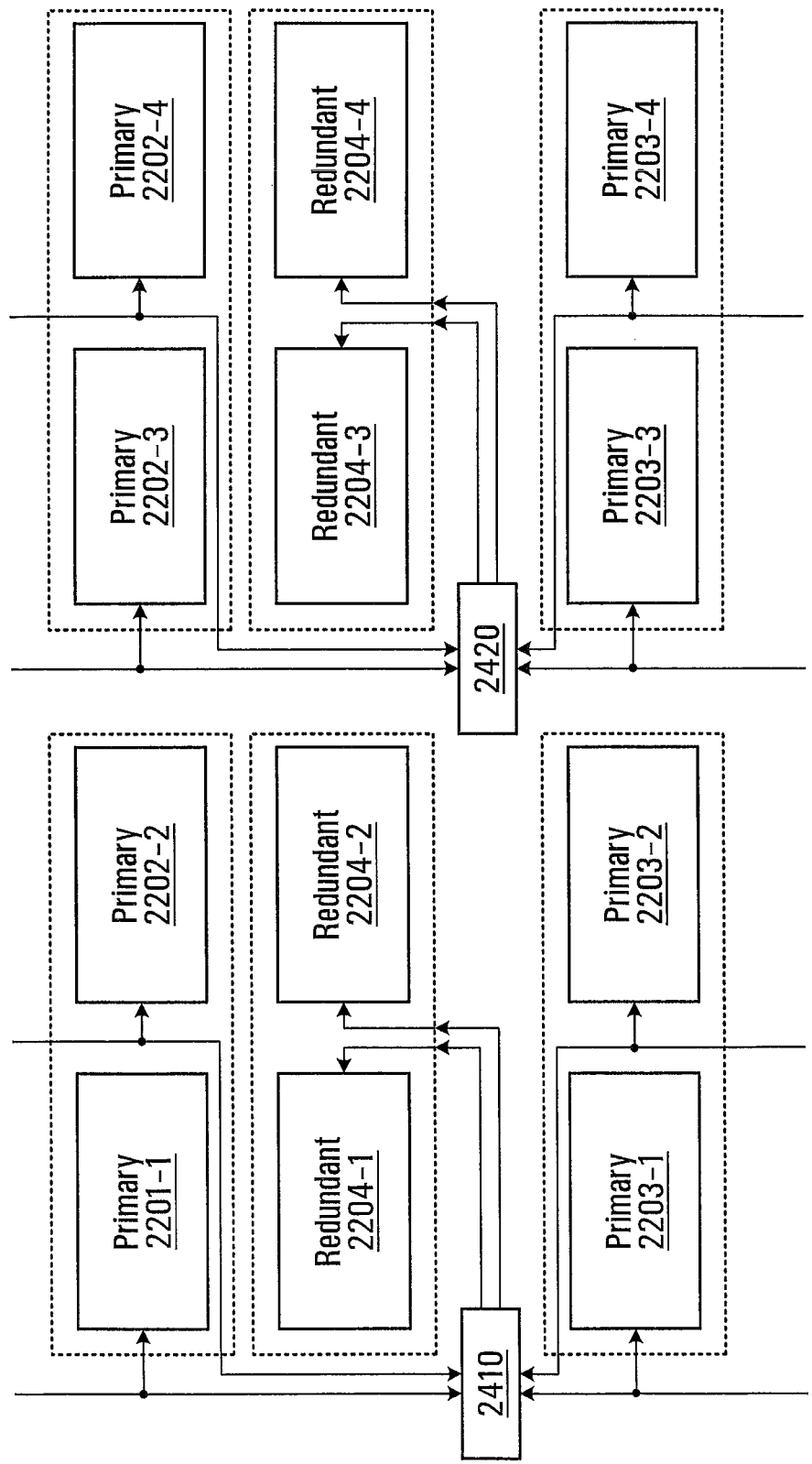
FIG. 24 shows the diagram of FIG. 22 wherein the group switching circuitry functions on a per-two-column basis.

FIG. 24 illustrates an embodiment in which, the group switching circuitry functions on a per-two-column basis, specifically where there are M/2 (=2) independent group switching circuits 2410, 2420. Each of the group switching circuits 2410, 2420 is associated with a corresponding pair of the redundant TSV groups, a corresponding pair of the primary TSV groups from the top row and a corresponding pair of the primary TSV groups from the bottom row. Specifically, group switching circuit 2410 is associated with redundant TSV groups 2204-1, 2204-2, primary TSV groups 2202-1, 2202-2 and primary TSV groups 2203-1, 2203-2.

In this embodiment, each pair of redundant TSV groups provides redundancy for its two corresponding pairs of primary TSV groups together. It is noted that the group switching circuitry of this embodiment does not allow one redundant TSV group in a given pair of redundant TSV groups to replace the functionality of the primary TSV group in one of its two corresponding pairs of primary TSV groups while the other redundant TSV group in that pair of redundant TSV groups replaces the functionality of the primary TSV group in the other of its two corresponding pairs of primary TSV groups. For example, if the functionality of primary TSV group 2202-1 needs to be replaced by redundant TSV group 2204-1, then the control signal sent to group switching circuit 2410 will also cause redundant TSV group 2204-2 to replace the functionality of primary TSV group 2202-2.

Figure 25:
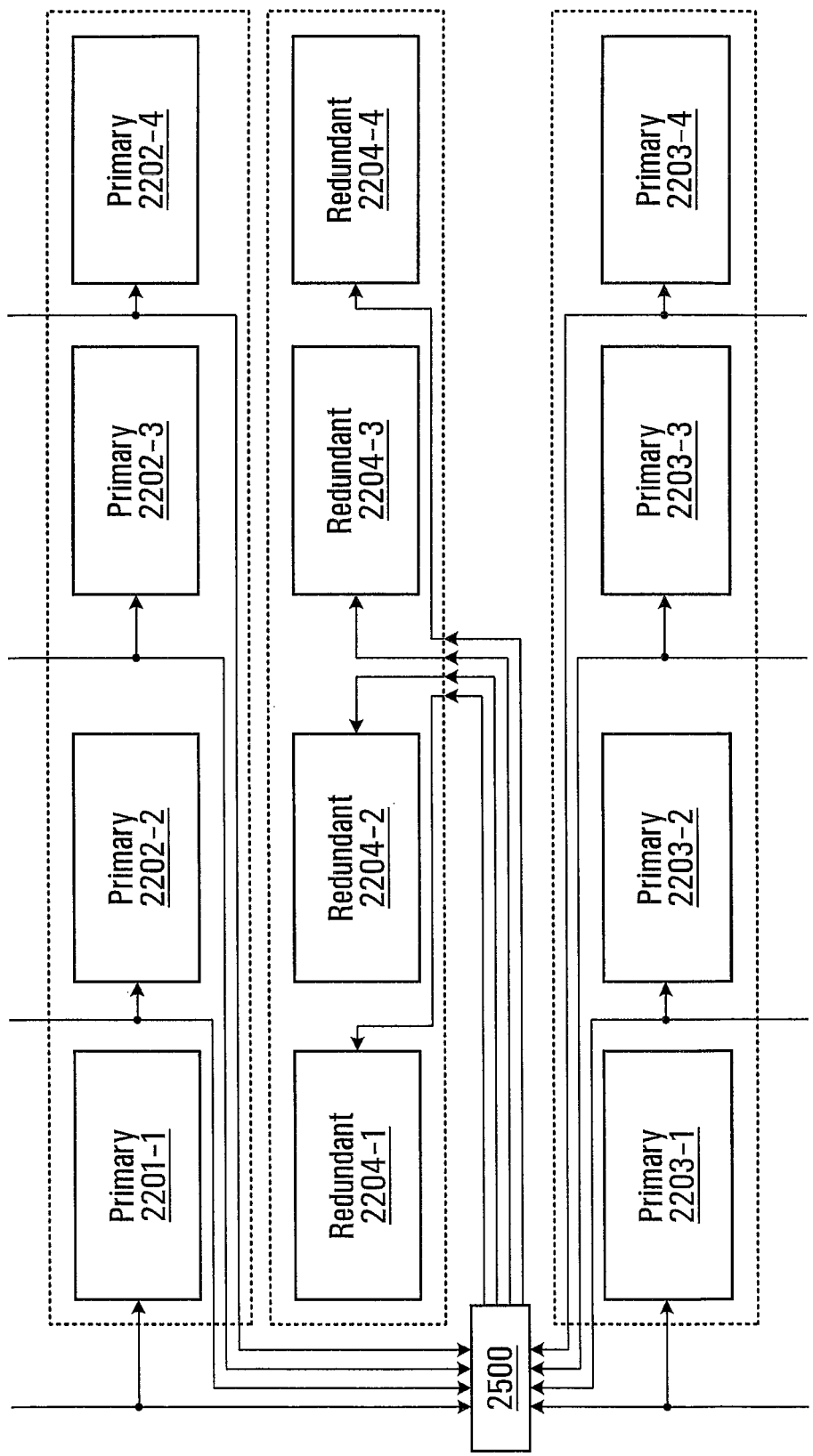
FIG. 25 shows the diagram of FIG. 22 wherein the group switching circuitry functions on the entire array at once.

FIG. 25 illustrates an embodiment similar to that of FIG. 24, but in which there is one group switching circuit 2500 for the entire array of TSV groups. In this embodiment, the row of redundant TSV groups 2204-1, 2204-2, 2204-3, 2204-4 provides redundancy, as a whole, for the top row of primary TSV groups 2202-1, 2202-2, 2202-3, 2202-4, as a whole, and the bottom row of primary TSV groups 2302-1, 2302-2, 2302-3, 2302-4, as a whole. Thus, for example, if the functionality of primary TSV group 2203-2 needs to be replaced by redundant TSV group 2204-2, then the control signal sent to group switching circuit 2500 will also cause redundant TSV groups 2204-1, 2204-3 and 2204-4 to replace the functionality of primary TSV groups 2203-1, 2203-3 and 2203-4, respectively.

While the embodiments of FIGS. 24 and 25 provide less repair flexibility than the embodiment of FIG. 23, the design of the group switching circuitry is simplified, particularly in the case of the embodiment of FIG. 25.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for proper operation. Thus, in an actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A semiconductor device with through-silicon vias (TSVs), comprising:
   a primary TSV group;
   a first plurality of signal lines connected to the primary TSV group;
   a redundant TSV group;
   a second plurality of signal lines connected to the redundant TSV group;
   connection circuitry responsive to a control signal from a single signal line having a predetermined value to electrically connect each signal line of the first plurality of signal lines to a respective signal line of the second plurality of signal lines.

2. The semiconductor device defined in claim 1, further comprising:
   a control circuit for generating the control signal.

3. The semiconductor device defined in claim 1, wherein the connection circuitry is responsive to the control signal having a second predetermined value to electrically isolate each signal line of the first plurality of signal lines from a respective signal line of the second plurality of signal lines.

4. The semiconductor device defined in claim 3, wherein the control signal is programmed by a fuse.

5. The semiconductor device defined in claim 1, wherein the control signal is programmed by a programming element.

6. The semiconductor device defined in claim 1, wherein the primary TSV group comprises:
   a plurality of TSVs;
   a plurality of selective connectors for causing each of the signal lines of the entire first plurality of signal lines to be electrically connected to one of the TSVs, based on a respective control signal.

7. The semiconductor device defined in claim 6, the TSVs being first TSVs, the selective connectors being first selective connectors, each respective control signal being a first respective control signal, wherein the redundant TSV group comprises:
   a plurality of second TSVs;
   a plurality of second selective connectors for causing each of the signal lines of the entire first plurality of signal lines to be electrically connected to one of the second TSVs, based on a respective second control signal, when the signal lines are electrically connected to the redundant TSV group by the connection circuitry.

8. The semiconductor device defined in claim 1, wherein the primary TSV group comprises:
   a plurality of TSV subgroups associated with respective subsets of the signal lines, each of the TSV subgroups comprising:
      a plurality of TSVs;
      a plurality of selective connectors for causing each of the entire first plurality of signal lines in the respective subset of the signal lines to be electrically connected to one of the TSVs, based on a respective control signal.

9. The semiconductor device defined in claim 8, the TSV subgroups being first TSV subgroups, the TSVs being first TSVs, the selective connectors being first selective connectors, wherein the redundant TSV group comprises:
   a plurality of second TSV subgroups associated with respective ones of the subsets of the signal lines, each of the second TSV subgroups comprising:
      a plurality of second TSVs;
      a plurality of selective connectors for causing each of the signal lines of the entire first plurality of signal lines in the respective subset of the signal lines to be electrically connected to one of the second TSVs, based on a respective second control signal, when the signal lines are electrically connected to the redundant TSV group by the connection circuitry.

10. The semiconductor device defined in claim 1, the predetermined value being a first predetermined value, the primary TSV group being a first primary TSV group, the device further comprising:
    a second primary TSV group;
    a third plurality of signal lines connected to the second primary TSV group;
    wherein the connection circuitry is responsive to the control signal having a second predetermined value to electrically connect each signal line of the third plurality of signal lines to a respective signal line of the second plurality of signal lines.

11. The semiconductor device defined in claim 10, wherein the connection circuitry is responsive to the control signal having a third predetermined value to electrically isolate the entire first plurality of signal lines and the entire third plurality of signal lines from the entire second plurality of signal lines.

12. The semiconductor device defined in claim 10, wherein the control signal has the first predetermined value when it encodes an identity of the first primary TSV group and wherein the control signal has the second predetermined value when it encodes an identity of the second primary TSV group.

13. The semiconductor device defined in claim 11, wherein the control signal has the third predetermined value when it encodes neither an identity of the first primary TSV group nor an identity of the second primary TSV group.

14. The semiconductor device defined in claim 10, wherein the connection circuitry comprises a plurality of multiplexers, each multiplexer having a respective first input connected to a respective signal line in the first plurality of signal lines, a respective second input connected to a respective signal line in the third plurality of signal lines, a respective output connected to the redundant TSV group and a respective control input for receiving the control signal.

15. The semiconductor device defined in claim 14, further comprising an electrical connection joining the control input of each of the multiplexers.

16. The semiconductor device defined in claim 14, wherein each of the multiplexers is configured to acquire a high-impedance output state in response to the control signal having a third predetermined value.

17. The semiconductor device defined in claim 14, wherein each of the multiplexers is configured to connect its output to its first input or to its second input depending on whether the control signal encodes an identity of the primary TSV group or of the second TSV group.

18. The semiconductor device defined in claim 10, wherein the connection circuitry comprises a plurality of multiplexers in series with a respective plurality of devices capable of acquiring a high-impedance output state, each multiplexer having (i) a respective first input connected to a respective signal line in the first plurality of signal lines; (ii) a respective second input connected to a respective signal line in the third plurality of signal lines; (iii) a respective output connected to the redundant TSV group via the respective device capable of acquiring a high-impedance state; and (iv) a respective control input for receiving the control signal.

19. The semiconductor device defined in claim 18, wherein the respective device capable of acquiring a high-impedance output state is responsive to a second control signal to acquire either a conductive state or a high-impedance state.

20. The semiconductor device defined in claim 19, wherein the second control signal is programmed by a fuse or a programming element.

21. The semiconductor device defined in claim 18, wherein each of the multiplexers is configured to connect its output to its first input or to its second input depending on whether the control signal encodes an identity of the primary TSV group or of the second TSV group.

22. The semiconductor device defined in claim 1, wherein the primary TSV group comprises:
  a plurality of TSVs;
  a plurality of selective connectors for causing each of the entire first plurality of signal lines to be either electrically connected to one of the TSVs or isolated from all of the TSVs, based on a respective control signal.

23. The semiconductor device defined in claim 22, the TSVs being first TSVs, the selective connectors being first selective connectors, each respective control signal being a first respective control signal, wherein the redundant TSV group comprises:
  a plurality of second TSVs;
  a plurality of second selective connectors for causing each of the signal lines of the entire first plurality of signal lines to be either electrically connected to one of the second TSVs or electrically isolated from all of the second TSVs, based on a respective second control signal, when the entire first plurality of signal lines are electrically connected to the redundant TSV group by the connection circuitry.

24. The semiconductor device defined in claim 1, wherein the primary TSV group comprises:
  a plurality of TSV subgroups associated with respective subsets of the signal lines, each of the TSV subgroups comprising:
    a plurality of TSVs;
    a plurality of selective connectors for causing each of the entire first plurality of signal lines in the respective subset of the signal lines to be either electrically connected to one of the TSVs or electrically isolated from all of the TSVs, based on a respective control signal.

25. The semiconductor device defined in claim 24, the TSV subgroups being first TSV subgroups, the TSVs being first TSVs, the selective connectors being first selective connectors, wherein the redundant TSV group comprises:
  a plurality of second TSV subgroups associated with respective ones of the subsets of the signal lines, each of the second TSV subgroups comprising:
    a plurality of second TSVs;
    a plurality of selective connectors for causing each of the signal lines of the entire first plurality of signal lines in the respective subset of the signal lines to be either electrically connected to one of the second TSVs or electrically isolated from all of the second TSVs, based on a respective second control signal, when the signal lines are electrically connected to the redundant TSV group by the connection circuitry.

26. A method of configuring a semiconductor device having a first plurality of signal lines connected to a primary through-silicon via (TSV) group, the method comprising:
  determining whether the primary TSV group has a critical defect; in response to determining that the primary TSV group has a critical defect, providing a control signal from a single signal line to connection circuitry on the semiconductor device to electrically connect each signal line of the first plurality of signal lines to a respective signal line of a second plurality of signal lines connected to a redundant TSV group on the semiconductor device.

27. The method defined in claim 26, wherein the primary TSV group comprises a plurality of TSVs including intact TSVs and failed TSVs, wherein determining whether the primary TSV group has a critical defect comprises determining whether the number of intact TSVs is less than the number of signal lines connected to the primary TSV group.

28. A semiconductor device with through-silicon vias (TSVs), comprising:
  a primary TSV group with a critical defect;
  a first plurality of signal lines connected to the primary TSV group;
  a redundant TSV group;
  a second plurality of signal lines connected to the redundant TSV group;
  connection circuitry having been previously configured to electrically connect each signal line of the first plurality of signal lines to a respective signal line of the second plurality of signal lines in response to a control signal from a single signal line.

29. The semiconductor device defined in claim 28, wherein the primary TSV group comprises:
  a plurality of TSVs;
  a plurality of connectors having been previously configured to electrically isolate each of the entire first plurality of signal lines from all of the TSVs.

30. The semiconductor device defined in claim 28, the primary TSV group being a first primary TSV group, the device further comprising
  a second primary TSV group;
a third plurality of signal liens connected to the second primary TSV group and to the connection circuitry;
  the connection circuitry having been previously configured to electrically isolate the entire third plurality of signal lines from the second plurality of signal lines.

* * * * *